US008055695B2

(12) United States Patent
Tsai et al.

(10) Patent No.: US 8,055,695 B2
(45) Date of Patent: Nov. 8, 2011

(54) SHIFT REGISTER WITH EACH STAGE CONTROLLED BY A SPECIFIC VOLTAGE OF THE NEXT STAGE AND THE STAGE AFTER THEREOF

(75) Inventors: Yi-Cheng Tsai, Chiayi (TW); Wen-Chun Wang, Taichung (TW); Hsi-Rong Han, Taichung (TW); Chien-Ting Chan, Changhua (TW)

(73) Assignee: Wintek Corporation, Taichung (TW)

( * ) Notice: Subject to any disclaimer, the term of this patent is extended or adjusted under 35 U.S.C. 154(b) by 1153 days.

(21) Appl. No.: 11/822,899

(22) Filed: Jul. 11, 2007

(65) Prior Publication Data

US 2008/0016139 A1 Jan. 17, 2008

Related U.S. Application Data

(60) Provisional application No. 60/830,109, filed on Jul. 12, 2006.

(30) Foreign Application Priority Data

Apr. 17, 2007 (TW) ............................... 96113544 A

(51) Int. Cl.
*G06F 7/00* (2006.01)
*G06F 15/00* (2006.01)
*G09G 3/36* (2006.01)

(52) U.S. Cl. ......................... 708/209; 345/100; 708/160

(58) Field of Classification Search .................. 708/209; 345/87–104

See application file for complete search history.

(56) References Cited

U.S. PATENT DOCUMENTS

| | | | | |
|---|---|---|---|---|
| 6,067,066 | A * | 5/2000 | Kubota et al. | 345/98 |
| 6,462,723 | B1 * | 10/2002 | Yamazaki et al. | 345/82 |
| 2001/0024186 | A1 * | 9/2001 | Kane et al. | 345/98 |
| 2002/0011980 | A1 * | 1/2002 | Aoyama et al. | 345/92 |
| 2006/0145999 | A1 * | 7/2006 | Cho et al. | 345/100 |

OTHER PUBLICATIONS

Itakura et al, A 402-Output TFT-LCD Driver IC with Power-Controlling Function by Selecting Number of Colors, IEEE, 2002, pp. 257-260.*

Sasaki et al, A Panel-Sized TFT-LCD Scan Driver, IEEE, 2005, pp. 554-555.*

* cited by examiner

*Primary Examiner* — Lewis Bullock, Jr.
*Assistant Examiner* — Kevin G Hughes
(74) *Attorney, Agent, or Firm* — Bacon & Thomas, PLLC

(57) ABSTRACT

A shift register has shift register units. The n$^{th}$ shift register unit includes first to third level control units and first and second driving units. The first and second level control units respectively provide a first clock signal and a first voltage to an output terminal. The first driving unit and the first level control unit are coupled to a first node, and a voltage on the first node is a first control signal. The first driving unit turns on and off the first level control unit in response to an input signal and second and third control signals. The second driving unit turns on and off the second level control unit in response to the first control signal. The third level control unit provides the first voltage to the output terminal in response to a front edge of the first control signal of the (n+2)$^{th}$ shift register unit.

66 Claims, 36 Drawing Sheets

SHIFT REGISTER WITH EACH STAGE CONTROLLED BY A SPECIFIC VOLTAGE OF THE NEXT STAGE AND THE STAGE AFTER THEREOF

This application claims the benefit of U.S. provisional application Ser. No. 60/830,109, filed Jul. 12, 2006 and Taiwan application Serial No. 96113544, filed Apr. 17, 2007, the subject matter of which is incorporated herein by reference.

BACKGROUND OF THE INVENTION

1. Field of the Invention

The invention relates in general to a shift register, and more particularly to a shift register, in which an $n^{th}$ shift register unit is controlled by a specific voltage signal of an $(n+1)^{th}$ or $(n+2)^{th}$ shift register unit.

2. Description of the Related Art

With the changing development of the technology with each passing day, a liquid crystal display (LCD) has been widely applied to an electronic display product, such as a television, a computer display, a notebook computer, a mobile telephone or a personal digital assistant. The LCD includes a data driver, a scan driver and a LCD panel, which has a pixel array. The scan driver sequentially turns on a corresponding pixel row in the pixel array to scan pixel data outputted from the data driver to the pixel and thus to display the image to be displayed.

The present technology usually implements the scan driver capable of sequentially turning on the corresponding pixel row in the pixel array using a shift register. Because the scan driver greatly influences the displayed frame quality of the LCD, it is an important direction in this industry to design a shift register having a long lifetime and a slight distortion of the output signal so as to enhance the efficiency of the scan driver and the displayed frame quality of the LCD.

SUMMARY OF THE INVENTION

The invention is directed to a shift register having multiple shift register units, each of which advantageously has a long lifetime and a slight distortion of an output signal, wherein a liquid crystal display (LCD) applying this shift register has the advantage of the better displayed frame quality.

According to a first aspect of the present invention, a shift register is provided. The shift register has multiple serially connected shift register units. An $n^{th}$ shift register unit of the shift register units outputs an output signal, which is an input signal of an $(n+1)^{th}$ shift register unit of the shift register units, wherein n is a natural number. The $n^{th}$ shift register unit includes a first level control unit, a first driving unit, a second level control unit, a second driving unit and a third level control unit. The first level control unit provides a first clock signal to an output terminal. The first driving unit and an input terminal of the first level control unit are coupled to a first node. A voltage on the first node is a first control signal. The first driving unit turns on the first level control unit in response to a front edge of the input signal, and turns off the first level control unit when a level of a second control signal is higher than a level of a third control signal. The second level control unit provides a first voltage to the output terminal. The second driving unit turns off the second level control unit in response to a front edge of the first control signal, and turns on the second level control unit in response to a rear edge of the first control signal. The third level control unit provides the first voltage to the output terminal in response to the front edge of the first control signal of an $(n+2)^{th}$ shift register unit of the shift register units.

According to a second aspect of the present invention, another shift register is provided. The shift register has multiple serially connected shift register units. An $n^{th}$ shift register unit of the shift register units outputs an output signal, which is an input signal of an $(n+1)^{th}$ shift register unit of the shift register units, wherein n is a natural number. The $n^{th}$ shift register unit includes a first level control unit, a first driving unit, a second level control unit, a second driving unit and a third level control unit. The first level control unit provides a first clock signal to an output terminal. The first driving unit and an input terminal of the first level control unit are coupled to a first node. A voltage on the first node is a first control signal. The first driving unit turns on the first level control unit in response to a front edge of the input signal and turns off the first level control unit when a level of a second control signal is higher than a level of a third control signal. The second level control unit provides a first voltage to the output terminal. The second driving unit turns off the second level control unit in response to the front edge of the first control signal, and turns on the second level control unit in response to a rear edge of the first control signal. The third level control unit provides a low voltage level of the first clock signal to the output terminal in response to the first control signal of the $(n+1)^{th}$ shift register unit of the shift register units.

According to a third aspect of the present invention, still another shift register is provided. The shift register has multiple serially connected shift register units. An $n^{th}$ shift register unit of the shift register units outputs an output signal, which is an input signal of an $(n+1)^{th}$ shift register unit of the shift register units, wherein n is a natural number. The $n^{th}$ shift register unit includes a first level control unit, a first driving unit, a second level control unit and a second driving unit. The first level control unit provides a first clock signal to an output terminal. The first driving unit and an input terminal of the first level control unit are coupled to a first node. A voltage on the first node is a first control signal. The first driving unit turns on the first level control unit in response to a front edge of the input signal and turns off the first level control unit in response to a front edge of the first control signal of an $(n+2)^{th}$ shift register unit of the shift register units. The second level control unit provides a first voltage to the output terminal. The second driving unit turns off the second level control unit in response to the front edge of the first control signal and turns on the second level control unit in response to a rear edge of the first control signal.

According to a fourth aspect of the present invention, yet still another shift register is provided. The shift register has multiple serially connected shift register units. An $n^{th}$ shift register unit of the shift register units outputs an output signal, which is an input signal of an $(n+1)^{th}$ shift register unit of the shift register units, wherein n is a natural number. The $n^{th}$ shift register unit includes a first level control unit, a first driving unit, a second level control unit and a second driving unit. The first level control unit provides a first clock signal to an output terminal. The first driving unit and an input terminal of the first level control unit are coupled to a first node. A voltage on the first node is a first control signal. The first driving unit turns on the first level control unit in response to a front edge of the input signal and turns off the first level control unit in response to a front edge of the first control signal of the $(n+1)^{th}$ shift register unit. The second level control unit provides a first voltage to the output terminal. The second driving unit turns off the second level control unit in response to a front edge of the first control signal and turns on the second level control unit in response to a rear edge of the first control signal.

The invention will become apparent from the following detailed description of the preferred but non-limiting embodiments. The following description is made with reference to the accompanying drawings.

DETAILED DESCRIPTION OF THE INVENTION

First Embodiment

The shift register of this embodiment has m serially connected shift register units, each of which outputs an output signal, which is an input signal of a next shift register unit. The shift register may be applied to, for example, a scan driver of a liquid crystal display (LCD) for sequentially outputting the output signals to serve as scan signals of the scan driver. The scan signals are outputted to a LCD panel of the LCD to sequentially turn on the m rows of pixels of the LCD panel and thus to write the corresponding data to each pixel, wherein m is a natural number greater than 1.

The $n^{th}$ shift register unit of this embodiment includes a first level control unit, a first driving unit, a second level control unit, a second driving unit and a third level control unit. The first level control unit provides a first clock signal to an output terminal. The first driving unit and an input terminal of the first level control unit are coupled to a node. A voltage on the node is a first control signal. The first driving unit turns on the first level control unit in response to a front edge of the input signal, and turns off the first level control unit when a level of a second control signal is higher than a level of a third control signal.

The second level control unit provides a first voltage to the output terminal. The second driving unit turns off the second level control unit in response to a front edge of the first control signal, and turns on the second level control unit in response to a rear edge of the first control signal. The third level control unit provides the first voltage to the output terminal in response to the front edge of the first control signal of the $(n+2)^{th}$ shift register unit, wherein n is a natural number. Next, several implemented structures will be illustrated to describe the operations of the $n^{th}$ shift register unit in detail.

First Implemented Structure

Figure 1:
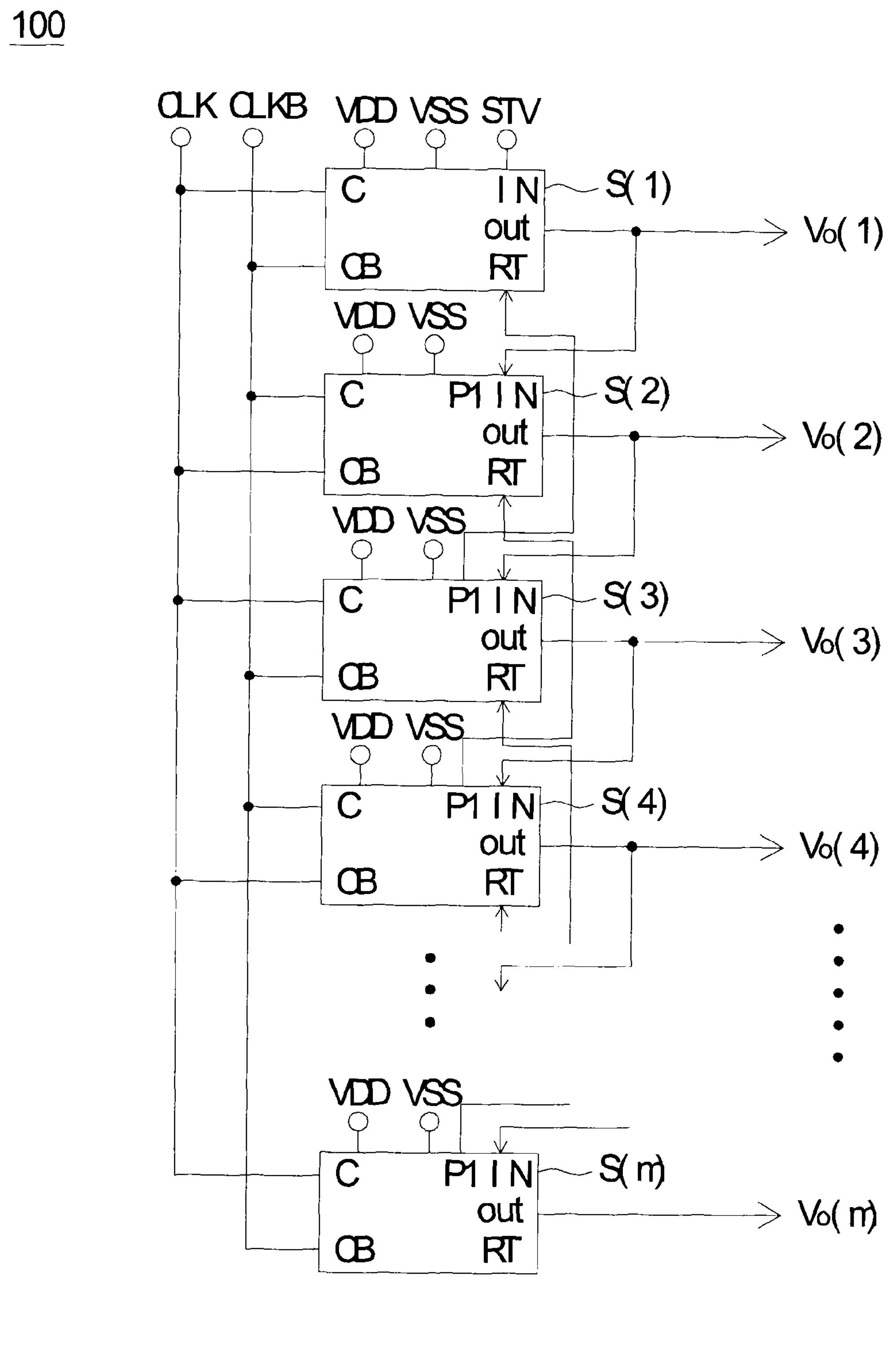
FIG. 1 is a block diagram showing a shift register of a first implemented structure according to a first embodiment of the invention.

FIG. 1 is a block diagram showing a shift register 100 of a first implemented structure according to the first embodiment of the invention. Referring to FIG. 1, the shift register 100 includes m serially connected shift register units S(1) to S(m), which may have the same structure, for example. In this embodiment, each of the shift register units S(1) to S(m) includes an input terminal IN, an output terminal OUT, a control terminal RT, a node P1, a clock terminal C and a clock terminal CB. The shift register units S(1) to S(m) respectively output multiple output signals Vo(1) to Vo(m) from the output terminals OUT thereof according to signals of the input terminals IN, the control terminals RT, the clock terminals C and the clock terminals CB.

The input terminal IN of the shift register unit S(1) receives a starting signal STV, and the input terminals IN of the shift register units S(2) to S(m) sequentially receive the output signals Vo(1) to Vo(m−1) outputted from the output terminals OUT of the previous shift register.

The enabling times of the clock signals received by any two neighboring clock terminals C in the shift register units S(1) to S(m) are staggered, the enabling times of the clock signals received by the clock terminals CB are also staggered, and the enabling times of the clock signals received by the clock terminal CB of the $n^{th}$ shift register unit S(n) and the clock terminal C of the $(n+1)^{th}$ shift register unit S(n+1) are also staggered. In this illustrated embodiment, the clock terminals C and CB of the odd numbered shift register units in the shift register units S(1) to S(m) respectively receive clock signals CLK and CLKB, and the clock terminals C and CB of the even numbered shift register units respectively receive clock signals CLKB and CLK. In this embodiment, the enabling times of the clock signals CLKB and CLK are staggered, for example. In this embodiment, the clock signal CLKB is the inverse of the clock signal CLK.

The control terminals RT of the shift register units S(1) to S(m−2) respectively receive the voltage signals on the nodes P1 of the shift register units S(3) to S(m) to serve as the control signals Vc1(3) to Vc1(*m*). Next, various circuit implementations of the shift register unit S(n) of this embodiment will be described by taking the $n^{th}$ shift register unit S(n) in the shift register units S(1) to S(m) as an example, wherein n is a natural number.

Figure 2:
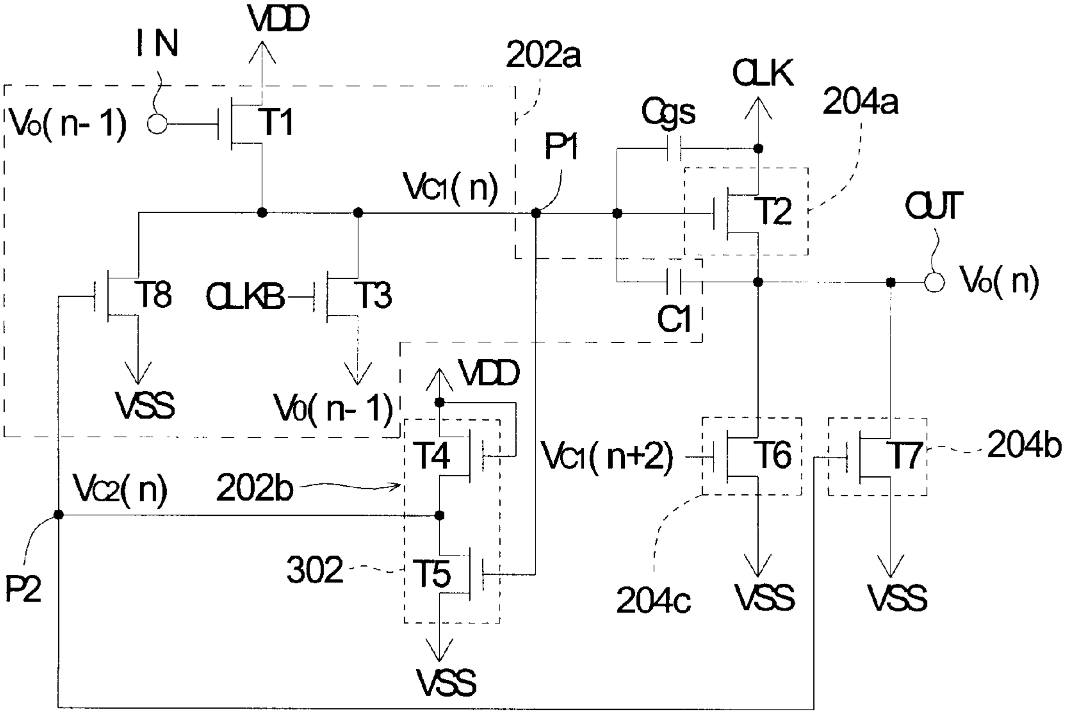
FIG. 2 is a detailed circuit diagram showing the first circuit implementation of a shift register unit S(n) of FIG. 1.

FIG. 2 is a detailed circuit diagram showing the first circuit implementation of a shift register unit S(n) of FIG. 1. Referring to FIG. 2, the shift register unit S(n) of this implementation includes driving units 202*a* and 202*b* and level control units 204*a*, 204*b* and 204*c*. The driving unit 202*a* includes transistors T1, T3 and T8. The driving unit 202*b* includes transistors T4 and T5. The level control units 204*a*, 204*b* and 204*c* respectively include transistors T2, T7 and T6. The implemented structure will be illustrated by taking the transistors T1 to T8 as N-type thin film transistors (TFTs), for example.

The transistor T6 of the level control unit 204*c* has a drain coupled to the output terminal OUT, a gate for receiving the control signal Vc1(*n*+2) of the $(n+2)^{th}$ shift register unit S(n+

2), and a source for receiving a voltage VSS. The level of the voltage VSS is equal to a low voltage level of the shift register 100, for example. The transistor T6 turns on in response to the front edge of the control signal Vc1(*n*+2) to provide the voltage level VSS to the output terminal OUT and to make the output signal Vo(n) be equal to the voltage VSS. The front edge of the control signal Vc1(*n*+2) in this embodiment may be a rising edge, for example.

The transistor T2 of the level control unit 204*a* has a drain for receiving the clock signal CLK, a gate coupled to the source of the transistor T1 and the drain of the transistor T3 and the node P1 to receive the control signal Vc1(*n*), and a source coupled to the output terminal OUT. The transistor T2 provides the clock signal CLK to the output terminal OUT when it turns on.

The drain of the driving unit 202*a* receives a voltage VDD. The gate of the transistor T1 receives the output signal Vo(n−1) of the $(n-1)^{th}$ shift register unit S(n−1). The source of the transistor is coupled to the node P1. The level of the voltage VDD is the high voltage level of the shift register 100, for example. The transistor T1 turns on the transistor T2 in response to the front edge of the output signal Vo(n−1) so that the output signal Vo(n) is equal to the voltage VSS. The front edge of the output signal Vo(n−1) of this embodiment is a rising edge, for example. The transistor T3 has a drain coupled to the node P1, a gate for receiving the clock signal CLKB and a source for receiving the voltage Vo(n−1). The transistor T3 turns off the transistor T2 in response to the rising edge of the clock signal CLKB. The transistor T8 has a drain coupled to the node P1, a gate coupled to the node P2 to receive the control signal Vc2(*n*), and a source for receiving the voltage VSS. The transistor T8 provides the voltage VSS to the node P1 in response to the rising edge of the control signal Vc2(*n*).

The transistor T7 of the level control unit 204*b* has a drain coupled to the output terminal OUT, a gate coupled to the source of the transistor T4, the drain of the transistor T5 and the node P2 to receive the control signal Vc2(*n*), and a source for receiving the voltage VSS. The transistor T7 provides the voltage VSS to the output terminal OUT when it turns on.

The drain and gate of the transistor T4 of the driving unit 202*b* are coupled to each other to receive the voltage VDD. The source of the transistor T4 is coupled to the node P2. The transistor T4 continuously turns on the transistor T7 to make the output signal Vo(n) be equal to the voltage VSS. The transistor T5 has a drain coupled to the node P2, a gate for receiving the control signal Vc1(*n*) and a source for receiving the voltage VSS. The transistor T5 turns off the transistor T7 in response to the front edge of the control signal Vc1(*n*). The front edge of the control signal Vc1(*n*) is the rising edge, for example. In this implemented structure, the aspect ratio (width/length) of the transistor T5 is greater than that of transistor T4. Thus, when the transistor T5 turns on, the transistor T5 makes the level of the control signal Vc2(*n*) be substantially equal to the low voltage VSS to turn off the transistor T7. The transistors T4 and T5 serving as a bias unit 302, for example, decrease the level of the control signal Vc2(*n*) to turn off the transistor T7 in response to the front edge of the control signal Vc1(*n*), and increase the level of the control signal Vc2(*n*) to turn on the transistor T7 in response to the rear edge of the control signal Vc1(*n*).

Figure 3:
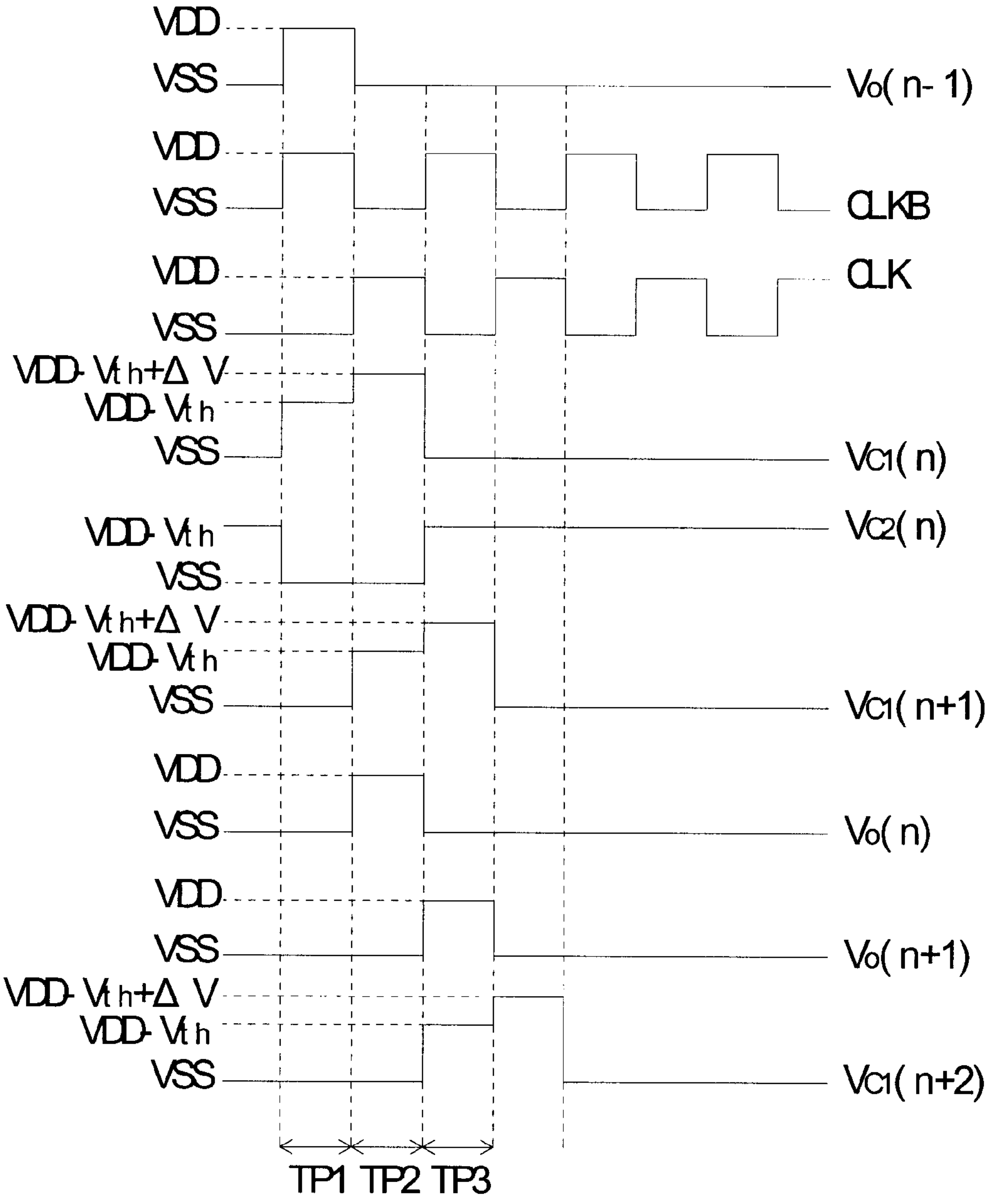
FIG. 3 is a timing chart showing associated signals of the shift register unit S(n) of FIG. 2.

FIG. 3 is a timing chart showing associated signals of the shift register unit S(n) of FIG. 2. As shown in FIG. 3, the output signal Vo(n−1) is equal to the voltage VDD, and the clock signal CLK and the control signal Vc1(*n*+2) are equal to the voltage VSS in the time period TP1. At this time, the transistor T6 turns off and the transistor T1 turns on to make the transistor T2 turn on so that the output signal Vo(n) is equal to the clock signal CLK (i.e., the voltage VSS). The transistor T1 further makes the control signal Vc1(*n*) be equal to the high voltage level: Vc1(*n*)=VDD−Vth1, wherein Vth1 is the threshold voltage of the transistor T1. The transistor T3 also turns on, and its threshold voltage is equal to the threshold voltage of the transistor T1, for example. The transistor T3 and the transistor T1 increase the control signal Vc1(*n*) to (VDD−Vth1). The transistor T5 also turns on and thus turns off the transistors T7 and T8 with the control signal Vc2(*n*) approaching the voltage VSS.

In the time period TP2, the output signal Vo(n−1), the clock signal CLKB and the control signal Vc1(*n*+2) are equal to the voltage VSS, and the clock signal CLK is equal to the voltage VDD. At this time, the transistors T6, T1 and T3 turn off to make the node P1 be floating. The clock signal CLK is increased from the voltage VSS to the voltage VDD in the time period TP2. This significant voltage change increases the voltage signal Vc1(*n*) by a difference voltage ΔV due to the boot-strapping effect so that the voltage signal Vc1(*n*) is equal to Vc1(*n*)=VDD−Vth1+ΔV. In the implemented structure, the difference voltage ΔV is equal to $$\Delta V = \frac{C_{gs}}{C_{p1} + C_{gs}}(VDD - VSS),$$

wherein Cgs is the internal parasitic capacitance of the transistor T2 and Cp1 is the equivalent capacitor viewed from the node P1. At this time, the voltage signal Vc1(*n*) enables the transistor T2 to make the output signal Vo(n) be rapidly charged to the voltage VDD. The transistor T5 also turns on to make the control signal Vc2(*n*) approach the low voltage VSS to turn off the transistor T7.

In the time period TP3, the clock signal CLKB and the control signal Vc1(*n*+2) are high, and the output signal Vo(n−1) is equal to the voltage VSS. At this time, the transistor T6 turns on to provide the voltage VSS to the output terminal OUT to make the output signal Vo(n) be equal to the voltage VSS. The transistor T1 turns off and the transistor T3 turns on to make the control signal Vc1(*n*) be equal to the voltage VSS and to turn off the transistor T2. The transistor T5 turns off. At this time, the transistor T4 increases the level of the control signal Vc2(*n*) to the voltage (VDD−Vth). The transistors T7 and T8 turn on to provide the voltage VSS to the output terminal OUT and the node P1 so that the output signal Vo(n) and the control signal Vc1(*n*) are equal to the voltage VSS.

The control signal Vc2(*n*) is continuously equal to the voltage (VDD−Vth) from the time period TP3 to the next time period TP1. The transistor T7 continuously turns on to continuously make the output signal Vo(n) be equal to the voltage VSS and thus to prevent the output signal Vo(n) from being influenced by the noise interference generated by other parasitic capacitors, which cause the error of the scan operation of the LCD and thus the display frame error.

However, the long-time turn-on increases the threshold voltage of the transistor T7 due to the stress effect, and thus disables the voltage VSS from being provided to the output terminal OUT so that the shift register 100 has the malfunction. Thus, the shift register unit S(n) of this implementation has the transistor T6 to make the compensation such that the voltage signal Vc1(*n*+2) can assist in decreasing the output signal Vo(n) to the low voltage VSS when the transistor T7 gradually operates abnormally due to the increase of the threshold voltage. Thus, even if the transistor T7 operates abnormally, the shift register unit S(n) of this implementation can prevent the signal level of the output signal Vo(n) from becoming incorrect.

The $n^{th}$ shift register unit of this implementation generates the control signal through its circuit design, and controls the operations of its circuit and the $(n+2)^{th}$ shift register unit through the control signal. Thus, the $n^{th}$ shift register unit of this implementation does not control the circuit operations of the $n^{th}$ shift register unit or other shift register units according to its own output signal. Consequently, the $n^{th}$ shift register unit in this implemented architecture and the scan driver applying the same have the advantage of the shorter delay time of the output signal, and the LCD applying the $n^{th}$ shift register unit of this implementation further has the advantage of the better quality of the displayed frame.

In addition, the $n^{th}$ shift register unit of this implementation has two level control units for decreasing the level of the output signal. When one of the level control units is influenced by the stress effect and gradually operates abnormally due to the long-time turn-on, the $n^{th}$ shift register unit of this implementation can assist in decreasing the level of the output signal through the other level control unit so that the level of the output signal is equal to the lowest voltage level. Consequently, the $n^{th}$ shift register unit of this implementation can disable the level of the output signal from becoming incorrect due to the abnormal operation of one of the level control units so that the invention advantageously has the longer lifetime.

Figure 4:
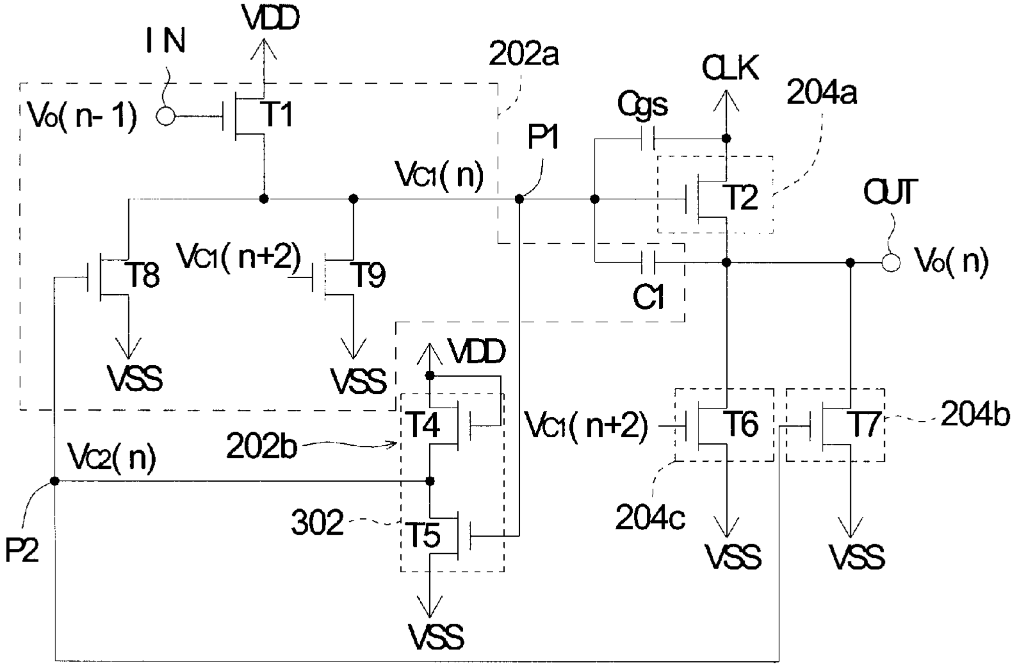
FIG. 4 is a detailed circuit diagram showing the second circuit implementation of the shift register unit S(n) of FIG. 1.

FIG. 4 is a detailed circuit diagram showing the second circuit implementation of the shift register unit S(n) of FIG. 1. As shown in FIG. 4, the $n^{th}$ shift register unit S(n) of this implementation differs from the $n^{th}$ shift register unit S(n) of FIG. 2 in that the transistor T3 of the driving unit 202*a* is replaced with the transistor T9.

The transistor T9 has a drain coupled to the node P1, a gate for receiving the control signal Vc1(*n*+2) and a source for receiving the voltage VSS. The transistor T9 provides the voltage VSS to the node P1 in response to the rising edge of the control signal Vc1(*n*+2) to make the control signal Vc1(*n*) be equal to the voltage VSS.

In the time periods TP1 and TP2, the control signal Vc1(*n*+2) is equal to the voltage VSS, and the transistor T9 turns off. In the time period TP3, the control signal Vc1(*n*+2) is equal to the voltage (VDD−Vth) so that the transistor T9 turns on, the voltage VSS is provided to the node P1, the voltage signal Vc1(*n*) is equal to the voltage VSS and the transistor T2 turns off accordingly.

In the $n^{th}$ shift register unit S(n) of this implementation, the transistor T9 replaces the transistor T3. However, the transistor T9 and the transistor T3 have substantially the same effect of making the control signal Vc1(*n*) be equal to the voltage VSS in the time period TP3. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 5:
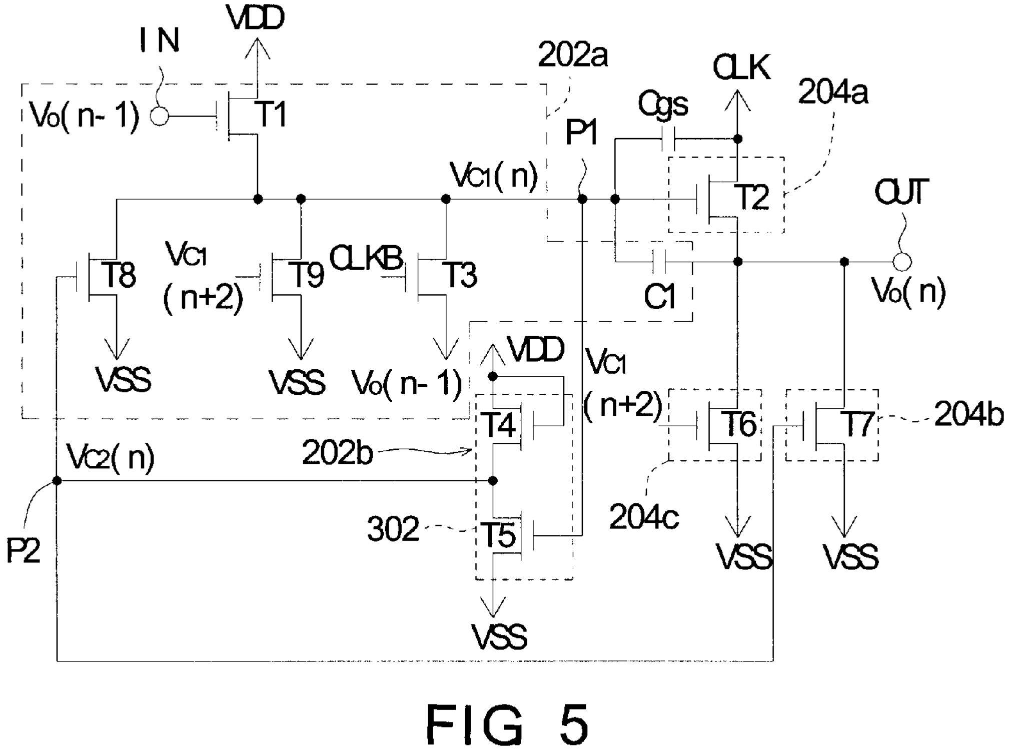
FIG. 5 is a detailed circuit diagram showing the third circuit implementation of the shift register unit S(n) of FIG. 1.

FIG. 5 is a detailed circuit diagram showing the third circuit implementation of the shift register unit S(n) of FIG. 1. As shown in FIG. 5, the $n^{th}$ shift register unit S(n) of this implementation differs from the $n^{th}$ shift register unit S(n) of FIG. 4 in that the driving unit 202*b* further includes the transistor T3. The transistors T3 and T9 have the substantially similar function of making the control signal Vc1(*n*) be equal to the voltage signal VSS in the time period TP3. Thus, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 6:
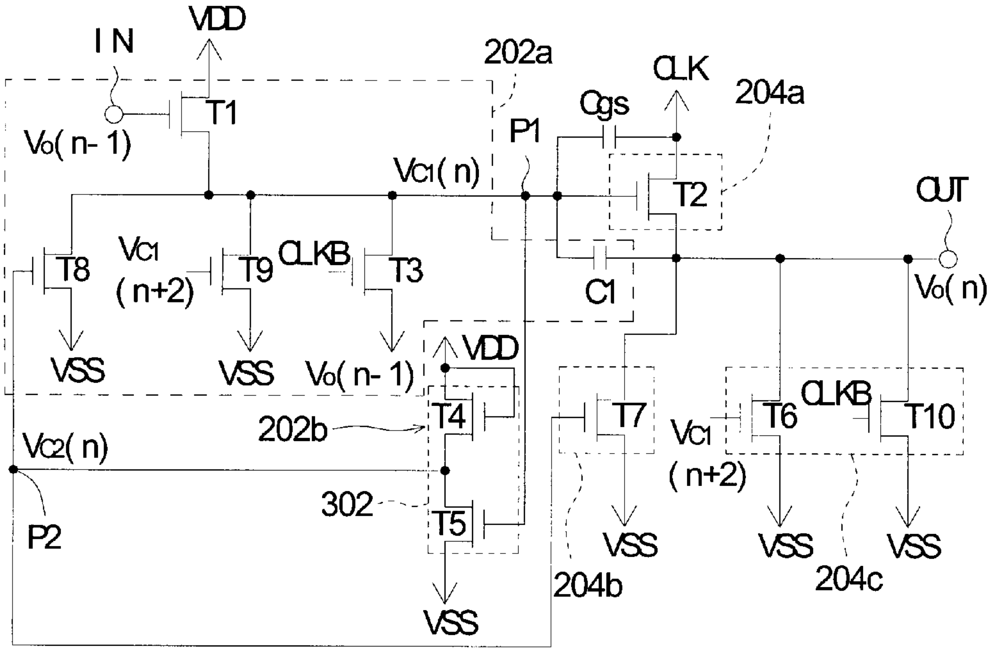
FIG. 6 is a detailed circuit diagram showing the fourth circuit implementation of the shift register unit S(n) of FIG. 1.

FIG. 6 is a detailed circuit diagram showing the fourth circuit implementation of the shift register unit S(n) of FIG. 1. As shown in FIG. 6, the $n^{th}$ shift register unit S(n) of this implementation differs from the $n^{th}$ shift register unit S(n) of FIG. 5 in that the level control unit 204*c* further includes the transistor T10.

The transistor T10 has a drain coupled to the output terminal OUT, a gate for receiving the clock signal CLKB and a source for receiving the voltage VSS. The transistor T10 provides the voltage VSS to the output terminal OUT in response to the clock signal CLKB so that the output signal Vo(n) is equal to the voltage VSS. In the time periods TP1 and TP3, the clock signal CLKB is equal to the voltage VDD and the transistor T10 turns on to make the output signal Vo(n) be equal to the voltage VSS in response to the rising edge of the clock signal CLKB. In the time period TP2, the clock signal CLKB is equal to the voltage VSS, and the transistor T10 turns off.

The transistor T10 is provided in the level control unit 204*c* of the $n^{th}$ shift register unit S(n) of this implementation to make the output signal Vo(n) be equal to the voltage VSS in the time periods TP1 and TP3 and to prevent the circuit noise from influencing the signal level of the output signal Vo(n). Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 7:
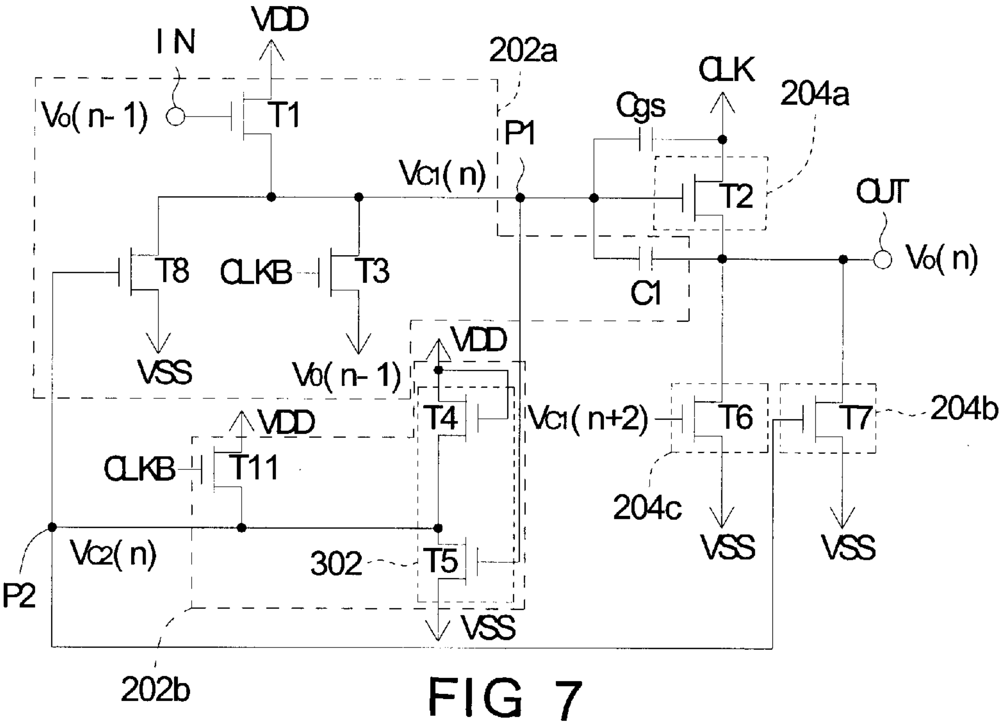
FIG. 7 is a detailed circuit diagram showing the fifth circuit implementation of the shift register unit S(n) of FIG. 1.

FIG. 7 is a detailed circuit diagram showing the fifth circuit implementation of the shift register unit S(n) of FIG. 1. As shown in FIG. 7, the $n^{th}$ shift register unit of this implementation differs from the $n^{th}$ shift register unit of FIG. 2 in that the driving unit 202*b* further includes the transistor T11.

The transistor T11 has a drain for receiving the voltage VDD, a gate for receiving the clock signal CLKB and a source coupled to the node P2. The transistor T11 provides the voltage VDD to the node P2 in response to the clock signal CLKB to make the control signal Vc2(*n*) be equal to the voltage VDD. The aspect ratio of the transistor T11 is smaller than that of the transistor T5 so that the transistor T5 decreases the control signal Vc2(*n*) to the voltage VSS when the transistors T5 and T11 turn on.

In the time periods TP1 and TP3, the clock signal CLKB is equal to the voltage VDD, and the transistor T11 turns on to make the control signal Vc2(*n*) be equal to the voltage (VDD−Vth). However, the transistor T5 is enabled in the time period TP1 so that the control signal Vc2(*n*) is decreased to the voltage VSS. In the time period TP2, the clock signal CLKB is equal to the voltage VSS and the transistor T11 turns off.

The $n^{th}$ shift register unit S(n) of this implementation has the transistor T11 disposed in the level control unit 204*b*, and the transistors T11 and T4 have the substantially similar function in order to increase the level of the voltage signal Vc2(*n*) to the voltage (VDD−Vth) in the time period TP3. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 8:
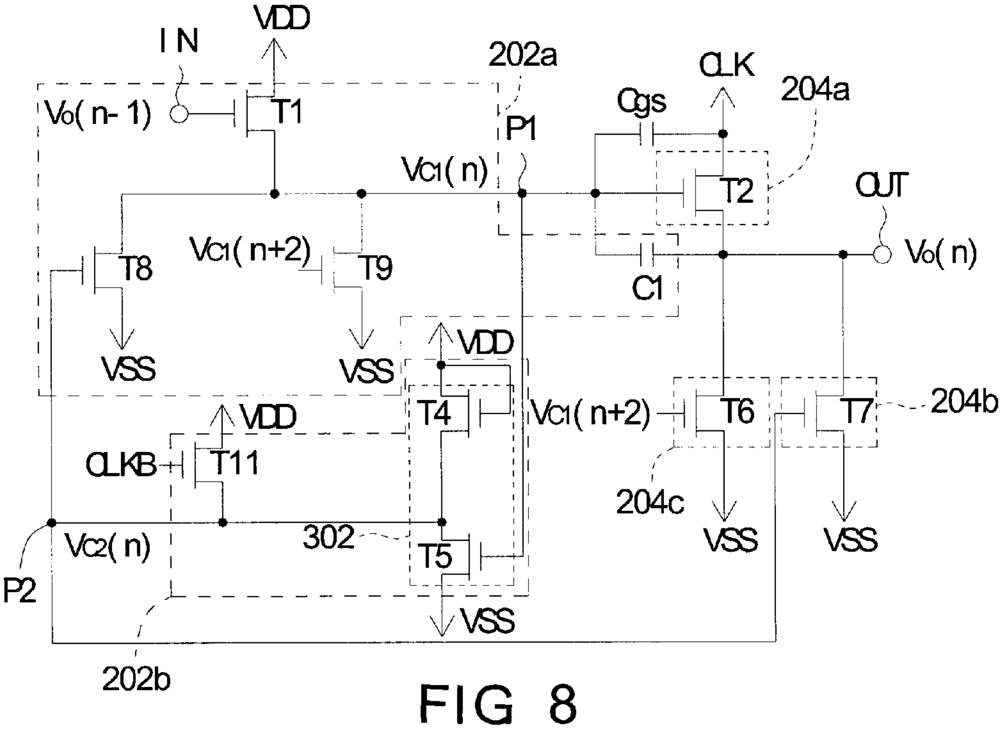
FIG. 8 is a detailed circuit diagram showing the sixth circuit implementation of the shift register unit S(n) of FIG. 1.
Figure 9:
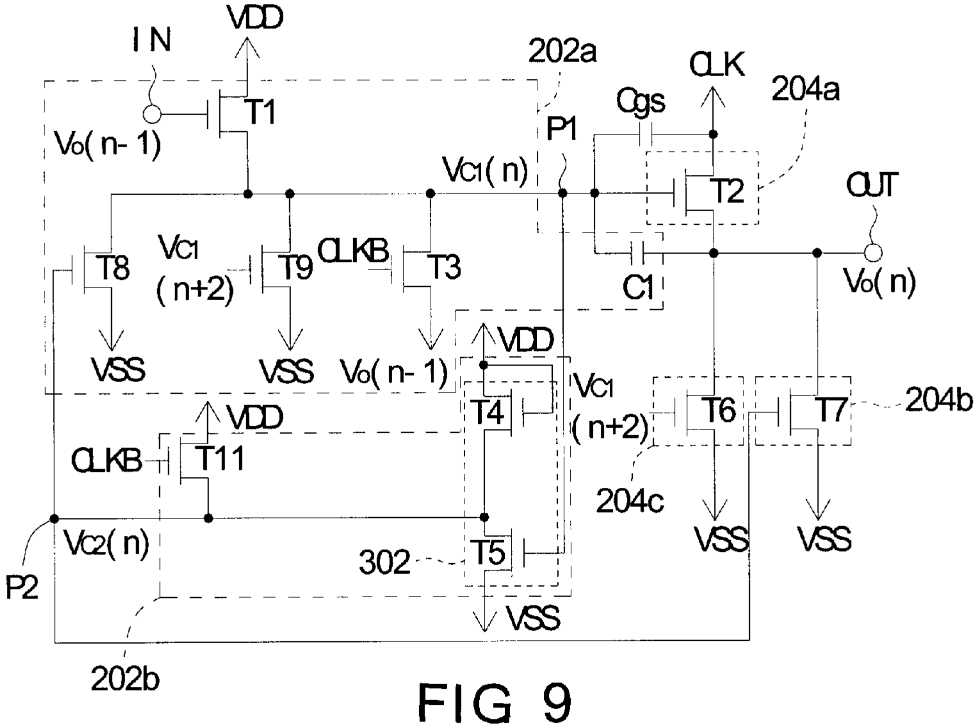
FIG. 9 is a detailed circuit diagram showing the seventh circuit implementation of the shift register unit S(n) of FIG. 1.
Figure 10:
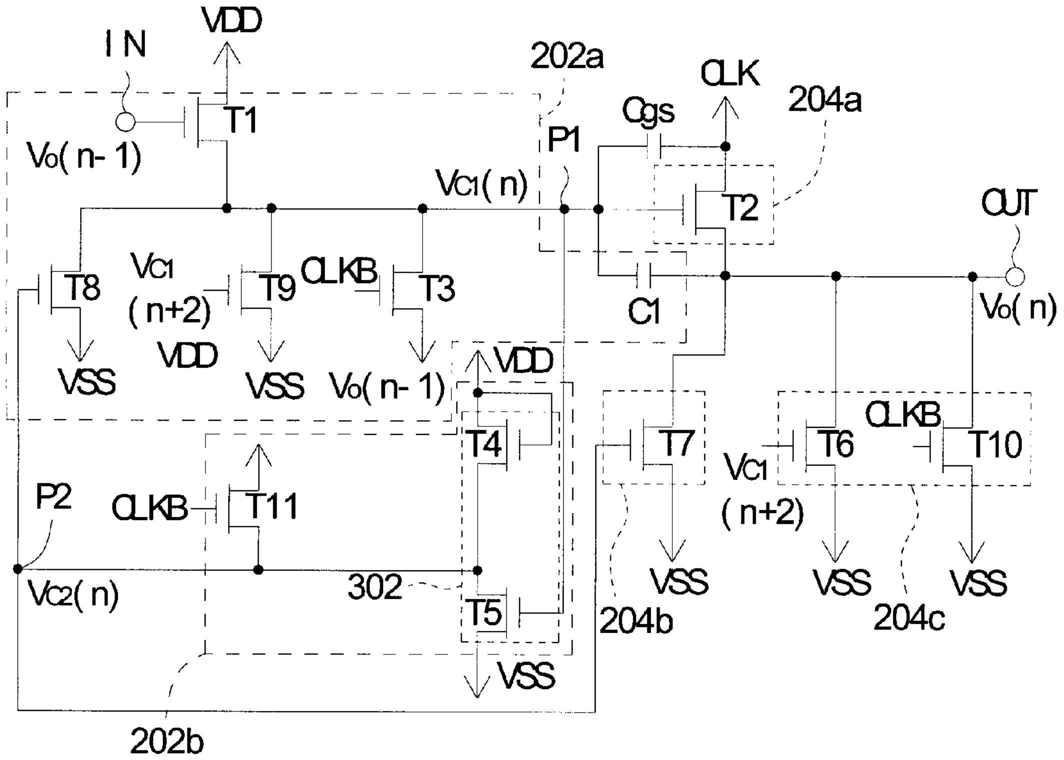
FIG. 10 is a detailed circuit diagram showing the eighth circuit implementation of the shift register unit S(n) of FIG. 1.

FIGS. 8 to 10 are detailed circuit diagrams showing the sixth to eighth circuit implementations of the shift register unit S(n) of FIG. 1. The $n^{th}$ shift register units S(n) of the sixth to eighth implementations are induced based on the $n^{th}$ shift register units S(n) of FIGS. 4 to 6, respectively. The difference between the shift register units S(n) of the sixth to eighth implementations and those of FIGS. 4 to 6 is that the driving unit 202*b* further includes the transistor T11. Thus, the operations of the shift register units S(n) of the sixth to eighth implementations may be derived according to the descriptions in the fifth implementation.

Figure 11:
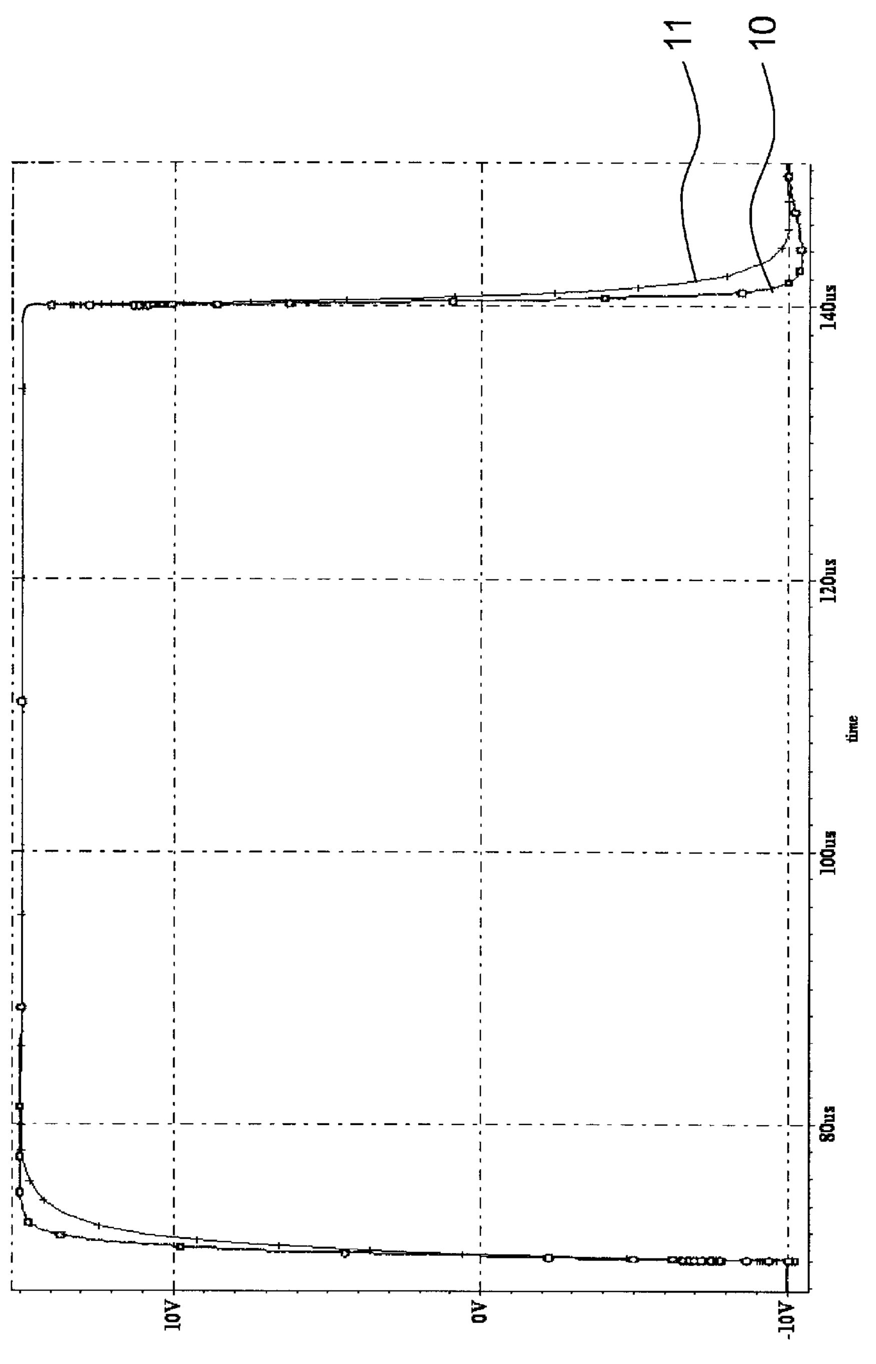
FIG. 11 is a simulated timing chart showing an output signal Vo(n) of the shift register unit of FIG. 10.

FIG. 11 is a simulated timing chart showing an output signal Vo(n) of the shift register unit of FIG. 10. As shown in the implemented structure of FIG. 11, the output signal Vo(n) is simulated according to that the stray resistor of each of the transistors T1 to T11 is 4.5 kΩ (kilohms), and that the capacitor C1 has the capacitance of 15 pf (Pico Farads). The curve 10 shows the signal waveform of the output signal Vo(n) of the shift register unit S(n) of FIG. 10, and the curve 11 shows the simulated waveform of the output signal Vo'(n) when the transistors T9 and T6 are controlled according to the output signal Vo(n+1) of the next shift register unit. As can be easily understood from the curves 10 and 11, the output signal Vo(n) of the shift register unit of this embodiment has the shorter delay time, and the rising time and falling time of the signal level are advantageously shorter.

Second Implemented Structure

Figure 12:
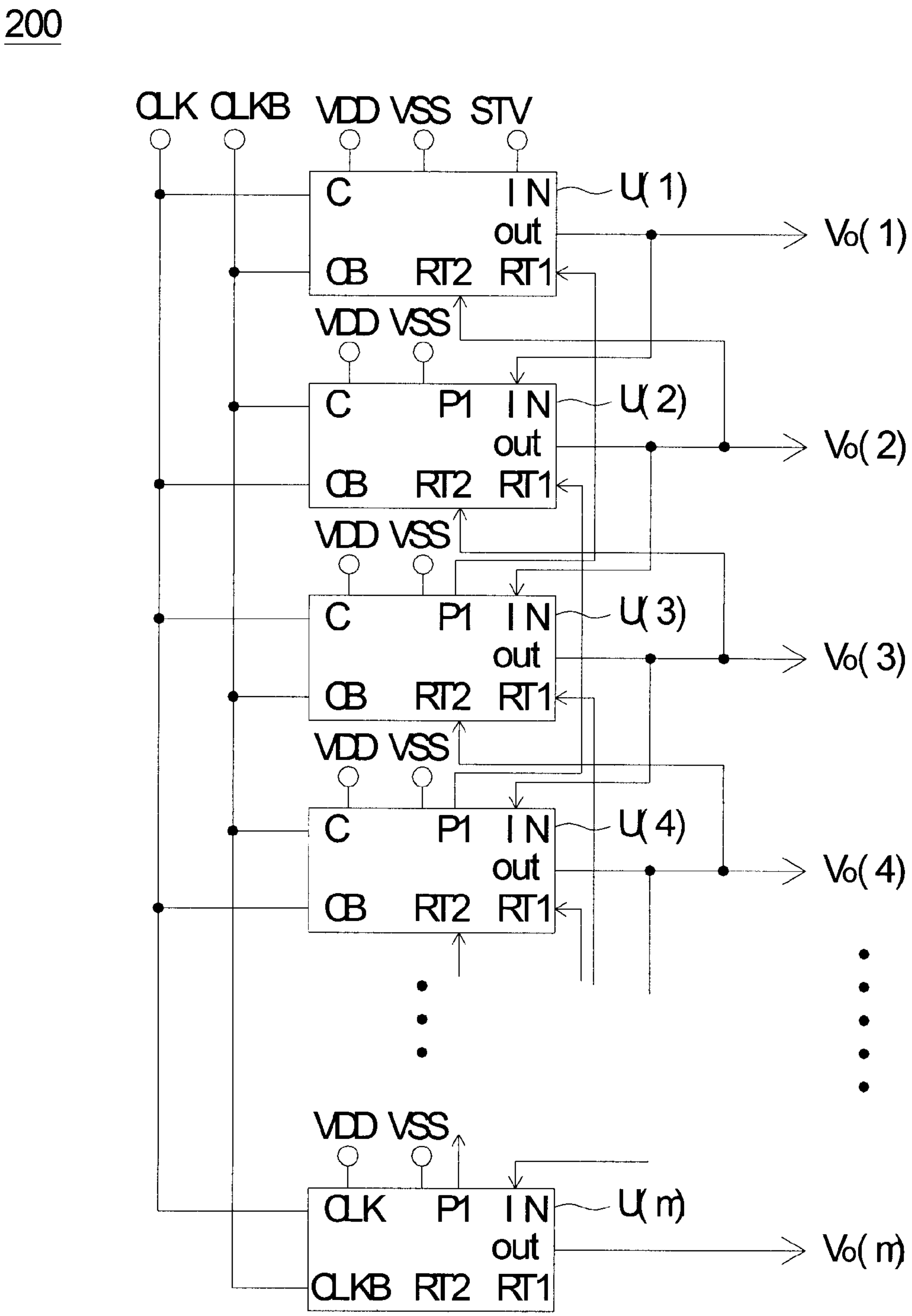
FIG. 12 is a block diagram showing a shift register of a second implemented structure according to the first embodiment of the invention.

FIG. 12 is a block diagram showing a shift register 200 of a second implemented structure according to the first embodiment of the invention. As shown in FIG. 12, the shift register 200 differs from the shift register 100 of the first implemented structure of this embodiment in that each of the shift register units U(1) to U(m−2) includes two control terminals RT1 and RT2, which respectively receive control signals Vc1(3) to Vc1(*m*) on the nodes P1 of the shift register units U(3) to U(m) and the output signals Vo(2) to Vo(m−1) of the shift register units U(2) to U(m−1). Next, various circuit implementations of the shift register unit U(n) of this embodiment will be described by taking the structure of the $n^{th}$ shift register unit U(n) in the shift register units U(1) to U(m) as an example, wherein n is a natural number.

Figure 13:
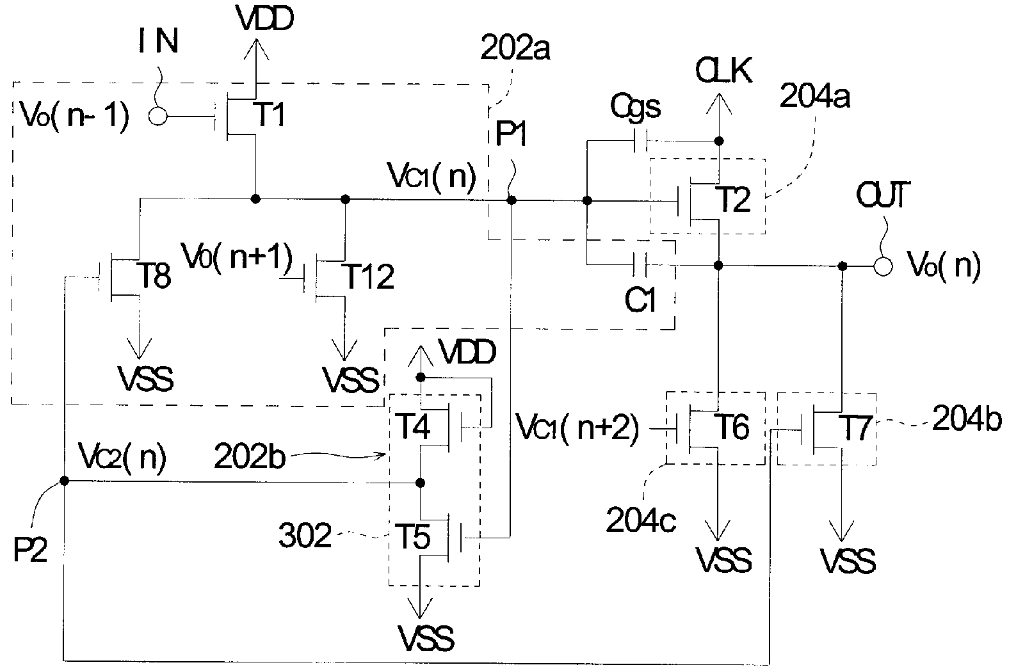
FIG. 13 is a detailed circuit diagram showing the first circuit implementation of a shift register unit U(n) of FIG. 12.

FIG. 13 is a detailed circuit diagram showing the first circuit implementation of a shift register unit U(n) of FIG. 12. As shown in FIG. 13, the shift register unit U(n) of this implementation differs from the shift register unit S(n) of FIG. 2 in that the driving unit 202*b* includes the transistor T12, and the transistor T3 in the shift register unit S(n) of FIG. 2 is replaced with the transistor T12.

The transistor T12 has a drain coupled to the node P1, a gate for receiving the output signal Vo(n+1) of the $(n+1)^{th}$ shift register unit U(n+1) and a source for receiving the voltage VSS. The transistor T12 provides the voltage VSS to the node P1 in response to the front edge of the output signal Vo(n+1) to make the control signal Vc1(*n*) be equal to the voltage VSS. In the time periods TP1 and TP2, the output signal Vo(n+1) is equal to the voltage VSS and the transistor T12 turns off. In the time period TP3, the output signal Vo(n+1) is equal to the voltage VDD so that the transistor T12 turns on to provide the voltage VSS to the node P1 and to make the voltage signal Vc1(*n*) be equal to the voltage VSS in order to turn off the transistor T2.

In the $n^{th}$ shift register unit U(n) of this implementation, the transistor T12 replaces the transistor T3 of the shift register unit S(n) of FIG. 2. However, the transistor T12 and the transistor T3 have substantially the same effect to make the control signal Vc1(*n*) be equal to the voltage VSS in the time period TP3. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 14:
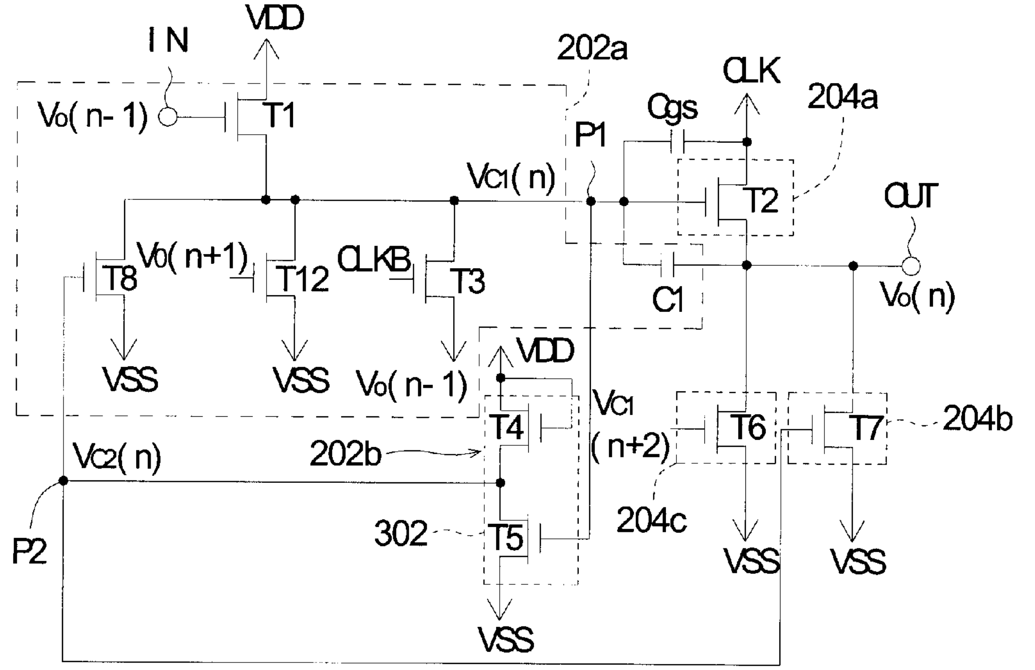
FIG. 14 is a detailed circuit diagram showing the second circuit implementation of the shift register unit U(n) of FIG. 12.

FIG. 14 is a detailed circuit diagram showing the second circuit implementation of the shift register unit U(n) of FIG. 12. As shown in FIG. 14, the shift register unit U(n) of this implementation differs from the shift register unit S(n) of FIG. 13 in that the driving unit 202*b* further includes the transistor T3. However, the transistor T3 and the transistor T12 have the substantially similar function to make the control signal Vc1(*n*) be equal to the voltage VSS in the time period TP3. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 15:
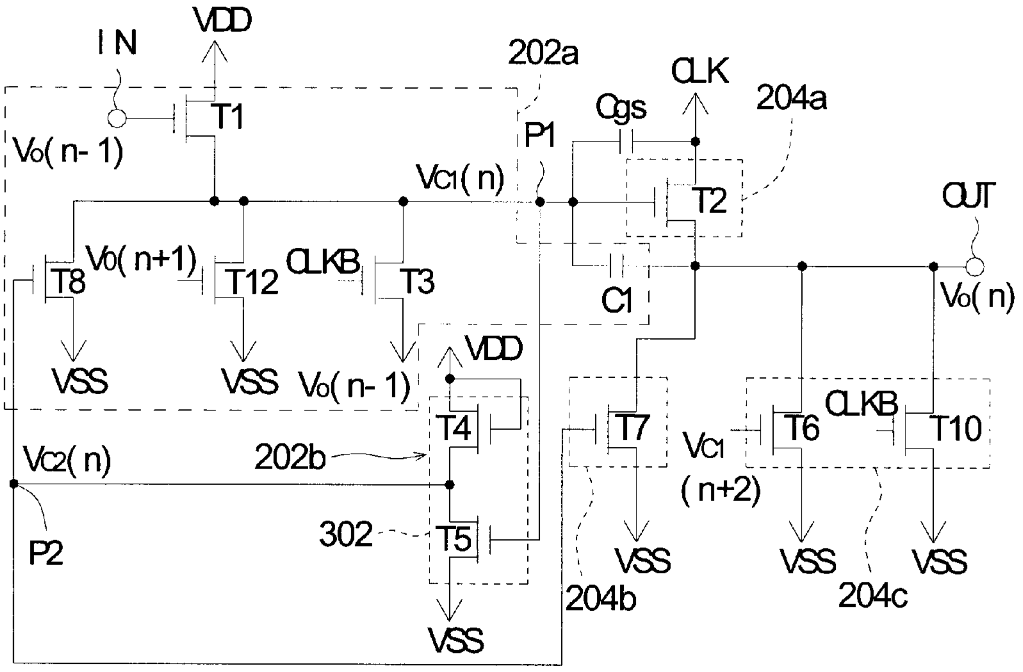
FIG. 15 is a detailed circuit diagram showing the third circuit implementation of the shift register unit U(n) of FIG. 12.

FIG. 15 is a detailed circuit diagram showing the third circuit implementation of the shift register unit U(n) of FIG. 12. As shown in FIG. 15, the shift register unit U(n) of this implementation differs from the shift register unit U(n) of FIG. 14 in that the level control unit 204*c* further includes the transistor T10. Thus, the $n^{th}$ shift register unit U(n) of this implementation can make the output signal Vo(n) be equal to the voltage VSS in the time periods TP1 and TP3 to prevent the signal level of the output signal Vo(n) from being influenced by the noise generated by the parasitic capacitor thereof. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 16:
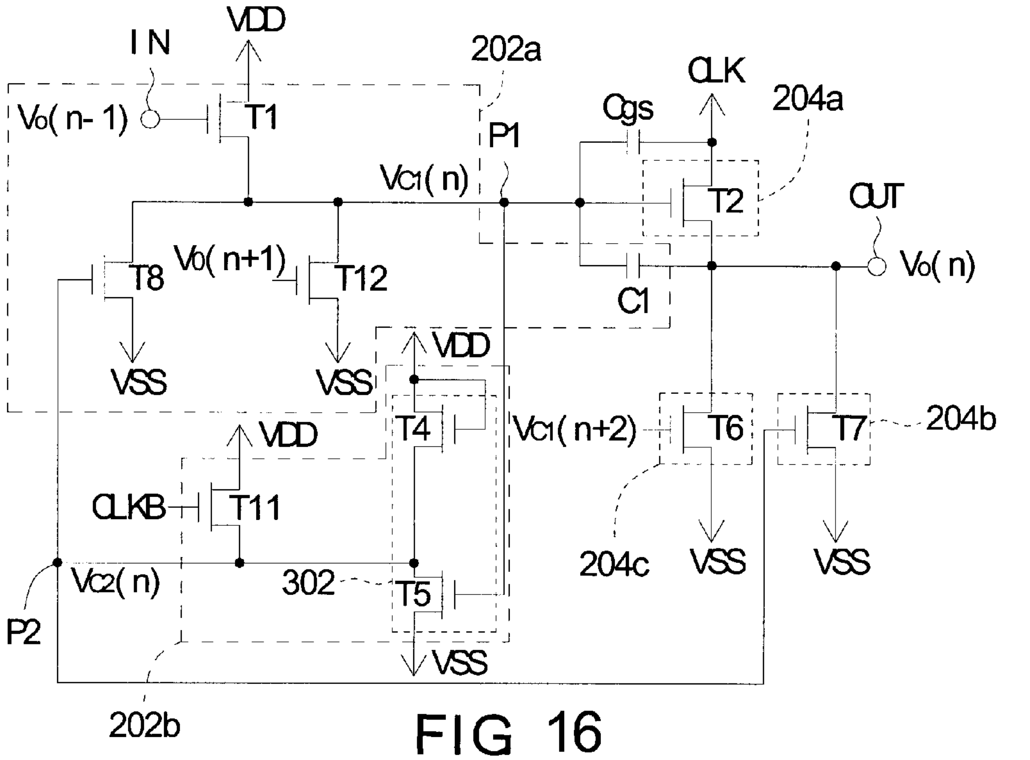
FIG. 16 is a detailed circuit diagram showing the fourth circuit implementation of the shift register unit U(n) of FIG. 12.
Figure 17:
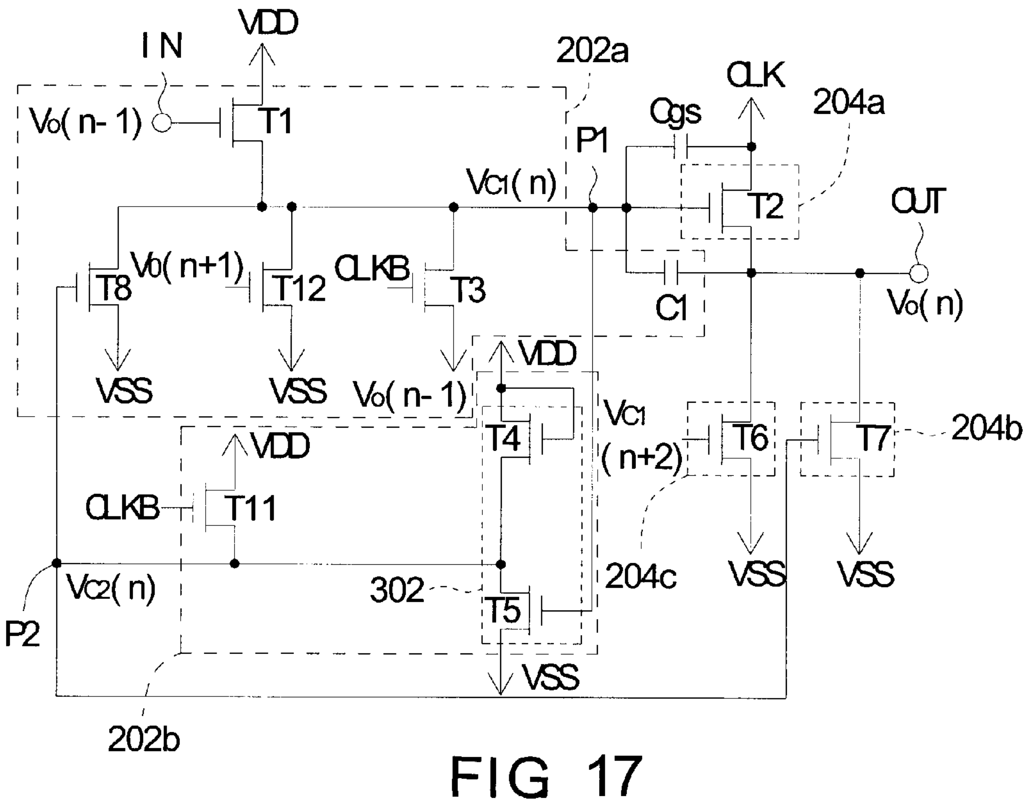
FIG. 17 is a detailed circuit diagram showing the fifth circuit implementation of the shift register unit U(n) of FIG. 12.
Figure 18:
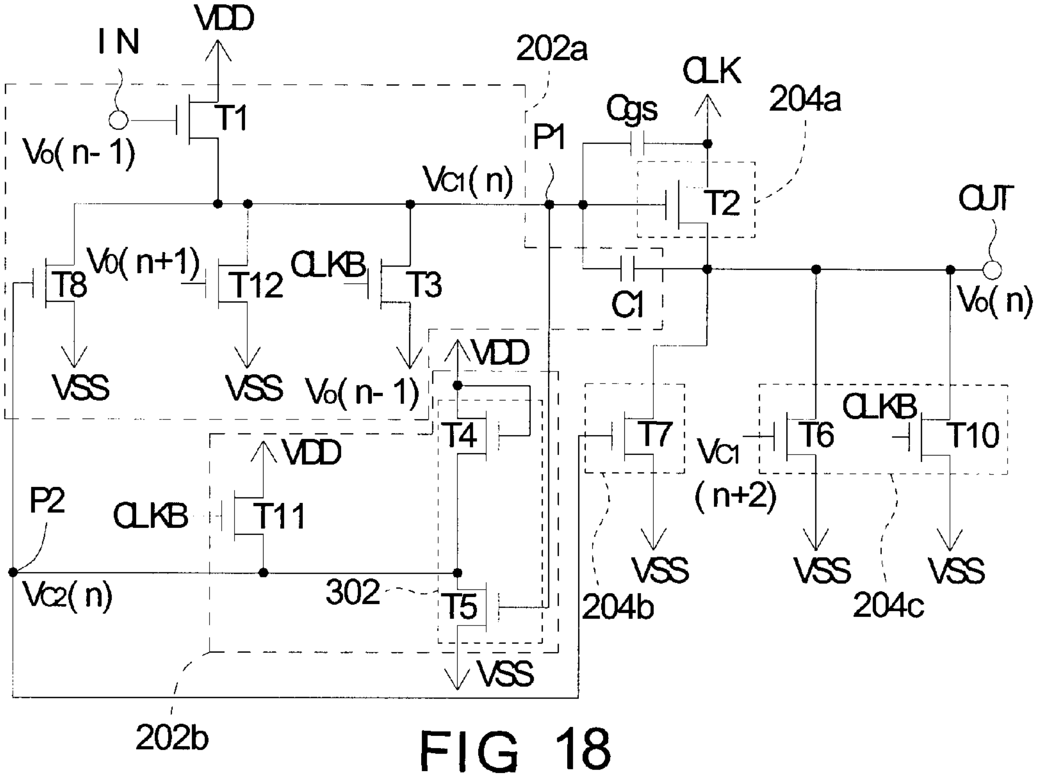
FIG. 18 is a detailed circuit diagram showing the sixth circuit implementation of the shift register unit U(n) of FIG. 12.

FIGS. 16 to 18 are a detailed circuit diagram showing the fourth to six circuit implementations of the shift register unit U(n) of FIG. 12. The $n^{th}$ shift register units U(n) of the fourth to sixth implementations are induced based on the $n^{th}$ shift register units U(n) of FIGS. 13 to 15. The difference between the shift register units U(n) of the fourth to sixth implementations and those of FIGS. 13 to 15 is that the driving unit 202*b* further includes the transistor T11. The transistors T11 and T4 have the substantially similar function to increase the level of the voltage signal Vc2(*n*) to the voltage (VDD−Vth) in the time period TP3. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Second Embodiment

The shift register of this embodiment differs from the shift register of the first embodiment in that the driving unit of the $n^{th}$ shift register unit turns off the first level control unit in response to the front edge of the first control signal of the $(n+2)^{th}$ shift register unit, wherein n is a natural number. Next, the detailed operations of the $n^{th}$ shift register unit will be described with reference to several implemented structures.

First Implemented Structure

The shift register of this implemented structure is substantially the same as the shift register of the first implemented structure of the first embodiment of FIG. 1, and detailed descriptions thereof may be found hereinabove.

Figure 19:
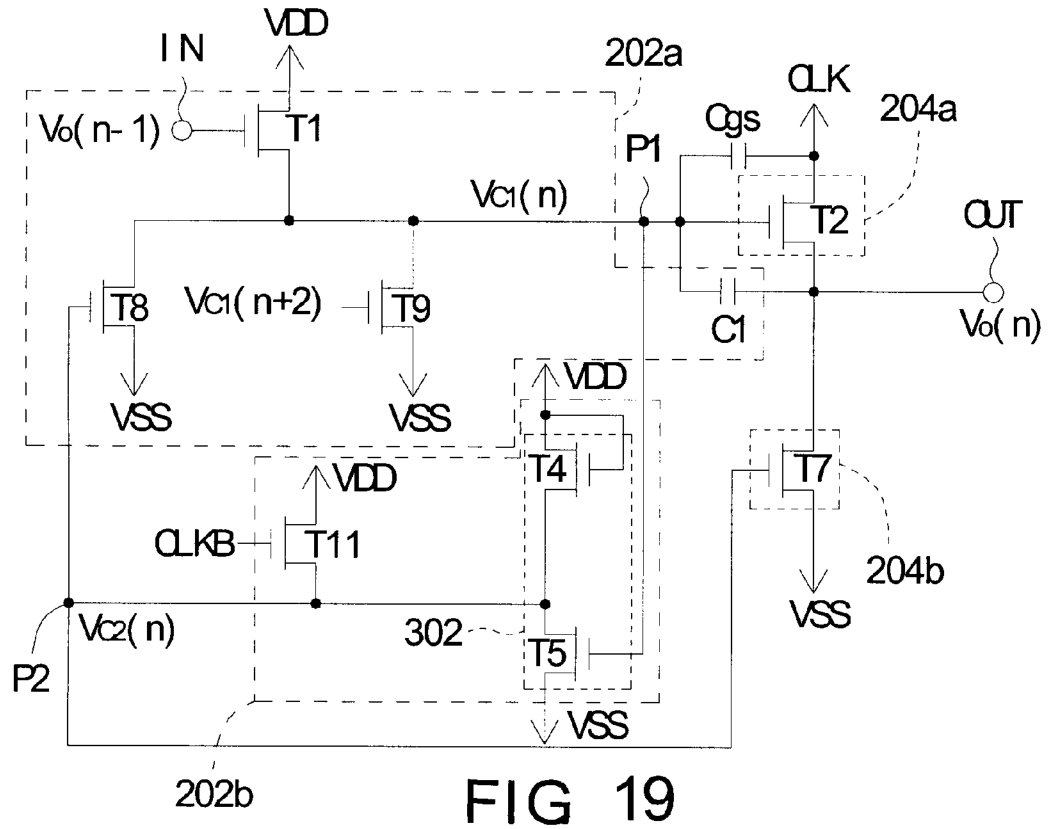
FIG. 19 is a detailed circuit diagram showing the ninth circuit implementation of the shift register unit S(n) of FIG. 1.

FIG. 19 is a detailed circuit diagram showing the ninth circuit implementation of the shift register unit S(n) of FIG. 1. As shown in FIG. 19, the shift register unit S(n) of this implementation differs from the shift register unit of FIG. 8 in that the shift register unit S(n) of this implementation does not have the level control unit 204*c*, and only utilizes the level control unit 204*b* to make the output signal Vo(n) be equal to the voltage VSS in order to prevent the circuit noise from influencing the signal level of the output signal Vo(n). Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 20:
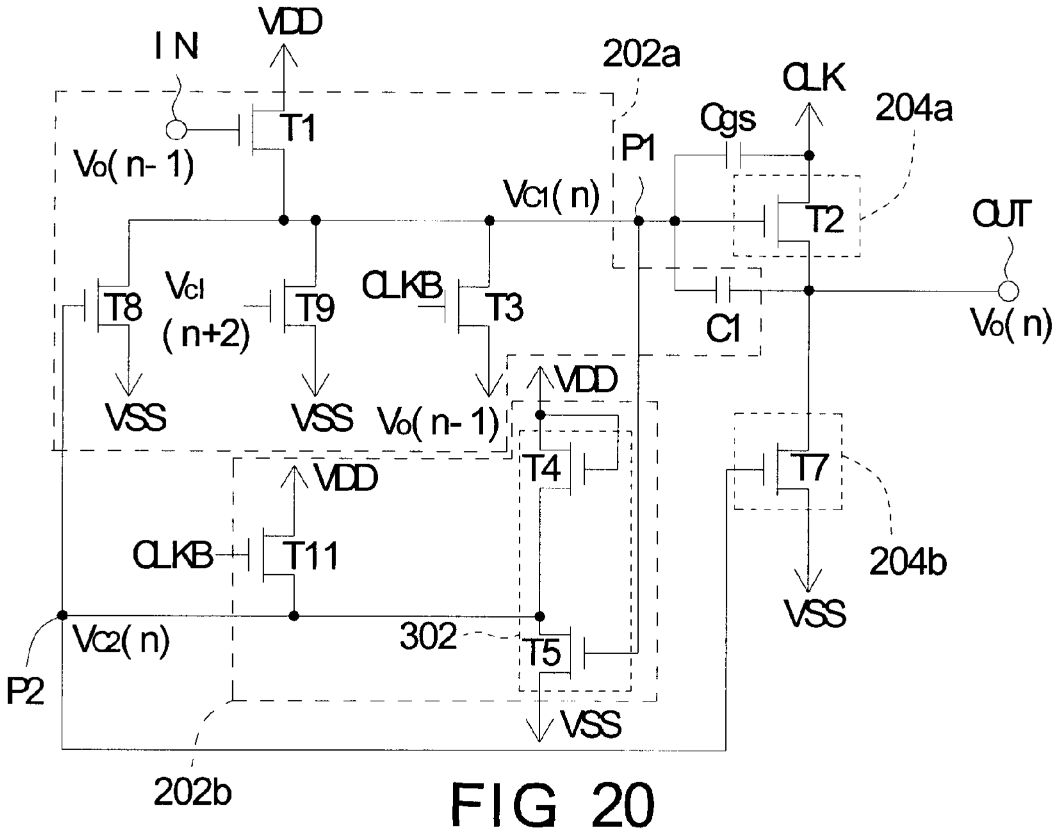
FIG. 20 is a detailed circuit diagram showing the tenth circuit implementation of the shift register unit S(n) of FIG. 1.

FIG. 20 is a detailed circuit diagram showing the tenth circuit implementation of the shift register unit S(n) of FIG. 1. As shown in FIG. 20, the shift register unit S(n) of this implementation differs from the shift register unit of FIG. 19 in that the driving unit 202*a* thereof further includes the transistor T3 for providing the output signal Vo(n−1) to the node P1 in response to the clock signal CLKB. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Second Implemented Structure

The shift register of this implemented structure is substantially the same as the shift register of the second implemented structure of the first embodiment illustrated in FIG. 12, and detailed descriptions thereof may be found hereinabove.

Figure 21:
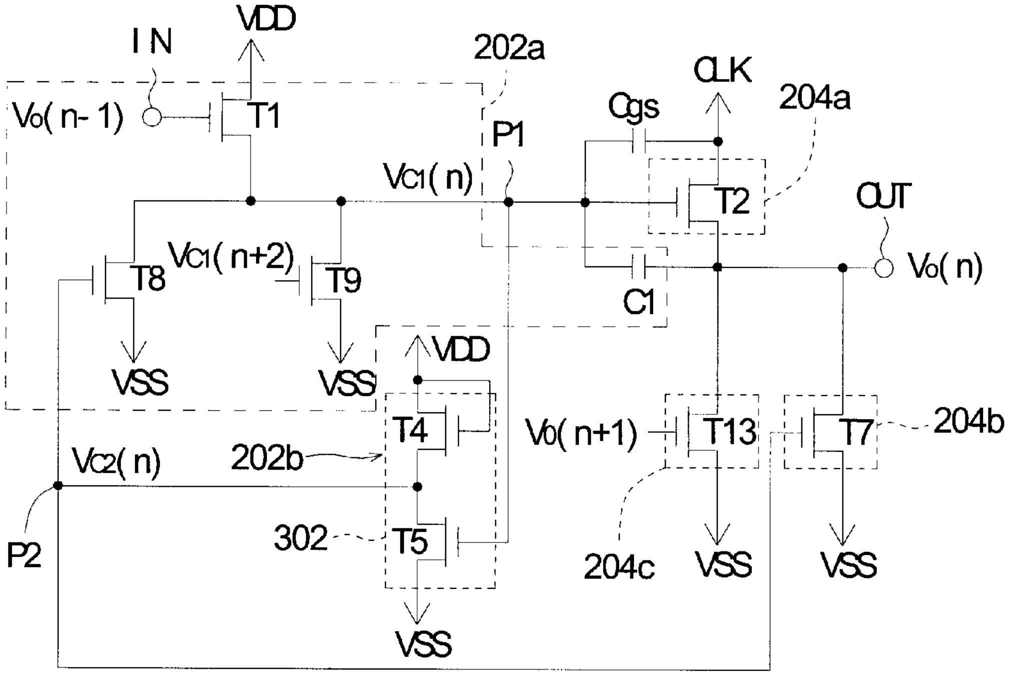
FIG. 21 is a detailed circuit diagram showing the seventh circuit implementation of the shift register unit U(n) of FIG. 12.

FIG. 21 is a detailed circuit diagram showing the seventh circuit implementation of the shift register unit U(n) of FIG. 12. As shown in FIG. 21, the shift register unit U(n) of this implementation differs from the shift register unit of FIG. 20 in that it does not have the transistor T11 and further includes the level control unit 204*c* including a transistor T13.

The transistor T13 has a drain coupled to the output terminal OUT, a gate for receiving the output signal Vo(n+1) of the $(n+1)^{th}$ shift register unit U(n+1) and a source for receiving the voltage VSS. The transistor T13 provides the voltage VSS to the output terminal OUT in response to the front edge of the output signal Vo(n+1) to make the output signal Vo(n) be equal to the voltage VSS.

In the time period TP1, the output signal Vo(n+1) is equal to the voltage VSS, and the output signal Vo(n) is equal to the voltage VSS. In the time period TP2, the output signal Vo(n+1) is equal to the voltage VSS, and the transistor T13 turns off to make the output signal Vo(n) be equal to the voltage VDD. In the time period TP3, the output signal Vo(n+1) is equal to the voltage VDD, and the transistor T13 turns on to make the output signal Vo(n) be equal to the voltage VSS.

The $n^{th}$ shift register unit U(n) of this implementation has the transistor T13 disposed in the level control unit 204*c* to make the output signal Vo(n) be equal to the voltage VSS in the time period TP3 and thus to prevent the circuit noise from influencing the signal level of the output signal Vo(n). The $n^{th}$ shift register unit of this implementation controls the operation of one transistor according to the output signal of the $(n+1)^{th}$ shift register unit. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 22:
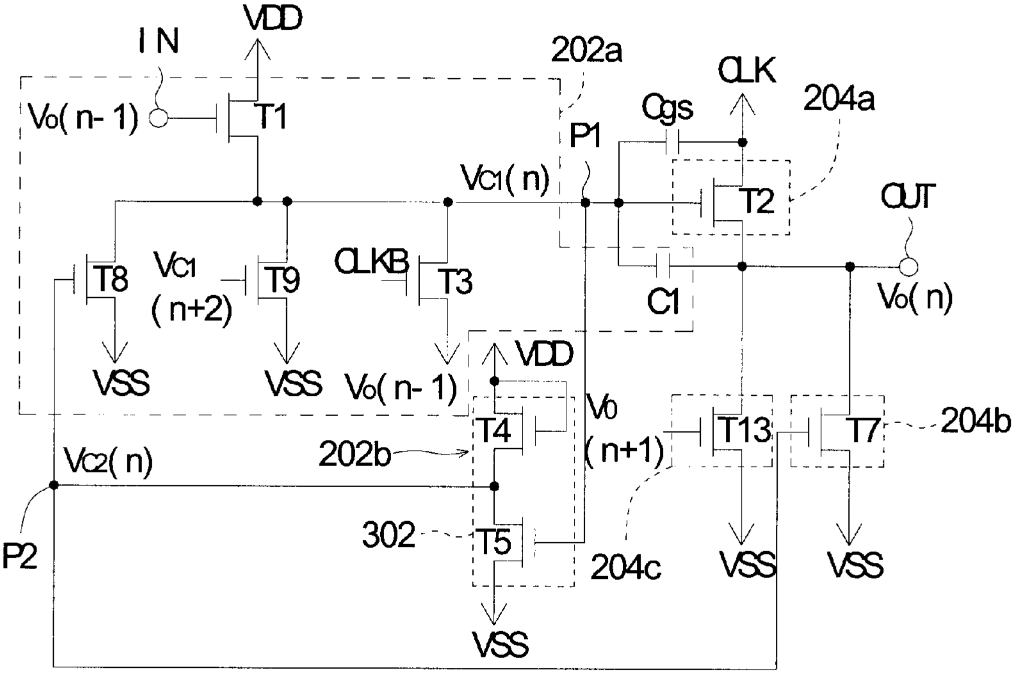
FIG. 22 is a detailed circuit diagram showing the eighth circuit implementation of the shift register unit U(n) of FIG. 12.

FIG. 22 is a detailed circuit diagram showing the eighth circuit implementation of the shift register unit U(n) of FIG. 12. As shown in FIG. 22, the shift register unit U(n) of this implementation differs from the shift register unit of FIG. 21 in that the driving unit 202*a* further includes the transistor T3 for providing the output signal Vo(n−1) to the node P1 in response to the clock signal CLKB. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 23:
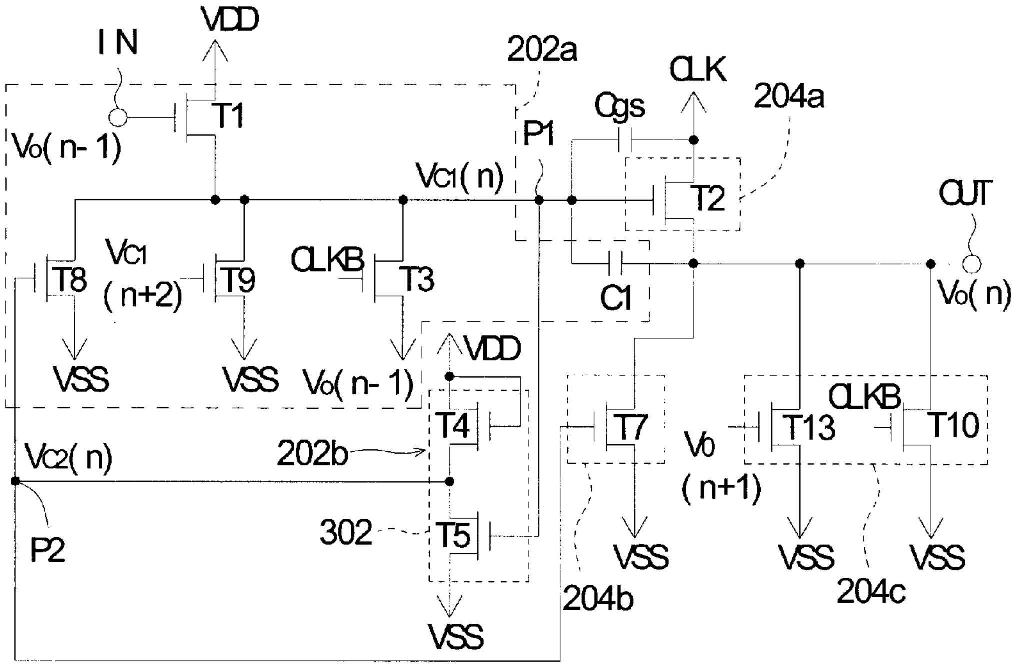
FIG. 23 is a detailed circuit diagram showing the ninth circuit implementation of the shift register unit U(n) of FIG. 12.

FIG. 23 is a detailed circuit diagram showing the ninth circuit implementation of the shift register unit U(n) of FIG. 12. As shown in FIG. 23, the shift register unit U(n) of this implementation differs from the shift register unit of FIG. 22 in that the level control unit 204*c* further includes the transistor T10 for making the output signal Vo(n) be equal to the voltage VSS in the time periods TP1 and TP3 in order to prevent the circuit noise from influencing the signal level of the output signal Vo(n). Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 24:
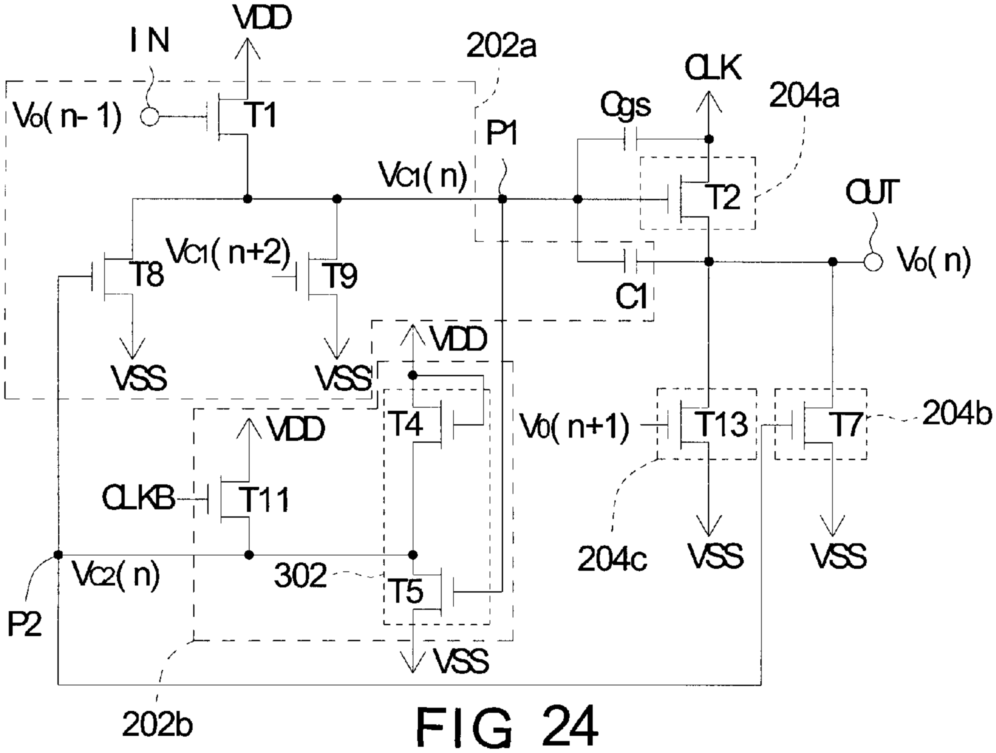
FIG. 24 is a detailed circuit diagram showing the tenth circuit implementation of the shift register unit U(n) of FIG. 12.
Figure 25:
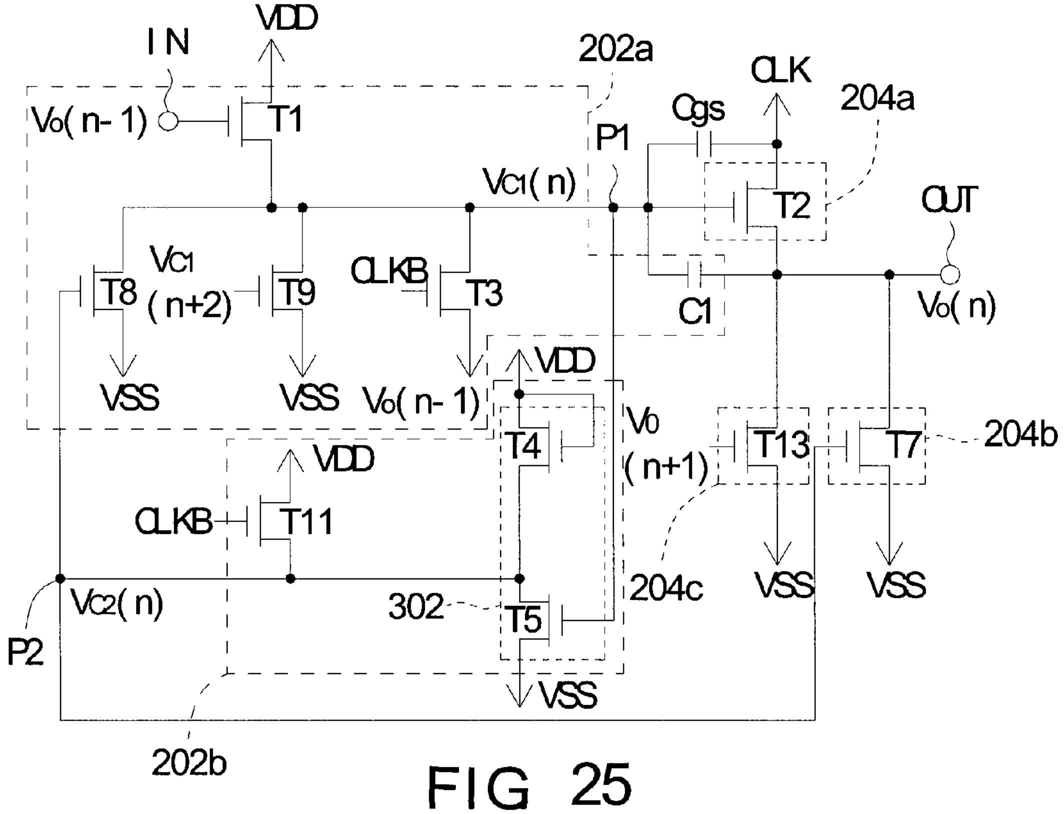
FIG. 25 is a detailed circuit diagram showing the eleventh circuit implementation of the shift register unit U(n) of FIG. 12.
Figure 26:
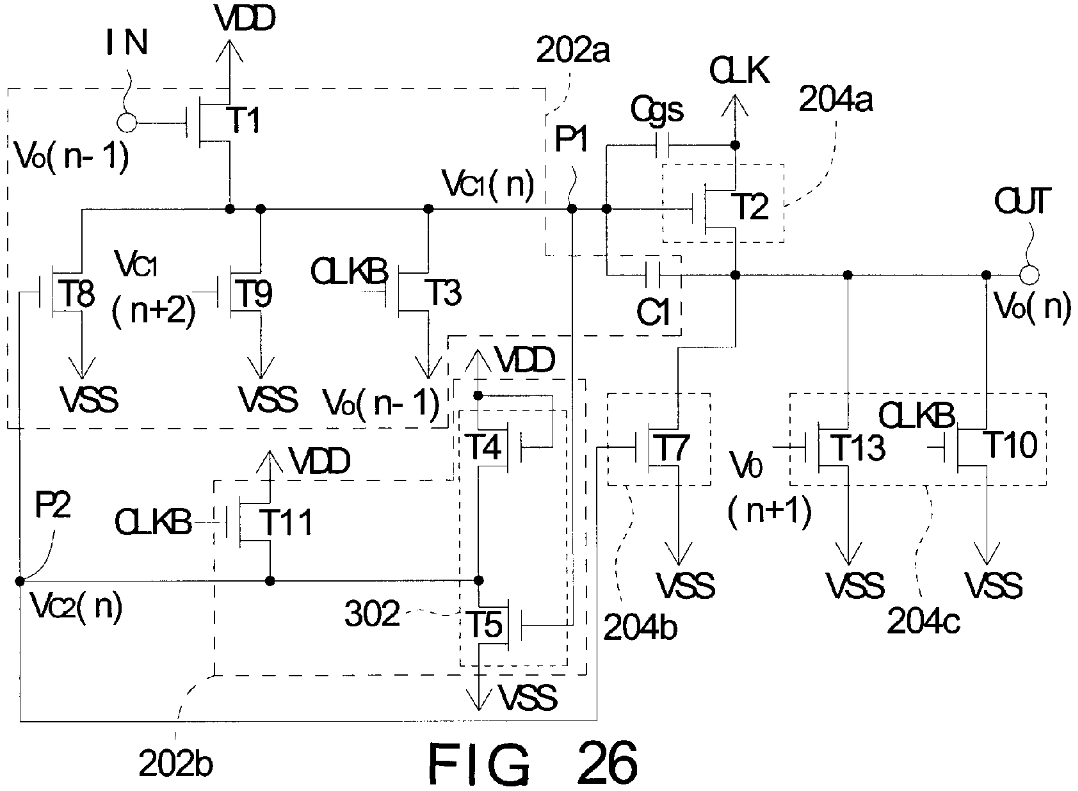
FIG. 26 is a detailed circuit diagram showing the twelfth circuit implementation of the shift register unit U(n) of FIG. 12.

FIGS. 24 to 26 are detailed circuit diagrams showing the tenth to twelfth circuit implementations of the shift register unit U(n) of FIG. 12. The $n^{th}$ shift register units U(n) of the tenth to twelfth implementations are respectively induced based on the $n^{th}$ shift register units U(n) of FIGS. 21 to 23. The difference between the shift register units U(n) of the tenth to twelfth implementations and those of FIGS. 21 to 23 is that the driving unit 202*b* further includes the transistor T11. The transistors T11 and T4 increase the level of the voltage signal Vc2(*n*) substantially to the voltage VDD in the time period TP3. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Third Implemented Structure

Figure 27:
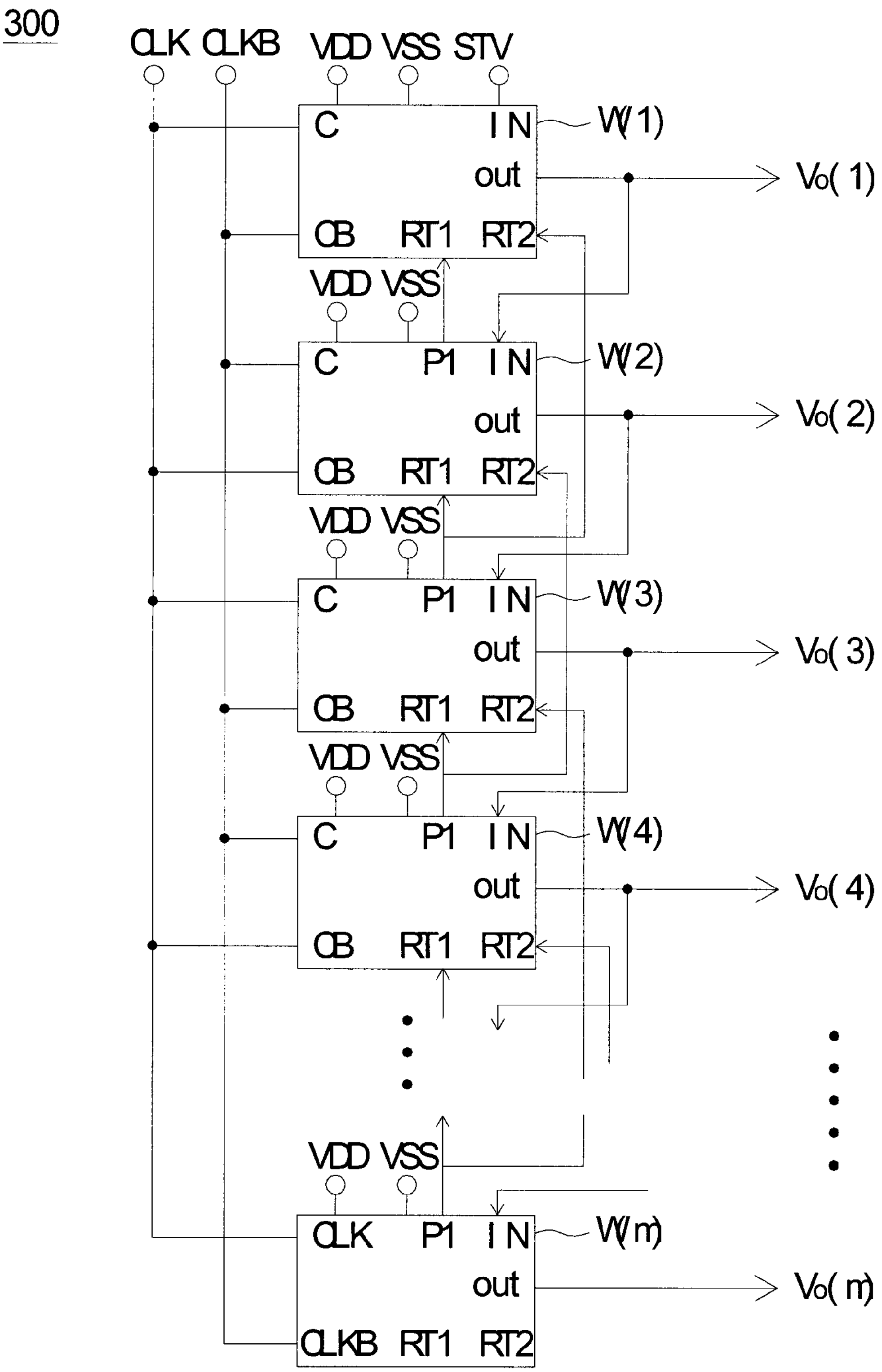
FIG. 27 is a block diagram showing a shift register of a third implemented structure according to a second embodiment of the invention.

FIG. 27 is a block diagram showing a shift register 300 of a third implemented structure according to a second embodiment of the invention. As shown in FIG. 27, the shift register 300 differs from the shift register 200 of the second implemented structure of the first embodiment in that the control terminals RT1 and RT2 of each of the shift register units W(1) to W(m−2) respectively receive the control signals Vc1(2) to Vc1(*m*−1) on the nodes P1 of the shift register units W(2) to W(m−1) and the control signals Vc1(3) to Vc1(*m*) on the nodes P1 of the shift register units W(3) to W(m). Next, various circuit implementations of the shift register unit W(n) of this embodiment will be described by taking the structure of the $n^{th}$ shift register unit W(n) in the shift register units W(1) to W(m) as an example, wherein n is a natural number.

Figure 28:
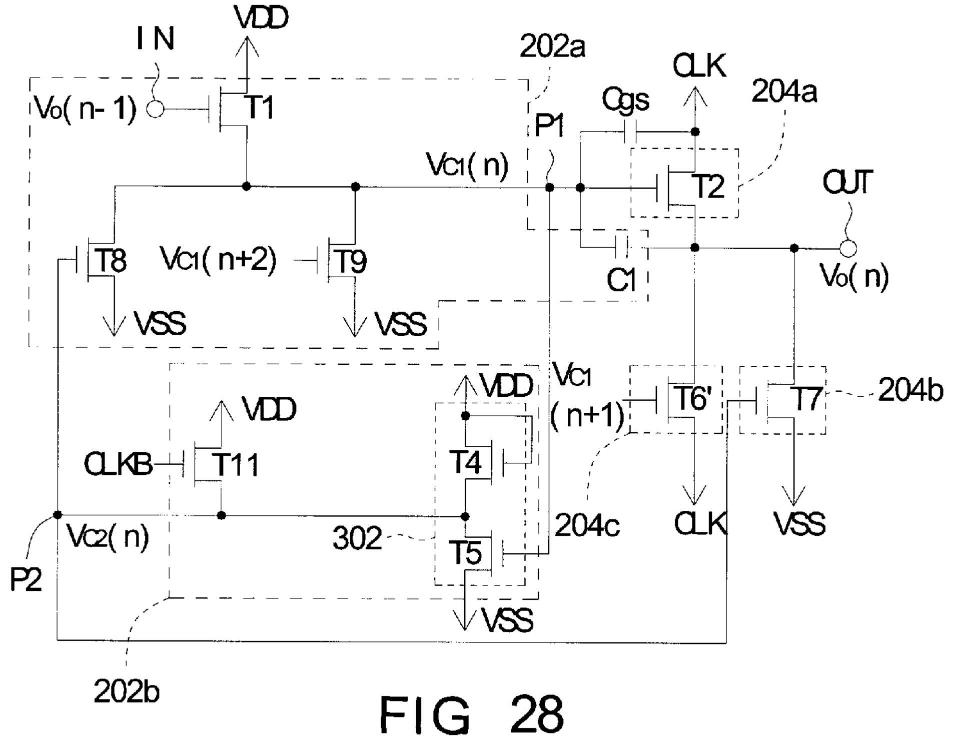
FIG. 28 is a detailed circuit diagram showing the first circuit implementation of a shift register unit W(n) of FIG. 27.

FIG. 28 is a detailed circuit diagram showing the first circuit implementation of a shift register unit W(n) of FIG. 27. As shown in FIG. 28, the shift register unit W(n) of this implementation differs from the shift register unit S(n) of FIG. 8 in that the level control unit 204*c* has a transistor T6' to replace the transistor T6.

The transistor T6' has a drain coupled to the node P1, a gate for receiving the control signal Vc1(*n*+1) of the $(n+1)^{th}$ shift register unit W(n+1), and a source for receiving the clock signal CLK. The transistor T6' provides the clock signal CLK to the output terminal OUT when the level of the control signal Vc1(*n*+1) is higher than that of the clock signal CLK.

In the time periods TP1 and TP2, the control signals Vc1(*n*+1) are respectively equal to the voltage VSS and the voltage (VDD−Vth), and the clock signals CLK are respectively equal to the voltage VSS and the voltage VDD. Thus, the transistor T6' turns off in the time periods TP1 and TP2. In the time period TP3, the control signal Vc1(*n*+1) is further increased by a difference voltage ΔV relative to the level thereof in the time period TP2, and the clock signal CLK is equal to the voltage VSS. Consequently, the transistor T6' turns on in the time period TP3 to provide the low voltage level of the clock signal CLK to the output terminal OUT and thus to make the output signal Vo(n) be equal to the voltage VSS.

In the $n^{th}$ shift register unit W(n) of this implementation, the transistor T6 is replaced with the transistor T6' so that the output signal Vo(n) is equal to the voltage VSS in the time period TP3 to prevent the circuit noise from influencing the signal level of the output signal Vo(n). The transistor T6' may further decrease the output signal when the transistor T7 operates abnormally due to the influence of the stress effect caused by the long-time turn-on so that the output signal is equal to the lowest voltage level. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 29:
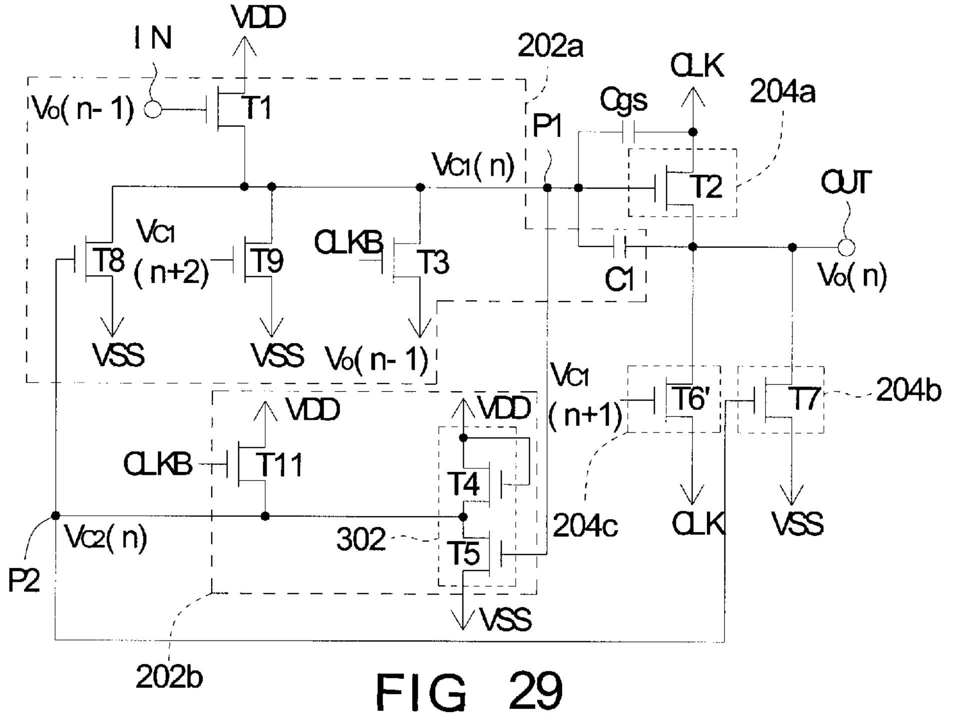
FIG. 29 is a detailed circuit diagram showing the second circuit implementation of the shift register unit W(n) of FIG. 27.

FIG. 29 is a detailed circuit diagram showing the second circuit implementation of the shift register unit W(n) of FIG. 27. As shown in FIG. 29, the shift register unit W(n) of this implementation differs from the shift register unit W(n) of FIG. 28 in that the driving unit 202*a* further includes the transistor T3 for providing the output signal Vo(n−1) to the node P1 in response to the clock signal CLKB. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 30:
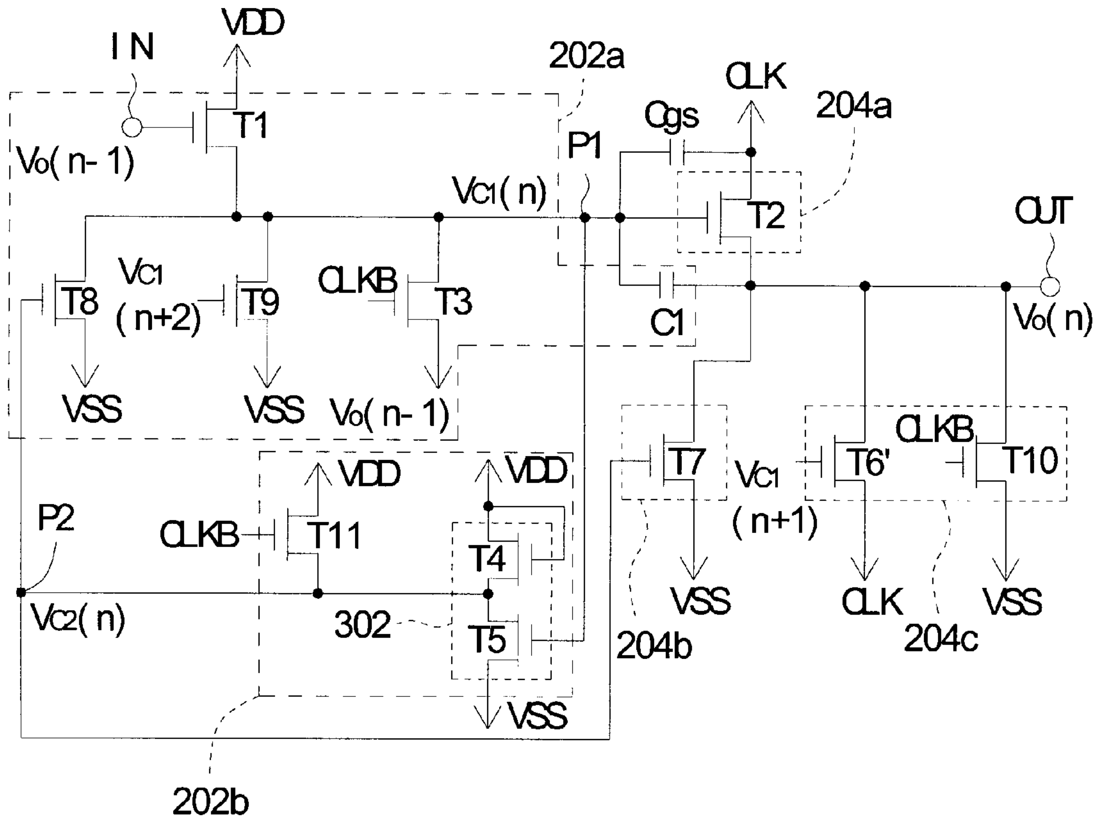
FIG. 30 is a detailed circuit diagram showing the third circuit implementation of the shift register unit W(n) of FIG. 27.

FIG. 30 is a detailed circuit diagram showing the third circuit implementation of the shift register unit W(n) of FIG. 27. As shown in FIG. 30, the shift register unit W(n) of this implementation differs from the shift register unit W(n) of FIG. 29 in that the level control unit 204*c* further includes the transistor T10 for making the output signal Vo(n) be equal to the voltage VSS in the time periods TP1 and TP3 to prevent the circuit noise from influencing the signal level of the output signal Vo(n). Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Third Embodiment

The shift register of this embodiment differs from the shift register of the first embodiment in that the third level control unit of the $n^{th}$ shift register unit provides the low voltage level of the first clock signal to the output terminal in response to the front edge of the first control signal of the $(n+1)^{th}$ shift register unit, wherein n is a natural number. Next, the detailed operations of the $n^{th}$ shift register unit will be described with reference to several implemented structures.

First Implemented Architecture

Figure 31:
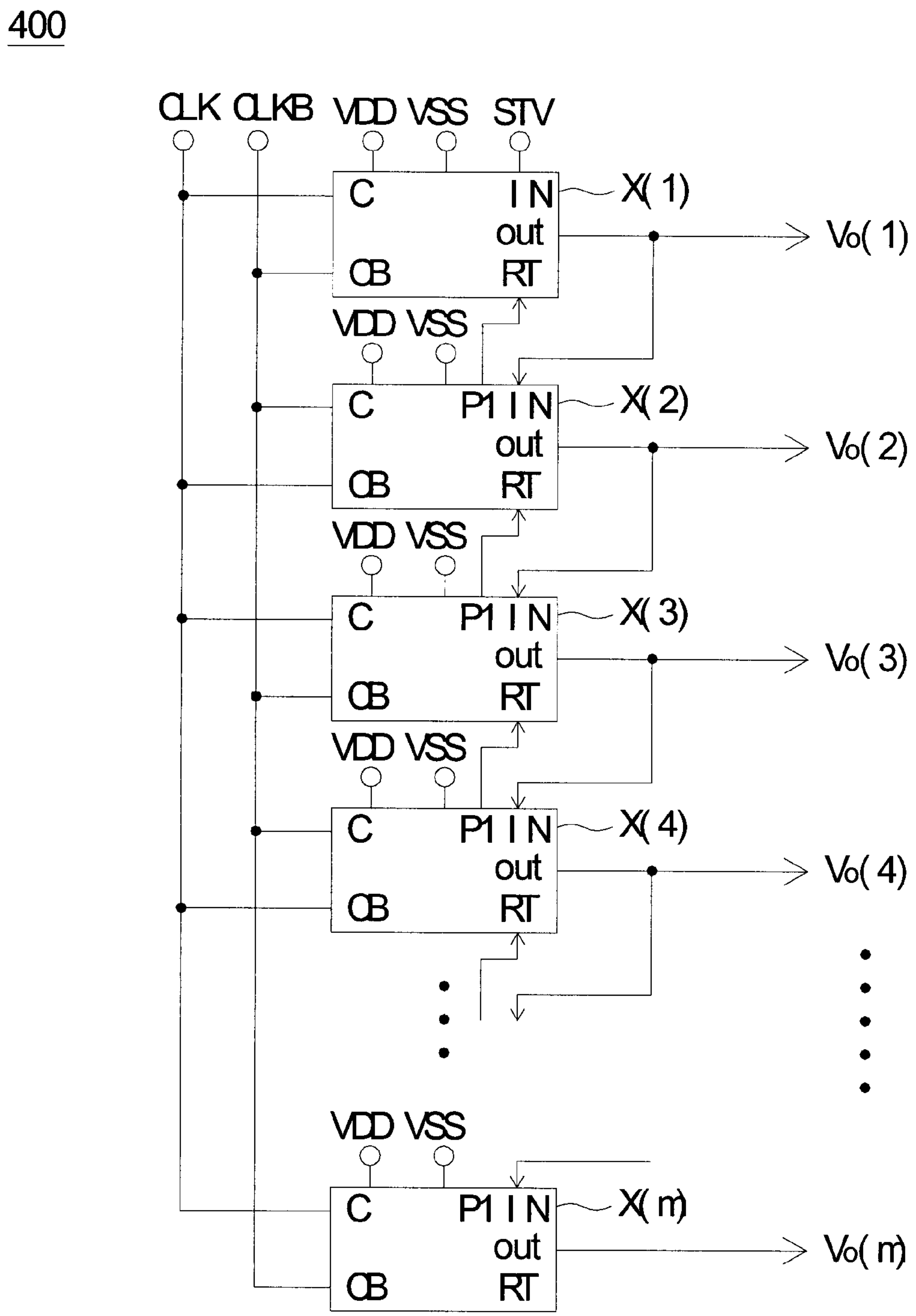
FIG. 31 is a block diagram showing a shift register of a first implemented structure according to a third embodiment of the invention.

FIG. 31 is a block diagram showing a shift register 400 of a first implemented structure according to a third embodiment of the invention. As shown in FIG. 31, the shift register 400 differs from the shift register 100 of the first implemented structure of the first embodiment in that the control terminals RT of the shift register units X(1) to X(m−2) respectively receive the control signals Vc1(2) to Vc1(*m*−1) on the nodes P1 of the shift register units X(2) to X(m−1). Next, various circuit implementations of the shift register unit X(n) of this embodiment will be described by taking the structure of the $n^{th}$ shift register unit X(n) in the shift register units X(1) to X(m) as an example, wherein n is a natural number.

Figure 32:
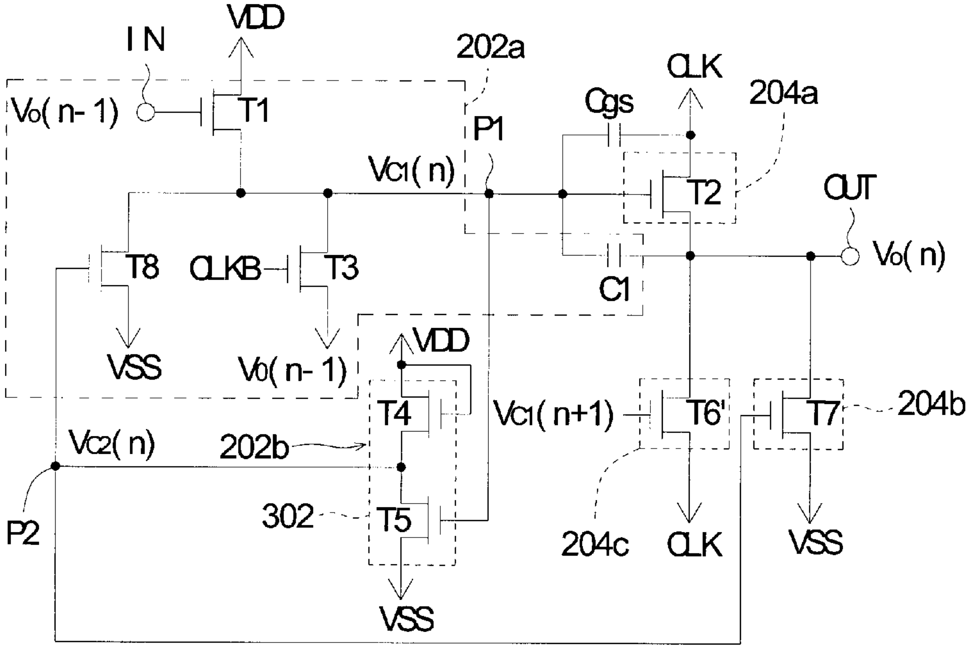
FIG. 32 is a detailed circuit diagram showing the first circuit implementation of a shift register unit X(n) of FIG. 31.

FIG. 32 is a detailed circuit diagram showing the first circuit implementation of a shift register unit X(n) of FIG. 31. As shown in FIG. 32, the shift register unit X(n) of this implementation differs from the shift register unit S(n) of FIG. 2 in that the level control unit 204*c* has the transistor T6' to replace the transistor T6 in order to make the output signal Vo(n) be equal to the voltage VSS in the time period TP3 to prevent the circuit noise from influencing the signal level of the output signal Vo(n). The transistor T6' may also decrease the output signal when the transistor T7 operates abnormally due to the influence of the stress effect caused by the long-time turn-on so that the output signal is equal to the lowest voltage level. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

Figure 33:
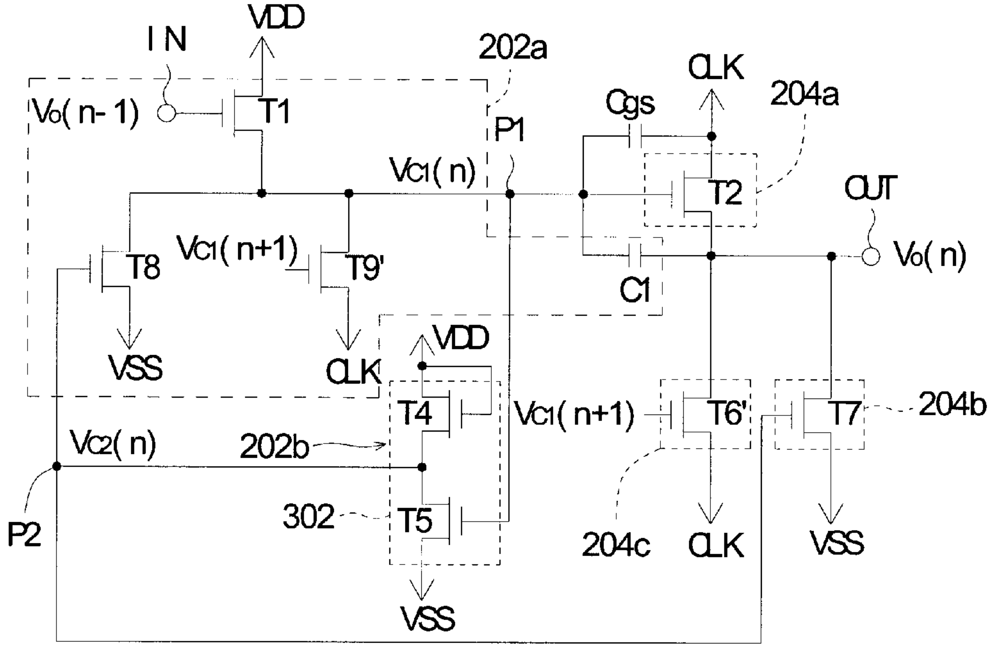
FIG. 33 is a detailed circuit diagram showing the second circuit implementation of the shift register unit X(n) of FIG. 31.
Figure 34:
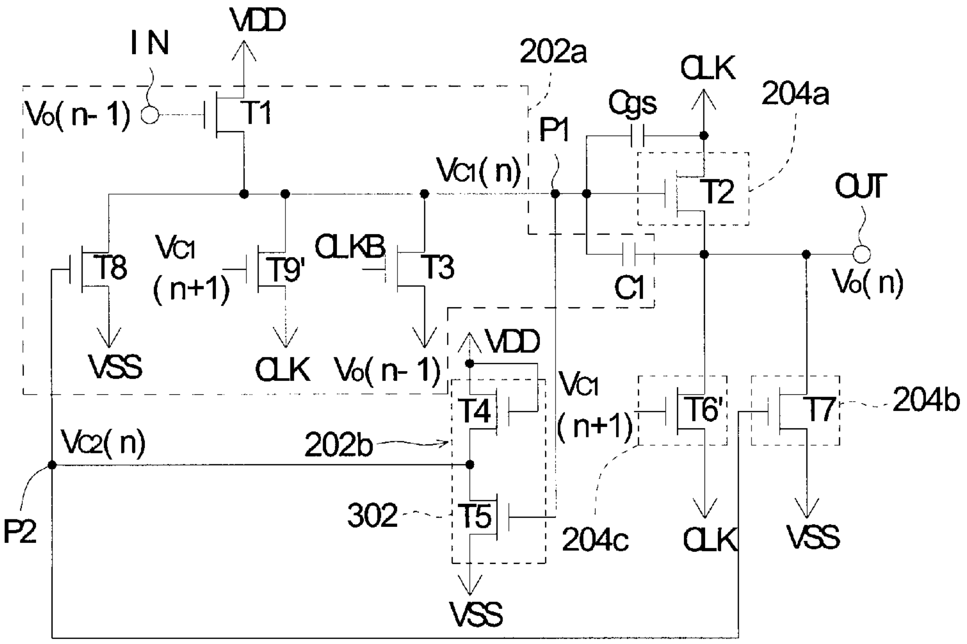
FIG. 34 is a detailed circuit diagram showing the third circuit implementation of the shift register unit X(n) of FIG. 31.
Figure 35:
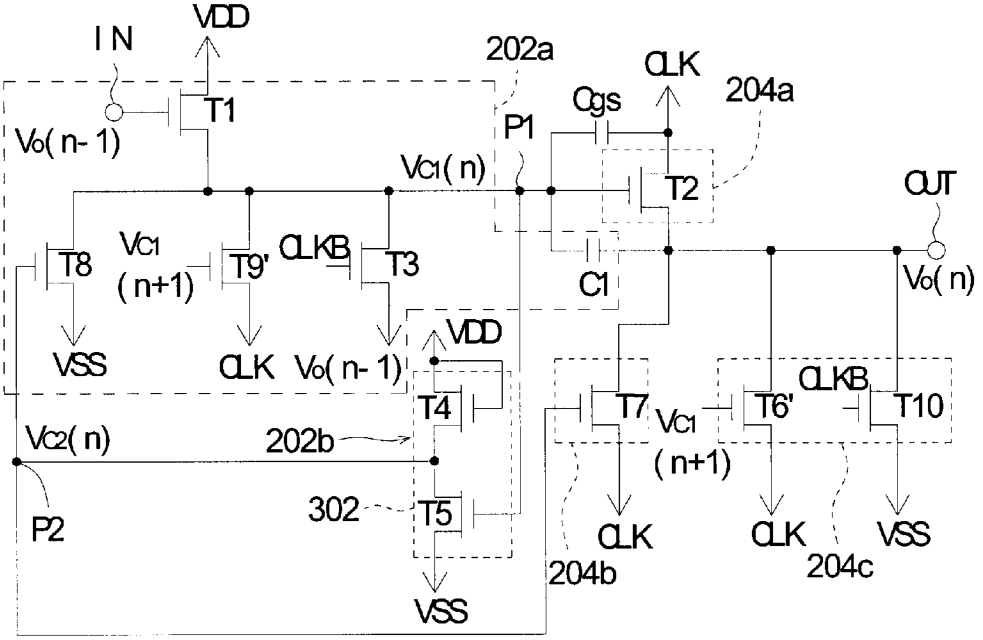
FIG. 35 is a detailed circuit diagram showing the fourth circuit implementation of the shift register unit X(n) of FIG. 31.
Figure 36:
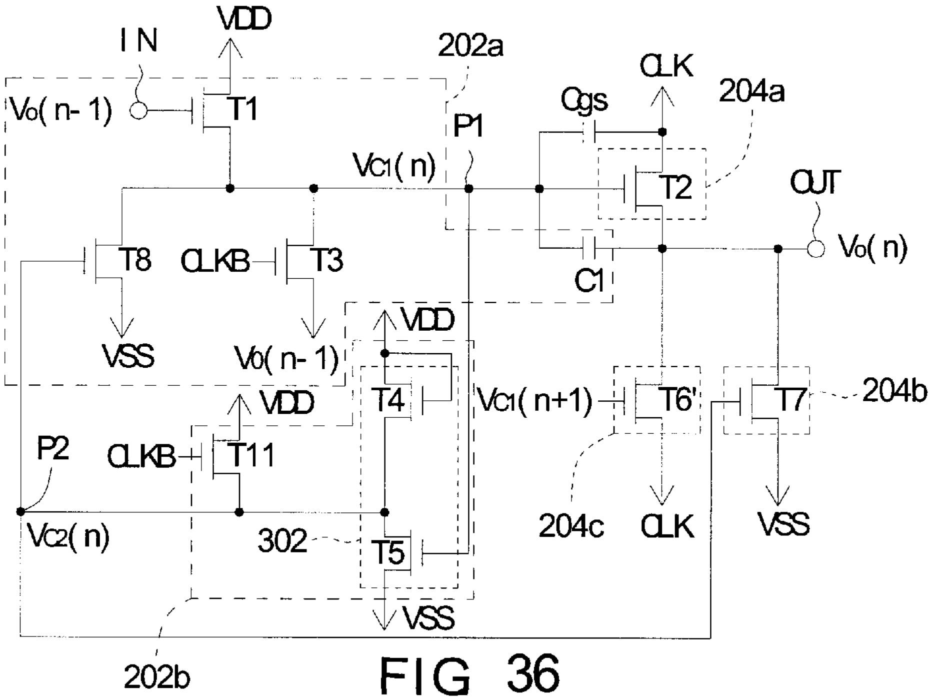
FIG. 36 is a detailed circuit diagram showing the fifth circuit implementation of the shift register unit X(n) of FIG. 31.
Figure 37:
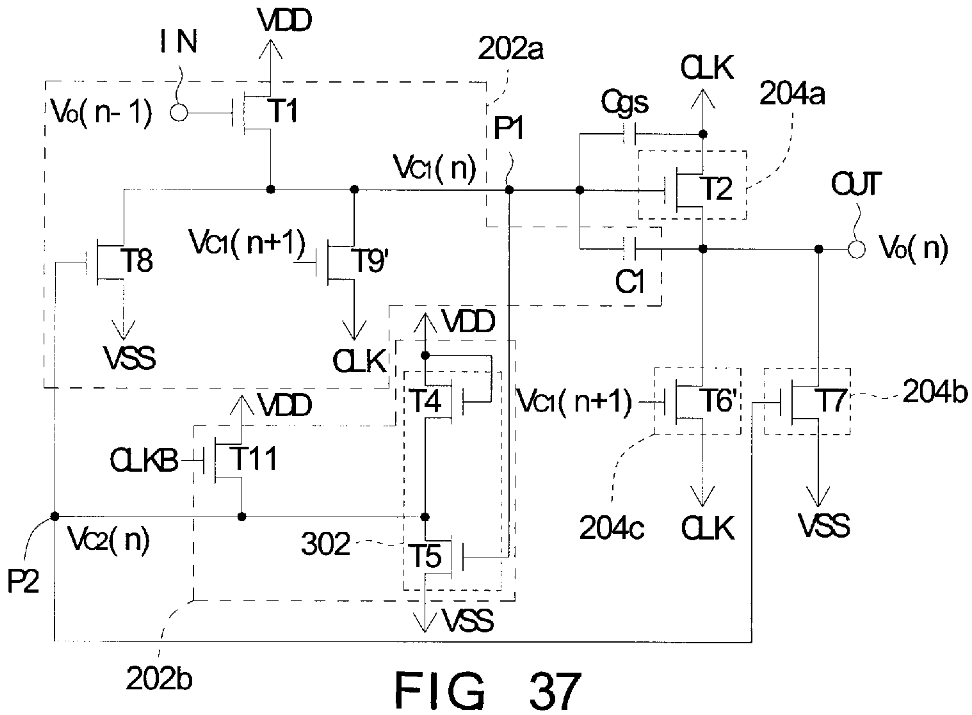
FIG. 37 is a detailed circuit diagram showing the sixth circuit implementation of the shift register unit X(n) of FIG. 31.
Figure 38:
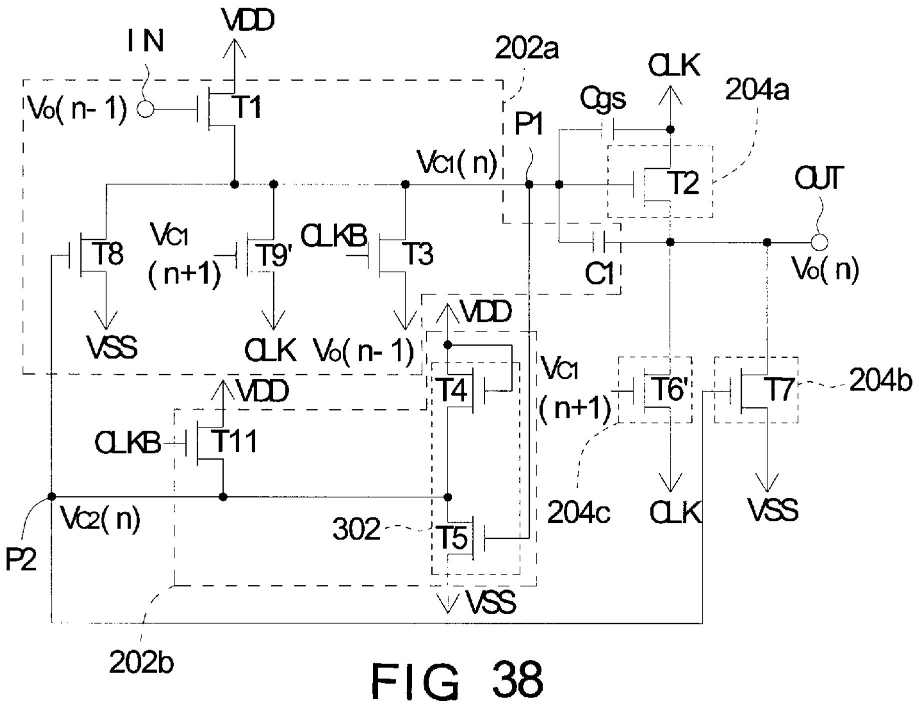
FIG. 38 is a detailed circuit diagram showing the seventh circuit implementation of the shift register unit X(n) of FIG. 31.
Figure 39:
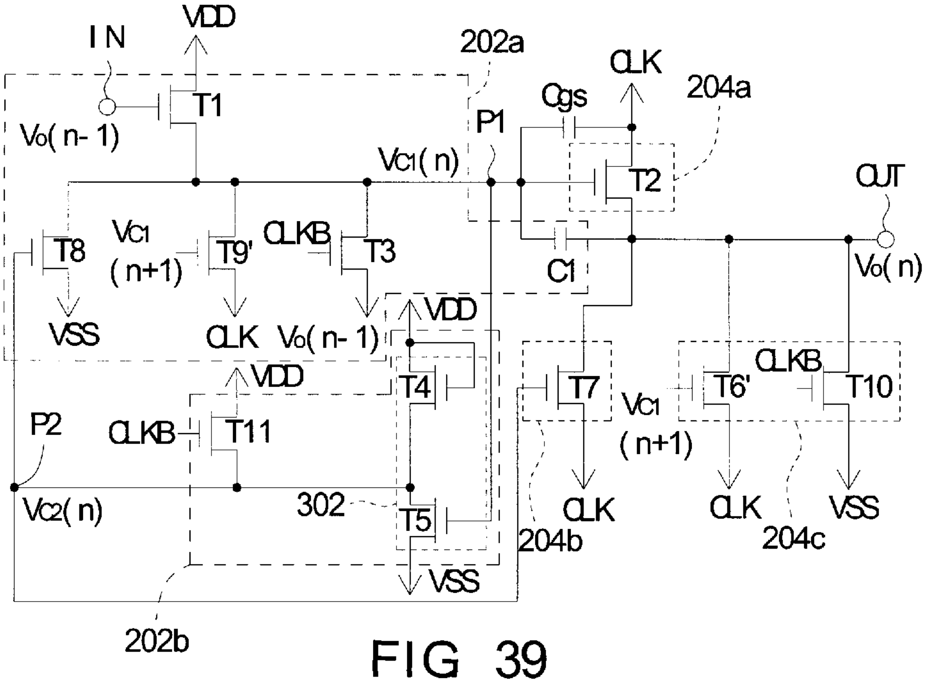
FIG. 39 is a detailed circuit diagram showing the eighth circuit implementation of the shift register unit X(n) of FIG. 31.

FIG. 33 is a detailed circuit diagram showing the second circuit implementation of the shift register unit X(n) of FIG. 31. As shown in FIG. 33, the shift register unit X(n) of this implementation differs from the shift register unit S(n) of FIG. 32 in that the driving unit 202*a* has the transistor T9' to replace the transistor T3.

The transistor T9' has a drain coupled to the node P1, a gate for receiving the control signal Vc1(*n*+1) of the $(n+1)^{th}$ shift register unit X(n+1) and a source for receiving the clock signal CLK. The transistor T9' provides the clock signal CLK to the node P1 to make the control signal Vc1(*n*) be equal to the clock signal CLK when the level of the control signal Vc1(*n*+1) is higher than the level of the clock signal CLK.

In the time periods TP1 and TP2, the control signals Vc1(*n*+1) are respectively equal to the voltage VSS and the voltage (VDD−Vth), and the clock signals CLK are respectively equal to the voltage VSS and the voltage VDD. Thus, the transistor T9' turns off in the time periods TP1 and TP2. In the time period TP3, the control signal Vc1(*n*+1) is further increased by a difference voltage ΔV relative to the level thereof in the time period TP2, and the clock signal CLK is equal to the voltage VSS. Consequently, the transistor T9' turns on in the time period TP3 to provide the low voltage level of the clock signal CLK to the node P1 and thus to make the output signal Vo(n) be equal to the voltage VSS.

In the $n^{th}$ shift register unit X(n) of this implementation, the transistor T9 is replaced with the transistor T9'. However, the transistor T9' and the transistor T3 have the substantially similar effect to make the control signal Vc1(*n*) be equal to the voltage VSS in the time period TP3. Consequently, the $n^{th}$ shift register unit of this implementation also advantageously has the lower output load and the longer lifetime, and the LCD applying the $n^{th}$ shift register unit of this implementation further has the advantage of the better quality of the displayed frame.

FIGS. 34 to 39 are detailed circuit diagrams showing the third to eighth circuit implementations of the shift register unit X(n) of FIG. 31. As shown in FIGS. 34 to 39, the shift register units X(n) of the third to eighth implementations are respectively induced based on the shift register units S(n) of FIGS. 5 to 10. The difference therebetween is that the transistors T6 and T9 of the shift register unit S(n) are respectively replaced with the transistors T6' and T9' in the shift register units X(n) of the third to eighth implementations. Thus, the operations and effects of the shift register units of the third to eighth implementations may be derived according to the descriptions associated with the first and second implementations.

Second Implemented Architecture

Figure 40:
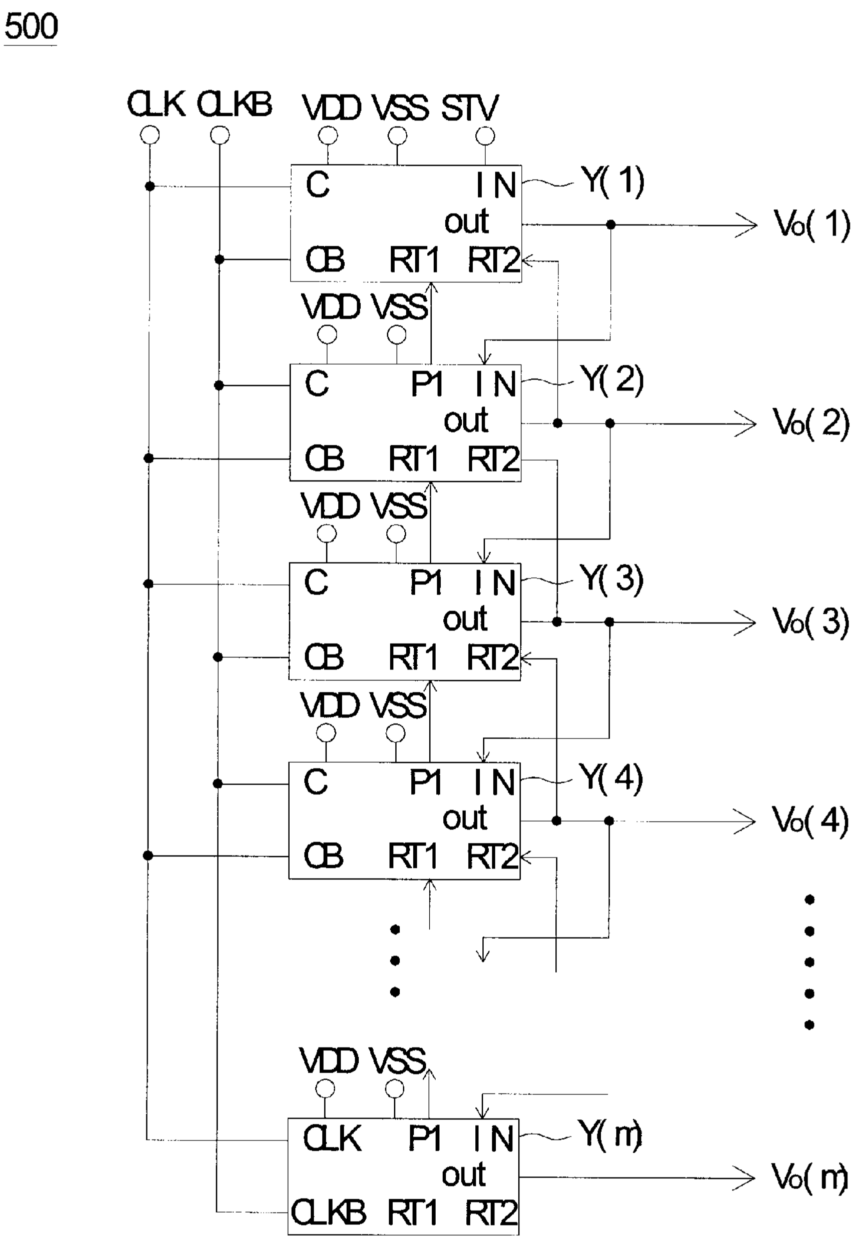
FIG. 40 is a block diagram showing a shift register of a second implemented structure according to the third embodiment of the invention.
Figure 41:
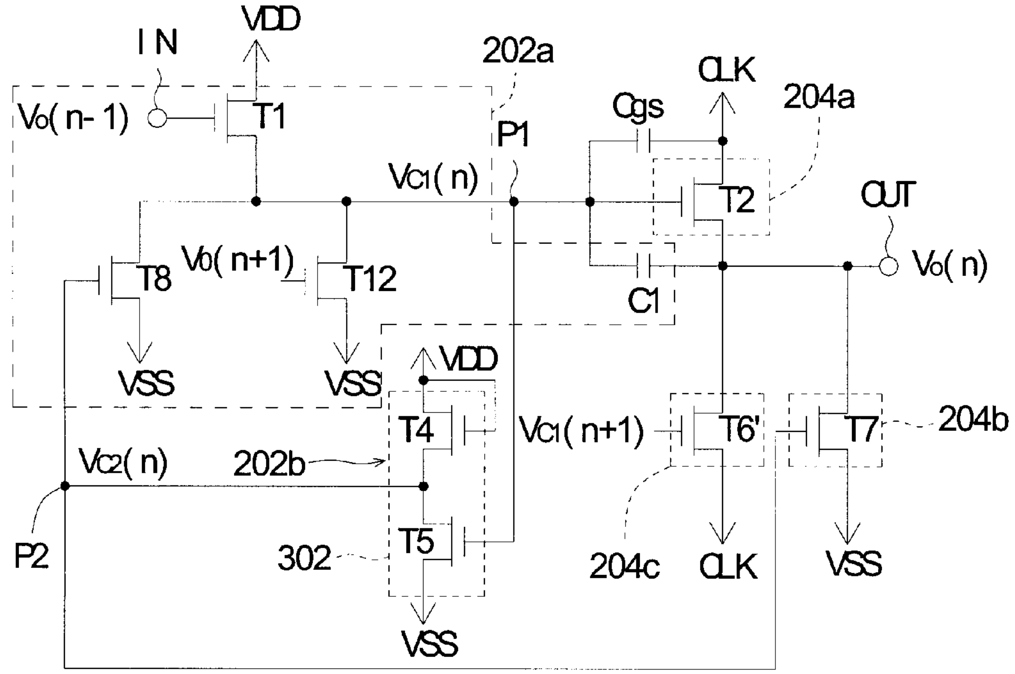
FIG. 41 is a detailed circuit diagram showing the first circuit implementation of a shift register unit Y(n) of FIG. 40.
Figure 42:
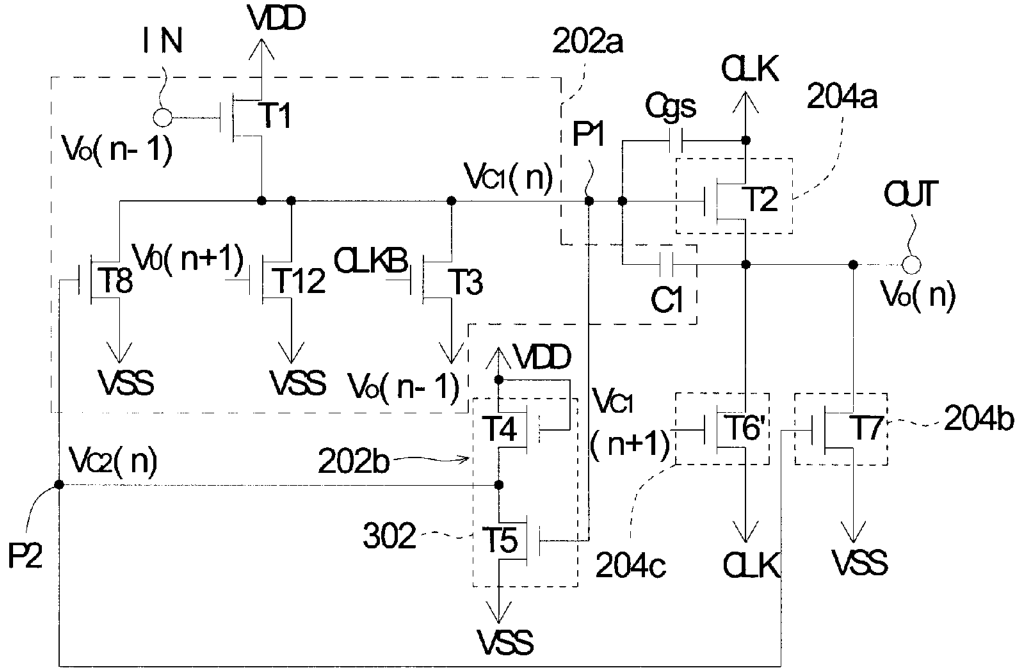
FIG. 42 is a detailed circuit diagram showing the second circuit implementation of the shift register unit Y(n) of FIG. 40.
Figure 43:
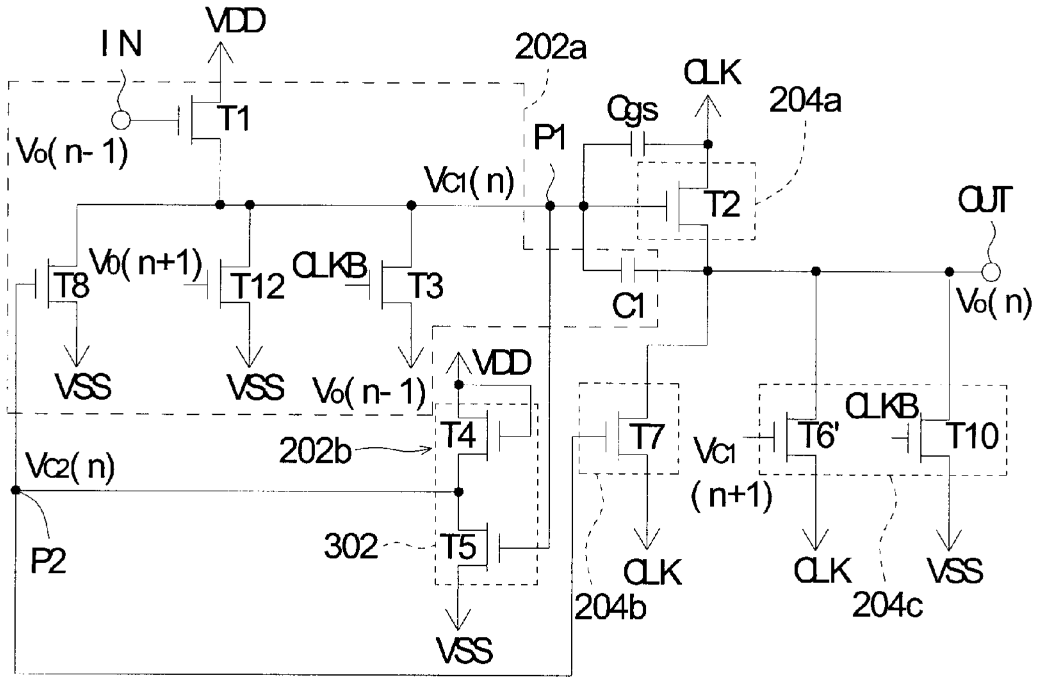
FIG. 43 is a detailed circuit diagram showing the third circuit implementation of the shift register unit Y(n) of FIG. 40.
Figure 44:
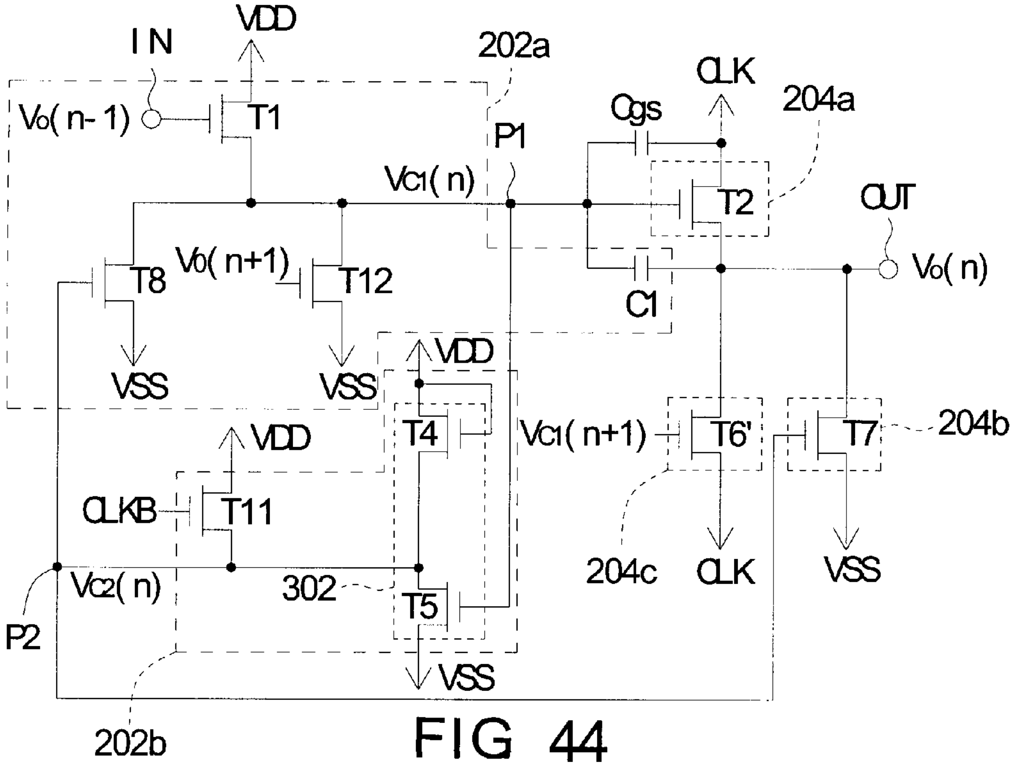
FIG. 44 is a detailed circuit diagram showing the fourth circuit implementation of the shift register unit Y(n) of FIG. 40.
Figure 45:
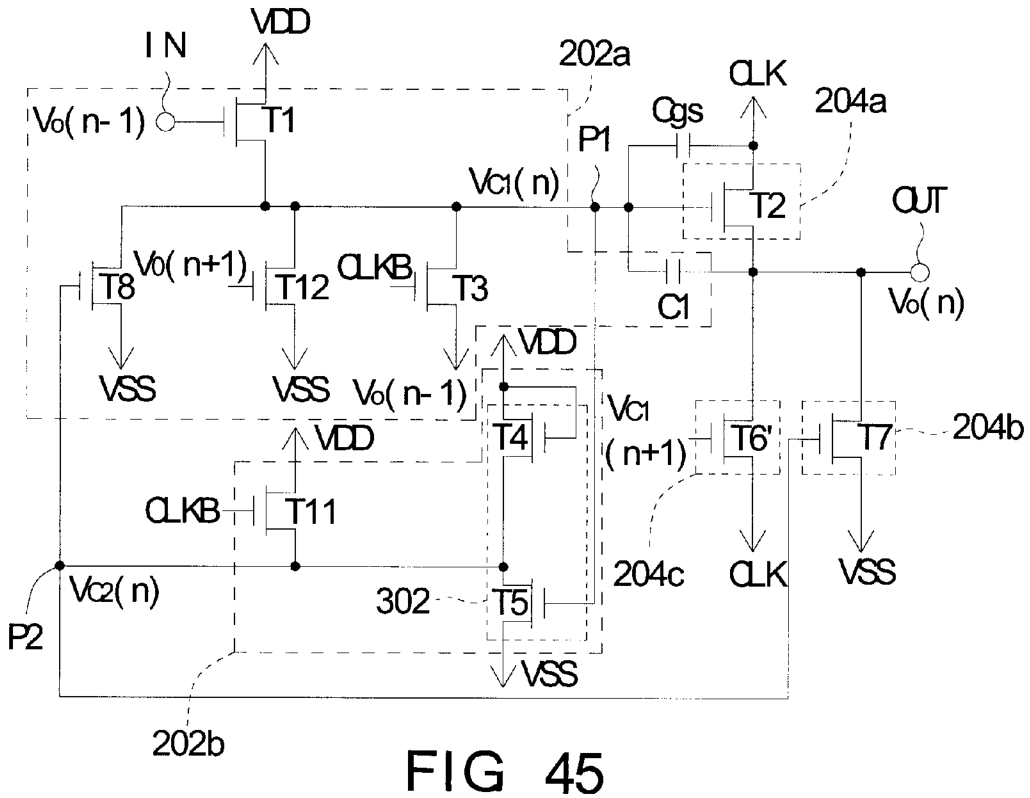
FIG. 45 is a detailed circuit diagram showing the fifth circuit implementation of the shift register unit Y(n) of FIG. 40.
Figure 46:
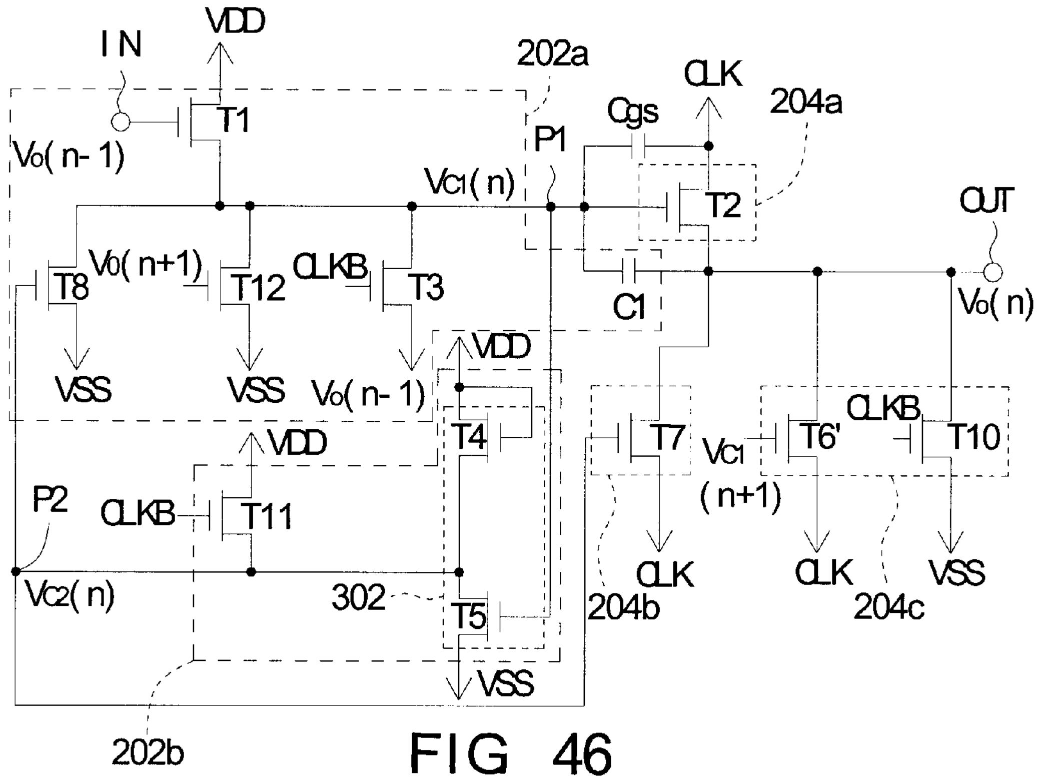
FIG. 46 is a detailed circuit diagram showing the sixth circuit implementation of the shift register unit Y(n) of FIG. 40.

FIG. 40 is a block diagram showing a shift register 500 of a second implemented structure according to the third embodiment of the invention. As shown in FIG. 40, the shift register 500 differs from the shift register 200 of the second implemented structure of the first embodiment in that the control terminals RT1 of the shift register units Y(1) to Y(m−2) respectively receive the control signals Vc1(2) to Vc1(*m*−1) on the nodes P1 of the shift register units Y(2) to Y(m−1), and the control terminals RT2 of the shift register units Y(1) to Y(m−1) respectively receive the output signals Vo(2) to Vo(m) of the next shift register units Y(2) to Y(m). Next, various circuit implementations of the shift register unit Y(n) of this embodiment will be described by taking the structure of the $n^{th}$ shift register unit Y(n) in the shift register units Y(1) to Y(m) as an example, wherein n is a natural number.

FIGS. 41 to 46 are detailed circuit diagrams showing the first to sixth circuit implementations of a shift register unit Y(n) of FIG. 40. As shown in FIGS. 41 to 46, the shift register units Y(n) of the first to sixth implementations are respectively induced based on the shift register units S(n) of FIGS. 13 to 18. The difference therebetween is that the transistor T6 of the shift register unit S(n) are respectively replaced with the transistor T6' in the shift register units Y(n) of the first to sixth implementations. Thus, the operations and effects of the shift register units of the first to sixth implementations may be derived according to the descriptions associated with the first and second implementations.

Fourth Embodiment

The shift register of this embodiment differs from the shift register of the second embodiment in that the first driving unit of the $n^{th}$ shift register unit turns off the first level control unit when the level of the first control signal of the $(n+1)^{th}$ shift register unit is higher than the level of the first clock signal, wherein n is a natural number. Next, the detailed operations of the $n^{th}$ shift register unit will be described with reference to several implemented structures.

First Implemented Architecture

The shift register of this implemented structure is substantially the same as the shift register of the first implemented structure of the third embodiment illustrated in FIG. 31, and detailed descriptions thereof may be found hereinabove.

Figure 47:
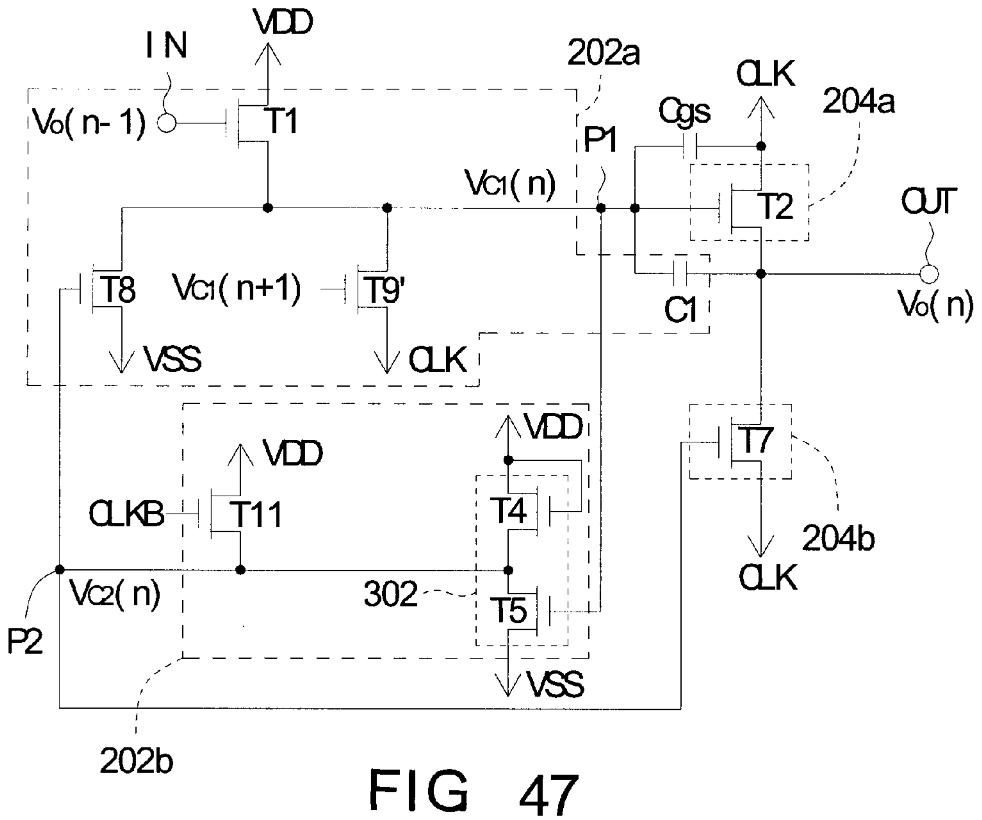
FIG. 47 is a detailed circuit diagram showing the ninth circuit implementation of the shift register unit X(n) of FIG. 31.
Figure 48:
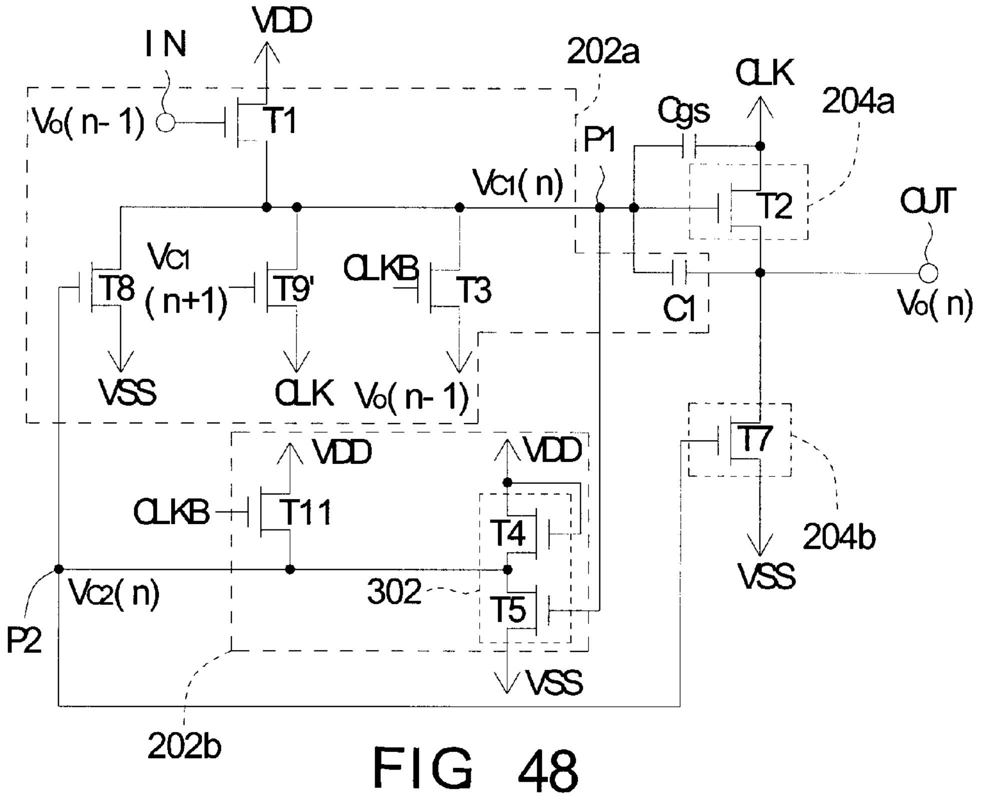
FIG. 48 is a detailed circuit diagram showing the tenth circuit implementation of the shift register unit X(n) of FIG. 31.
Figure 49:
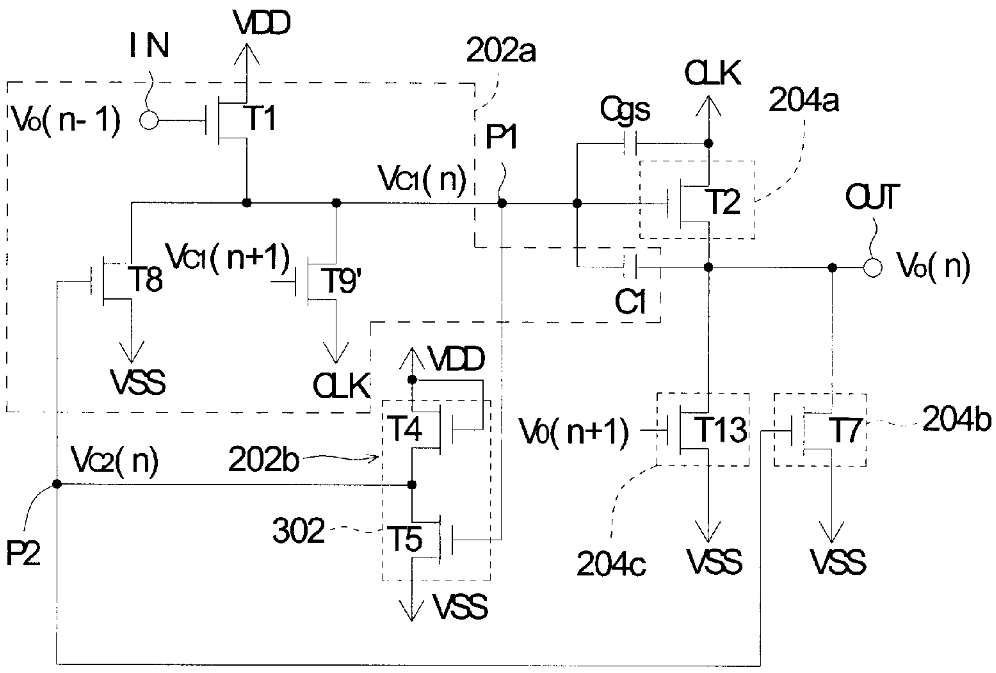
FIG. 49 is a detailed circuit diagram showing the seventh circuit implementation of the shift register unit Y(n) of FIG. 31.
Figure 50:
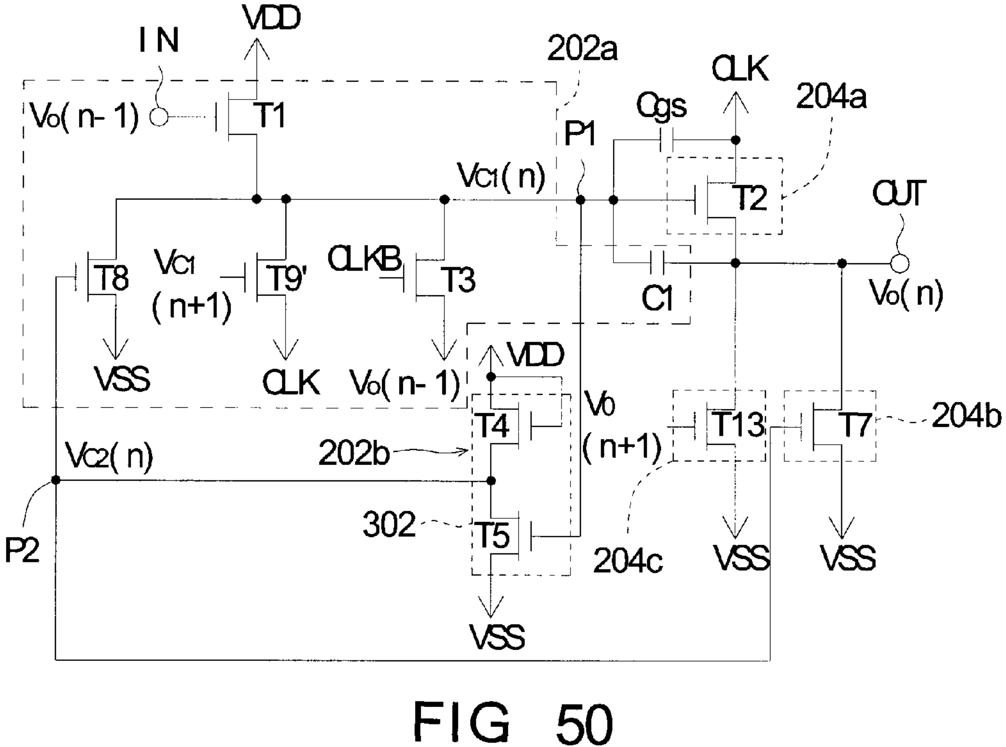
FIG. 50 is a detailed circuit diagram showing the eighth circuit implementation of the shift register unit Y(n) of FIG. 31.
Figure 51:
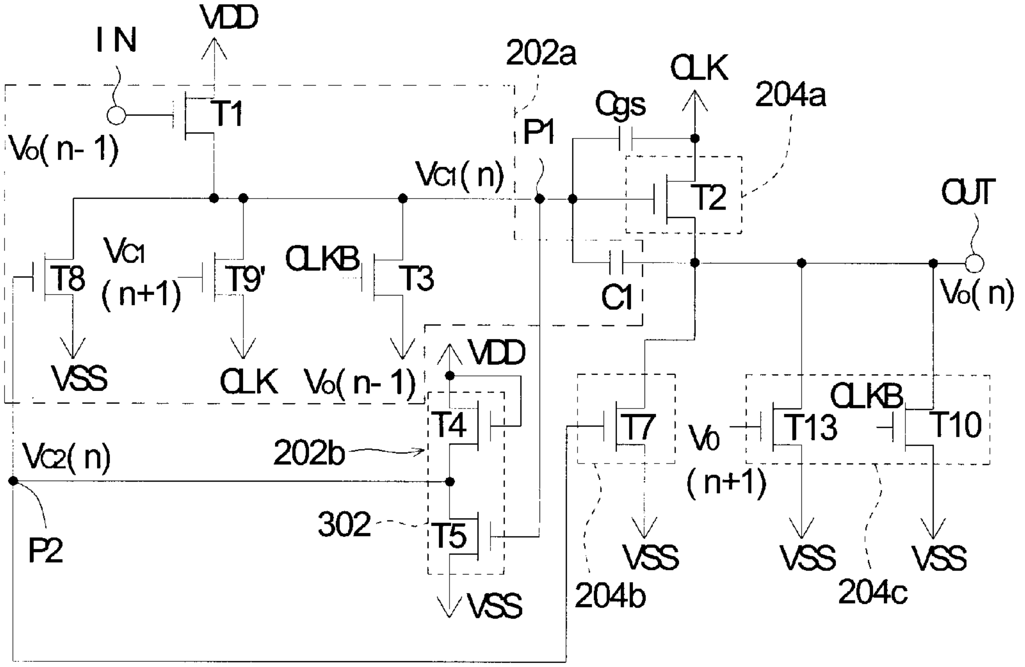
FIG. 51 is a detailed circuit diagram showing the ninth circuit implementation of the shift register unit Y(n) of FIG. 31.
Figure 52:
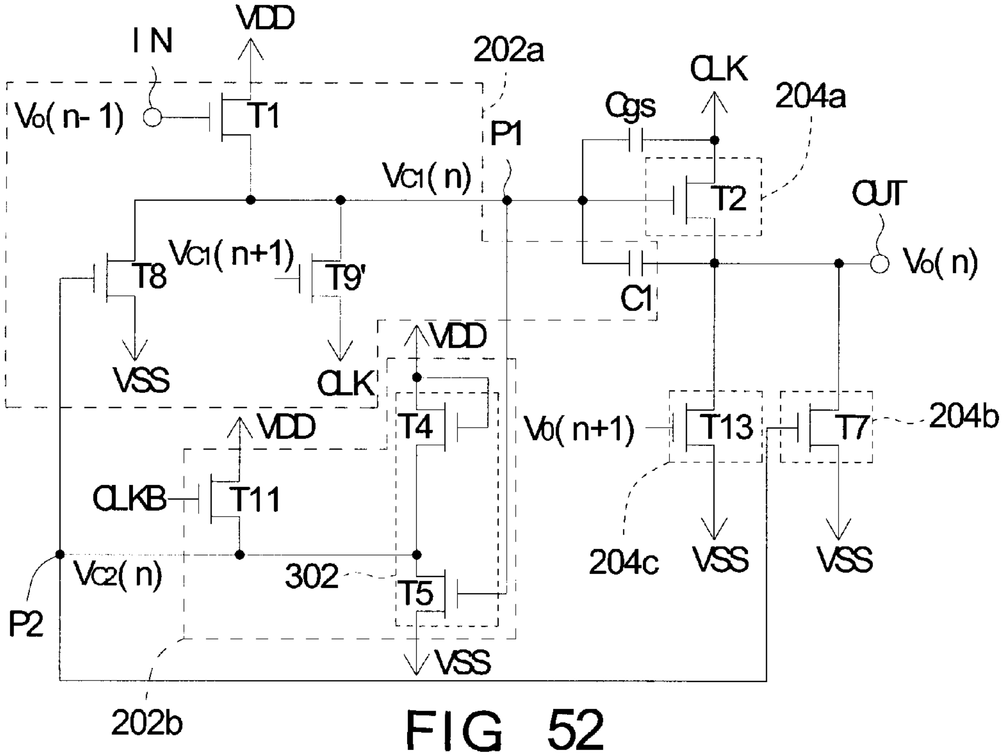
FIG. 52 is a detailed circuit diagram showing the tenth circuit implementation of the shift register unit Y(n) of FIG. 31.
Figure 53:
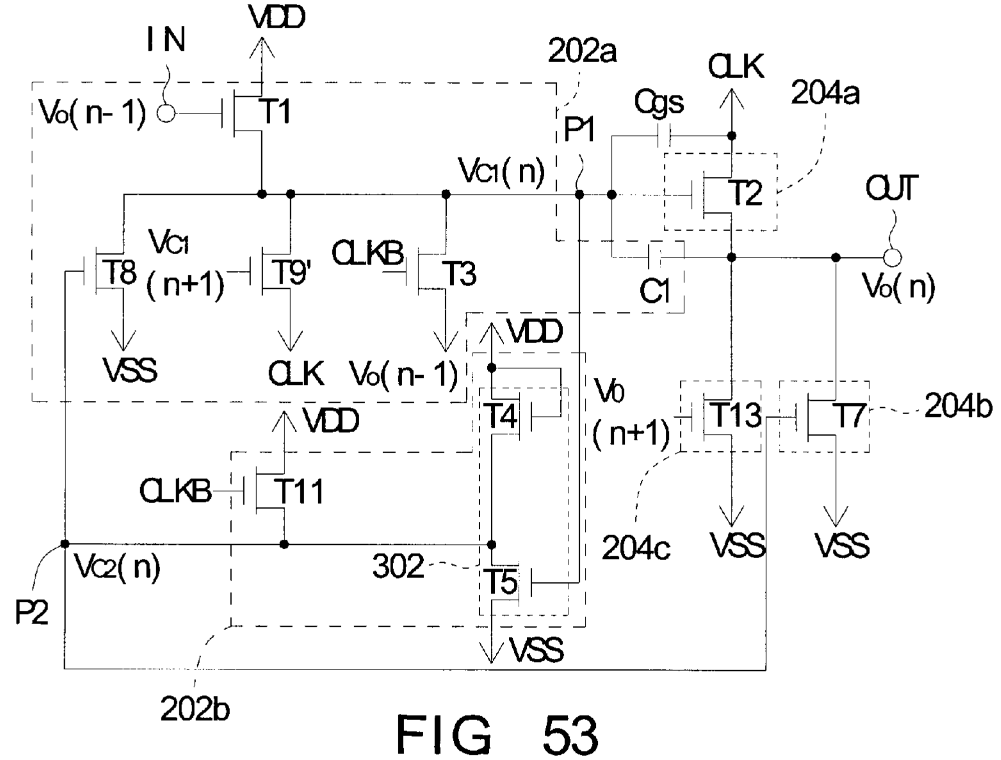
FIG. 53 is a detailed circuit diagram showing the eleventh circuit implementation of the shift register unit Y(n) of FIG. 31.
Figure 54:
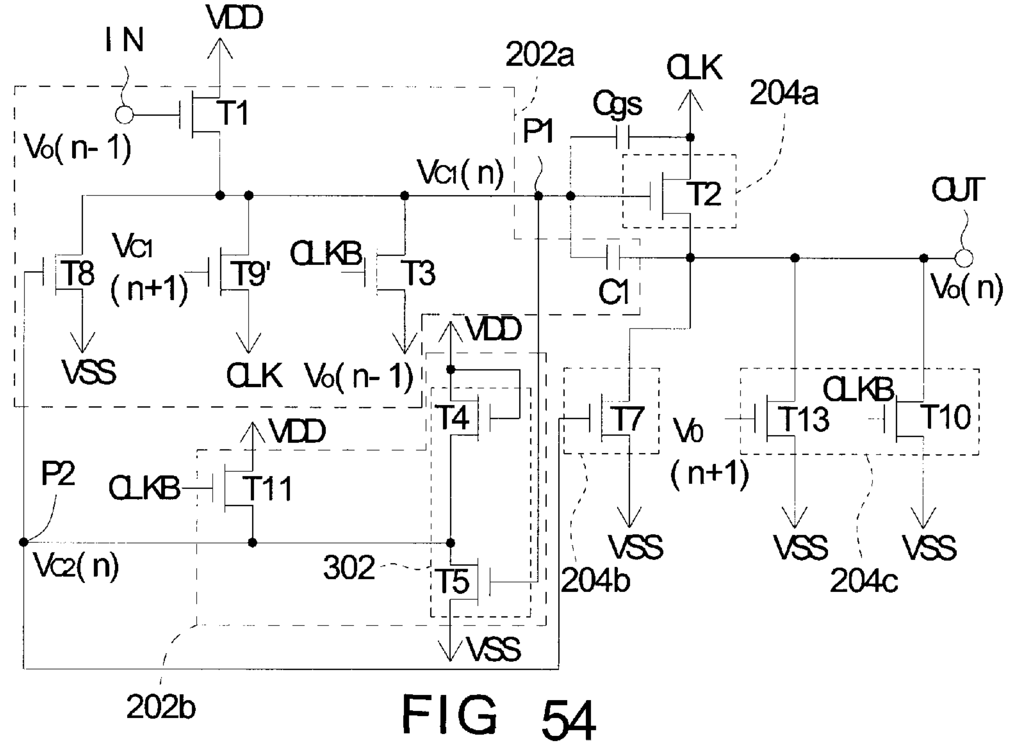
FIG. 54 is a detailed circuit diagram showing the twelfth circuit implementation of the shift register unit Y(n) of FIG. 31.

FIGS. 47 and 48 are detailed circuit diagrams showing the ninth and tenth circuit implementations of the shift register unit X(n) of FIG. 31. As show in FIGS. 47 and 48, the shift register units X(n) of the ninth and tenth implementations are induced based on the shift register units S(n) of FIGS. 19 and 20. The difference therebetween is that the transistor T9 of the shift register unit S(n) are respectively replaced with the transistor T9' in the shift register units X(n) of the ninth and tenth implementations. Thus, the operations and effects of the shift register units of the ninth and tenth implementations may be derived according to the descriptions associated with the second implementation of the shift register in the first implemented architecture of the third embodiment.

Second Implemented Architecture

The shift register of this implemented structure is substantially the same as the shift register of the second implemented structure of the third embodiment of FIG. 40, and detailed descriptions thereof may be found hereinabove.

FIGS. 49 to 54 are detailed circuit diagrams showing the seventh to twelfth circuit implementations of the shift register unit Y(n) of FIG. 31. As shown in FIGS. 49 to 54, the shift register units Y(n) of the seventh to twelfth implementations are induced based on the shift register units U(n) of FIGS. 21 to 26. The difference therebetween is that the transistor T9 of the shift register unit U(n) are respectively replaced with the transistor T9' in the shift register units Y(n) of the seventh to twelfth implementations. Thus, the operations and effects of the shift register units of the seventh to twelfth implementations may be derived according to the descriptions associated with the second implementation of the shift register in the first implemented architecture of the third embodiment.

Third Implemented Architecture

The shift register of this implemented structure is substantially the same as the shift register of the third implemented structure of the second embodiment illustrated in FIG. 27, and detailed descriptions thereof may be found hereinabove.

Figure 55:
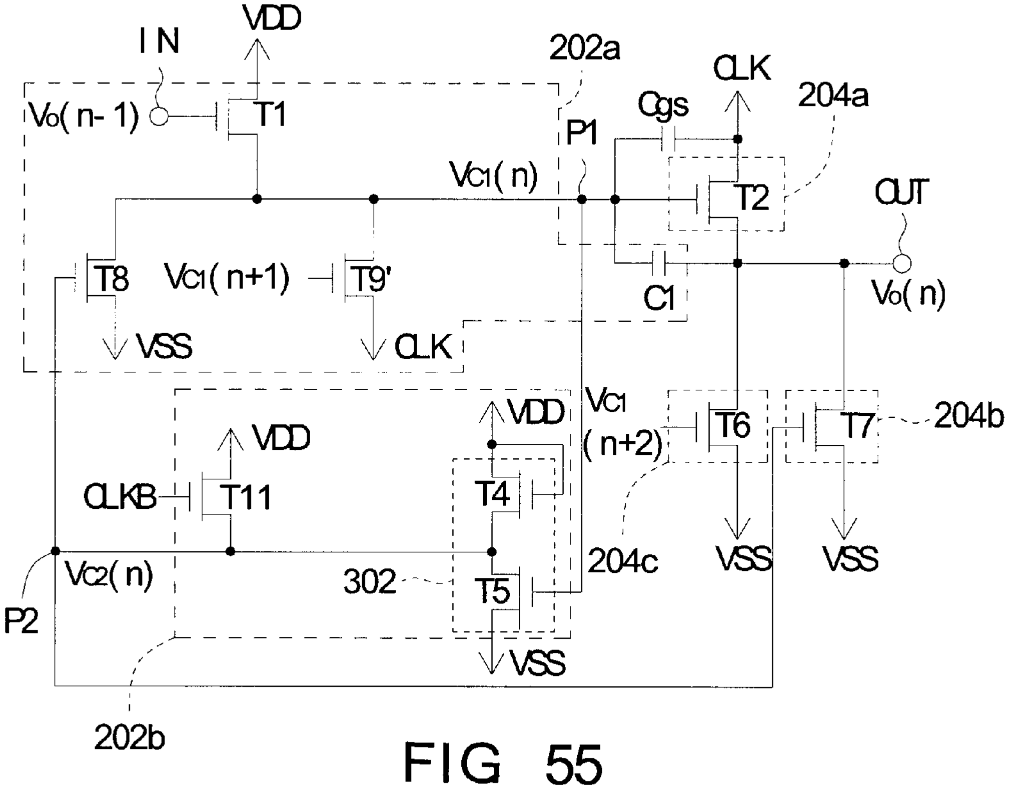
FIG. 55 is a detailed circuit diagram showing the fourth circuit implementation of the shift register unit W(n) of FIG. 27.
Figure 56:
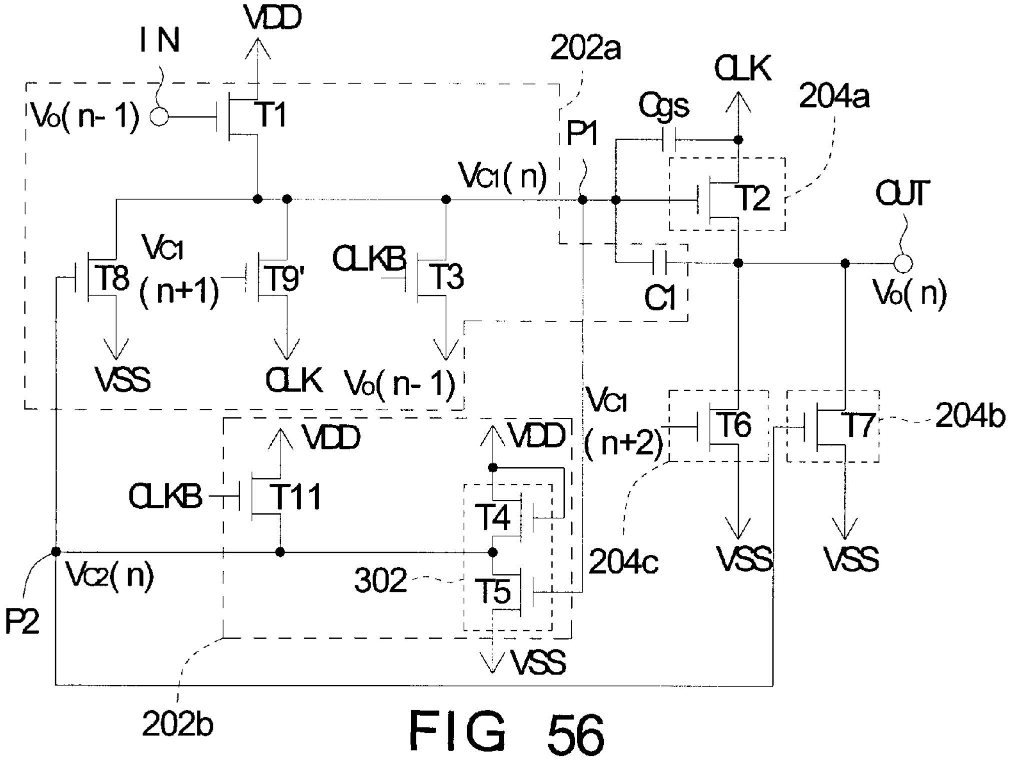
FIG. 56 is a detailed circuit diagram showing the fifth circuit implementation of the shift register unit W(n) of FIG. 27.
Figure 57:
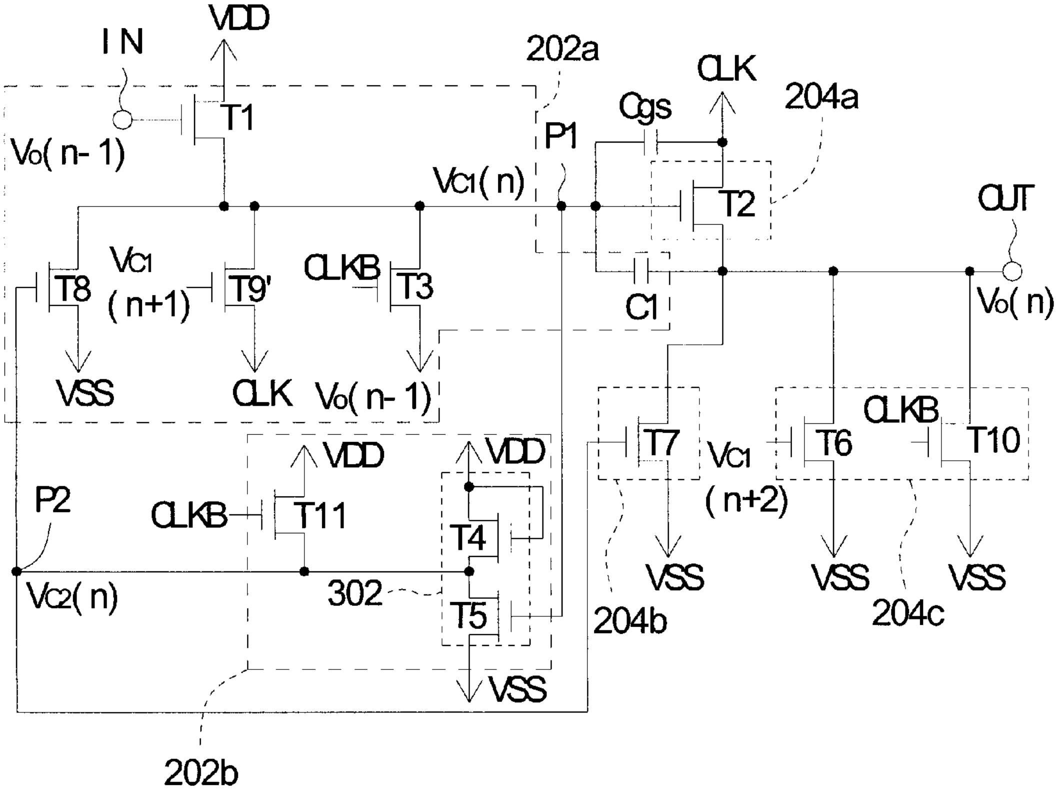
FIG. 57 is a detailed circuit diagram showing the sixth circuit implementation of the shift register unit W(n) of FIG. 27.

FIGS. 55 to 57 are detailed circuit diagrams showing the fourth to sixth circuit implementations of the shift register unit W(n) of FIG. 27. As shown in FIGS. 55 to 57, the shift register units of the fourth to sixth implementations are respectively induced based on the shift register units of FIGS. 28 to 30. The difference therebetween is that the transistors T9 and T6' of the shift register unit U(n) of FIGS. 28 to 30 are respectively replaced with the transistors T9' and T6 in the shift register units of the fourth to sixth implementations. Thus, the operations and effects of the shift register units of the fourth to sixth implementations may be derived according to the descriptions associated with the second implementation of the shift register in the first implemented architecture of the third embodiment.

Figure 58A:
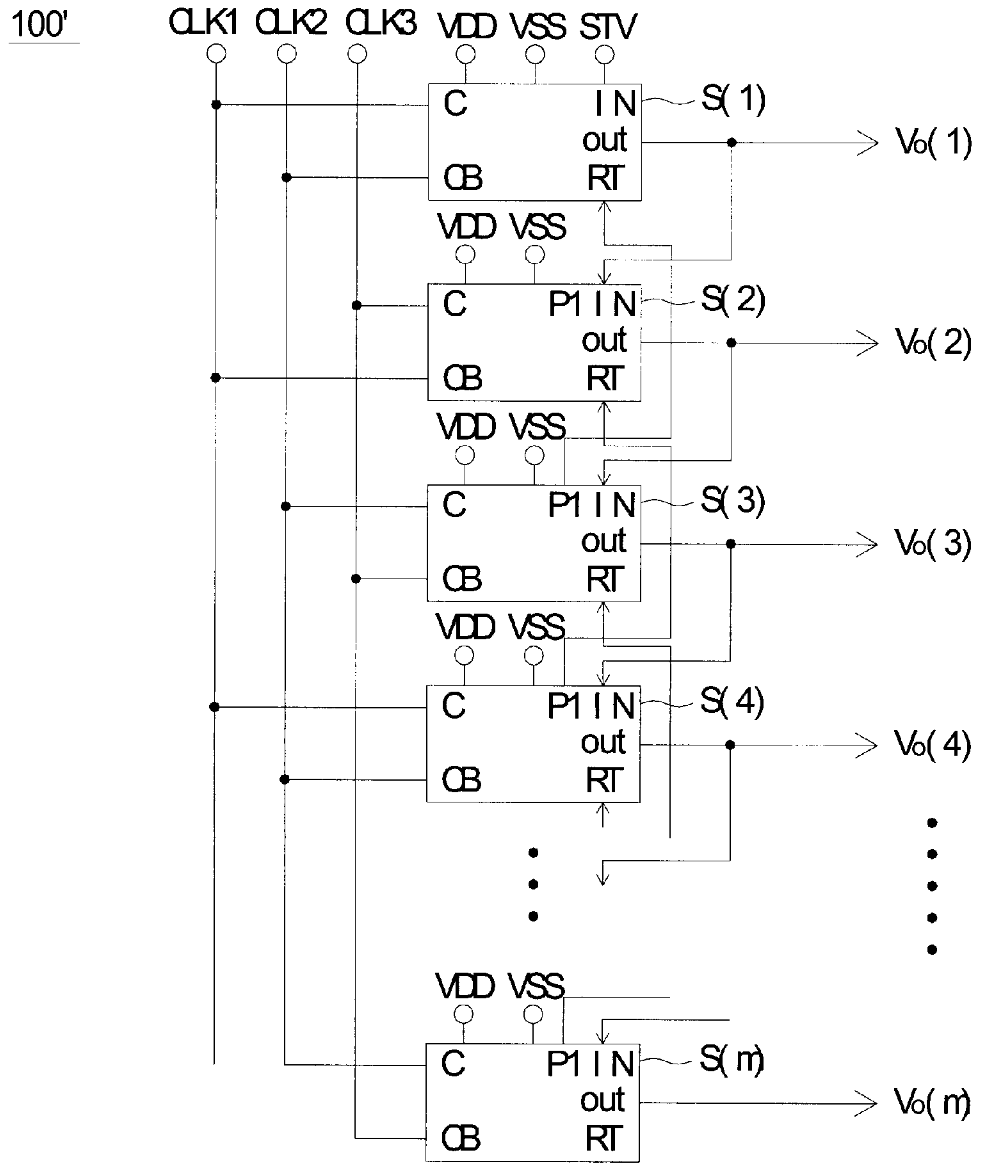
FIGS. 58A and 58B are respectively a block diagram showing the shift register of the first implemented structure according to the first embodiment using three clock signals, and a diagram showing waveforms of the clock signals.
Figure 58B:
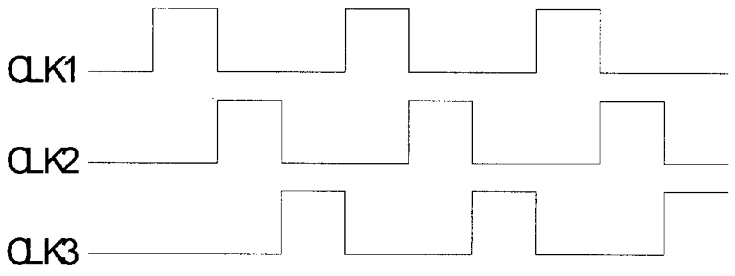
Figure 59A:
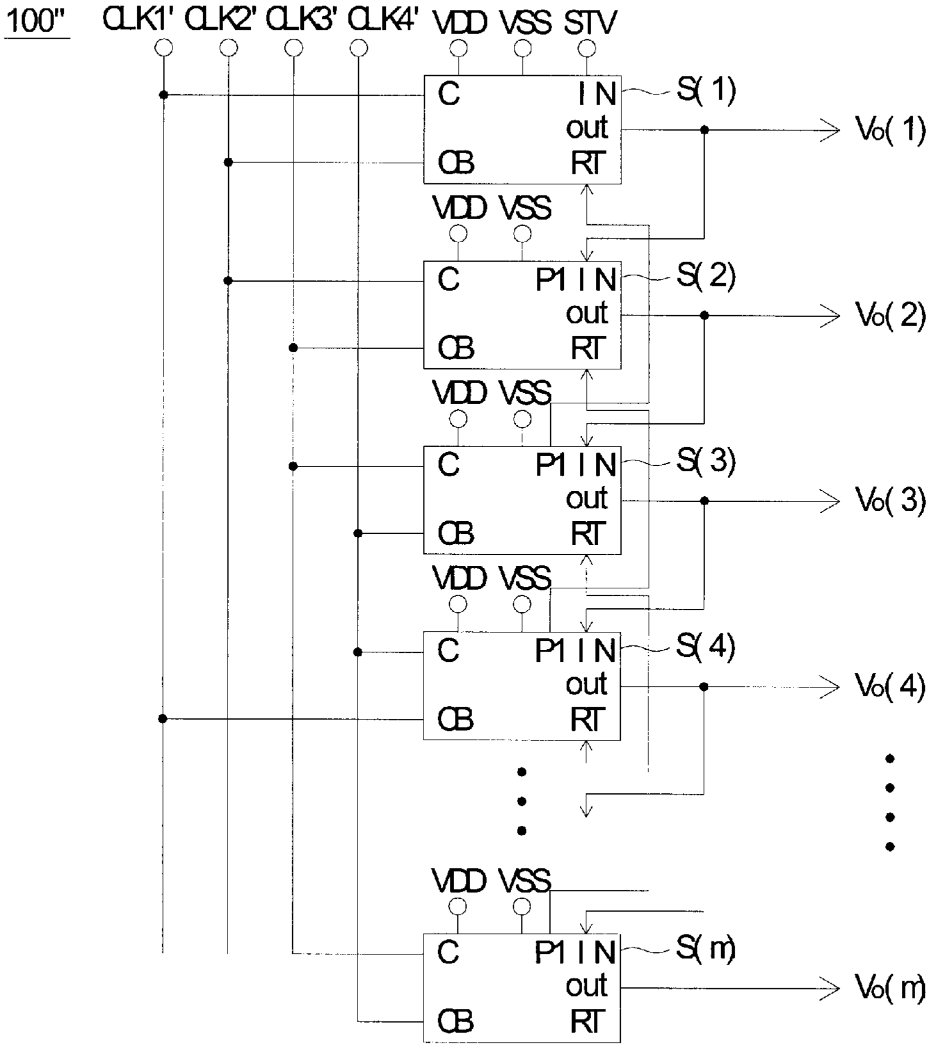
FIGS. 59A and 59B are respectively a block diagram showing the shift register of the first implemented structure according to the first embodiment using four clock signals, and a diagram showing waveforms of the clock signals.
Figure 59B:
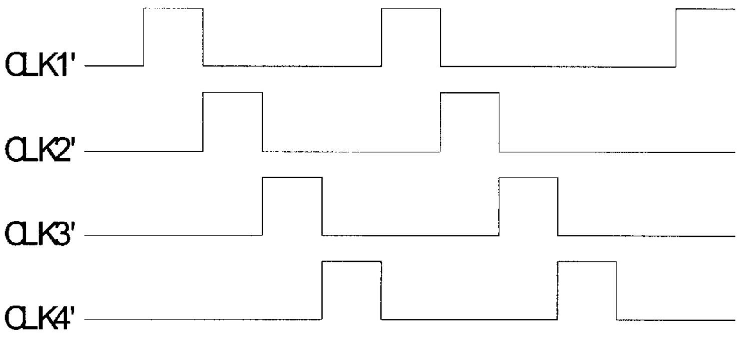

In the embodiments mentioned hereinabove, the shift registers 100, 200, 300, 400 and 500 operate in response to the clock signals CLK and CLKB with the two staggered enabling times. However, the shift registers 100 to 500 may also adopt three or more than three clock signals to control each of the shift register units S(n), U(n), W(n), X(n) and Y(n), as shown in FIGS. 58A, 58B, 59A and 59B. FIGS. 58A and 58B are respectively a block diagram showing the shift register of the first implemented structure according to the first embodiment using three clock signals, and a diagram showing waveforms of the clock signals. FIGS. 59A and 59B are respectively a block diagram showing the shift register of the first implemented structure according to the first embodiment using four clock signals, and a diagram showing waveforms of the clock signals.

As mentioned hereinabove, the operations substantially similar to those of the embodiments mentioned hereinabove may be achieved without departing from the technological scope of the invention as long as the enabling times of the clock signals received by the clock terminals C of any two neighboring shift register units are staggered, and the enabling times of the clock signals received by the clock terminal C of the $(n+1)^{th}$ shift register unit and the clock terminal CB of the $n^{th}$ shift register unit are staggered in the shift registers 100 to 500. It is to be noted that n is a natural number smaller than or equal to m.

The shift register according to each embodiment of the invention includes multiple shift register units each having a circuit node. The $n^{th}$ shift register unit in the shift register of the invention inputs the voltage signal, which exists on the circuit node of one of the $(n+1)^{th}$ and $(n+2)^{th}$ shift register units, to the shift register to control the operation thereof. Thus, the shift register according to the embodiment of the invention has the advantage of the lower output load and the advantage that the output signal cannot be easily distorted. Thus, the LCD using the shift register according to the embodiment of the invention has the better quality of the displayed frame.

The shift register according to one of the embodiments of the invention further has two level control units to decrease the signal level of the output signal to the disabled voltage. Thus, when the threshold voltage of the transistor in one of the level control units is increased due to the influence of the stress effect to cause the abnormal operation, the shift register according to the embodiment of the invention may decrease the output signal to the grounding voltage using the other level control unit so that the shift register does not generate the malfunction. Consequently, the shift register according to the embodiment of the invention may further advantageously lengthen the lifetime of the shift register unit.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A shift register having multiple serially connected shift register units, wherein an $n^{th}$ shift register unit of the shift register units outputs an output signal, which is an input signal of an $(n+1)^{th}$ shift register unit of the shift register units, and n is a natural number, the $n^{th}$ shift register unit comprising:

a first level control unit for providing a first clock signal to an output terminal;

a first driving unit, wherein the first driving unit and an input terminal of the first level control unit are coupled to a first node, a voltage on the first node is a first control signal, the first driving unit turns on the first level control unit in response to a front edge of the input signal, and turns off the first level control unit when a level of a second control signal is higher than a level of a third control signal;

a second level control unit for providing a first voltage to the output terminal;

a second driving unit for turning off the second level control unit in response to a front edge of the first control signal, and turning on the second level control unit in response to a rear edge of the first control signal; and a third level control unit for providing the first voltage to the output terminal in response to the front edge of the first control signal of an $(n+2)^{th}$ shift register unit of the shift register units.

2. The shift register according to claim 1, wherein the third level control unit comprises a first transistor having a gate for receiving the first control signal of the $(n+2)^{th}$ shift register unit, a first source/drain coupled to the output terminal, and a second source/drain for receiving the first voltage, and the first transistor provides the first voltage to the output terminal in response to the front edge of the first control signal of the $(n+2)^{th}$ shift register unit.

3. The shift register according to claim 2, wherein the third level control unit further comprises a second transistor having a gate for receiving a second clock signal, a first source/drain coupled to the output terminal, and a second source/drain for receiving the first voltage, and the second transistor provides the first voltage to the output terminal in response to a rising edge of the second clock signal, wherein an enabling time of the second clock signal and an enabling time of the first clock signal are staggered.

4. The shift register according to claim 1, wherein the first driving unit comprises a third transistor having a gate for receiving the second control signal, a first source/drain coupled to the first node, and a second source/drain for receiving the third control signal.

5. The shift register according to claim 4, wherein the second and third control signals are respectively the first control signal of the $(n+2)^{th}$ shift register unit and the first voltage.

6. The shift register according to claim 5, wherein the first driving unit further comprises a fourth transistor having a gate for receiving a second clock signal, a first source/drain coupled to the first node and a second source/drain for receiving the input signal.

7. The shift register according to claim 4, wherein the second and third control signals are respectively the first control signal of the $(n+1)^{th}$ shift register unit and the first clock signal.

8. The shift register according to claim 7, wherein the first driving unit further comprises a fourth transistor having a gate for receiving a second clock signal, a first source/drain coupled to the first node and a second source/drain for receiving the input signal.

9. The shift register according to claim 4, wherein the second and third control signals are respectively a second clock signal and the input signal.

10. The shift register according to claim 9, wherein the first driving unit further comprises a fifth transistor having a gate for receiving the output signal of the $(n+1)^{th}$ shift register unit, a first source/drain coupled to the first node and a second source/drain for receiving the first voltage.

11. The shift register according to claim 4, wherein the second and third control signals are respectively the output signal of the $(n+1)^{th}$ shift register unit and the first voltage.

12. The shift register according to claim 1, wherein the first driving unit further comprises a sixth transistor having a gate for receiving the input signal, a first source/drain for receiving a second voltage and a second source/drain coupled to the first node.

13. The shift register according to claim 1, wherein the second driving unit comprises a bias unit, the bias unit and the input terminal of the second level control unit are coupled to a second node, a voltage on the second node is a fourth control signal, and the bias unit controls a level of the fourth control signal to turn off the second level control unit in response to the front edge of the first control signal and controls the level of the fourth control signal to turn on the second level control unit in response to the rear edge of the first control signal.

14. The shift register according to claim 13, wherein the second driving unit further comprises:

a seventh transistor having a gate for receiving a second clock signal, a first source/drain for receiving a second voltage and a second source/drain for receiving the fourth control signal.

15. The shift register according to claim 1, wherein the first level control unit comprises an eighth transistor having a gate for receiving the first control signal, a first source/drain for receiving the first clock signal, and a second source/drain coupled to the output terminal.

16. The shift register according to claim 1, wherein the second level control unit comprises a ninth transistor having a gate for receiving a fourth control signal, a first source/drain coupled to the output terminal and a second source/drain for receiving the first voltage.

17. The shift register according to claim 1, wherein a first shift register unit of the shift register units receives a starting signal as the input signal.

18. The shift register according to claim 1, wherein:

enabling times of the first clock signal received by any two neighboring shift register units of the shift register units are staggered; and an enabling time of a second clock signal received by the $n^{th}$ shift register unit and an enabling time of the first clock signal received by the $(n+1)^{th}$ shift register unit are also staggered.

19. The shift register according to claim 1, wherein the $(n+1)^{th}$ shift register unit receives a third clock signal and the first clock signal, and enabling times of the third clock signal and the first and second clock signals are staggered.

20. The shift register according to claim 1, wherein the $(n+1)^{th}$ shift register unit receives a third clock signal and a fourth clock signal, and enabling times of the first to fourth clock signals are staggered.

21. A shift register having multiple serially connected shift register units, wherein an $n^{th}$ shift register unit of the shift register units outputs an output signal, which is an input signal of an $(n+1)^{th}$ shift register unit of the shift register units, and n is a natural number, the $n^{th}$ shift register unit comprising:

a first level control unit for providing a first clock signal to an output terminal;

a first driving unit, wherein the first driving unit and an input terminal of the first level control unit are coupled to a first node, a voltage on the first node is a first control signal, the first driving unit turns on the first level control unit in response to a front edge of the input signal and turns off the first level control unit when a level of a second control signal is higher than a level of a third control signal;

a second level control unit for providing a first voltage to the output terminal;

a second driving unit for turning off the second level control unit in response to the front edge of the first control signal, and turning on the second level control unit in response to a rear edge of the first control signal; and a third level control unit for providing a low voltage level of the first clock signal to the output terminal in response to the first control signal of the $(n+1)^{th}$ shift register unit of the shift register units.

22. The shift register according to claim 21, wherein the third level control unit comprises:

a first transistor having a gate for receiving the first control signal of the $(n+1)^{th}$ shift register unit, a first source/drain coupled to the output terminal and a second source/drain for receiving the first clock signal, wherein the first transistor provides the low voltage level of the first clock signal to the output terminal when a level of the first control signal of the $(n+1)^{th}$ shift register unit is higher than a level of the first clock signal.

23. The shift register according to claim 22, wherein the third level control unit further comprises a second transistor having a gate for receiving a second clock signal, a first source/drain coupled to the output terminal and a second source/drain for receiving the first voltage, and the second transistor provides the first voltage to the output terminal in response to a rising edge of the second clock signal;

wherein enabling times of the second clock signal and the first clock signal are staggered.

24. The shift register according to claim 21, wherein the first driving unit comprises a third transistor having a gate for receiving the second control signal, a first source/drain coupled to the first node and a second source/drain for receiving the third control signal.

25. The shift register according to claim 24, wherein the second and third control signals are respectively the first control signal of the $(n+1)^{th}$ shift register unit and the first clock signal.

26. The shift register according to claim 25, wherein the first driving unit further comprises a fourth transistor having a gate for receiving a second clock signal, a first source/drain coupled to the first node and a second source/drain for receiving the input signal.

27. The shift register according to claim 24, wherein the second and third control signals are respectively the first control signal of an $(n+2)^{th}$ shift register unit and the first voltage.

28. The shift register according to claim 27, wherein the first driving unit further comprises a fourth transistor having a gate for receiving a second clock signal, a first source/drain coupled to the first node and a second source/drain for receiving the input signal.

29. The shift register according to claim 24, wherein the second and third control signals are respectively a second clock signal and the input signal.

30. The shift register according to claim 29, wherein the first driving unit further comprises a fifth transistor having a gate for receiving the output signal of the $(n+1)^{th}$ shift register unit, a first source/drain coupled to the first node and a second source/drain for receiving the first voltage.

31. The shift register according to claim 24, wherein the second and third control signals are respectively the output signal of the $(n+1)^{th}$ shift register unit and the first voltage.

32. The shift register according to claim 21, wherein the first driving unit further comprises a sixth transistor having a gate for receiving the input signal, a first source/drain for receiving a second voltage and a second source/drain coupled to the first node.

33. The shift register according to claim 21, wherein the second driving unit comprises a bias unit, the bias unit and the input terminal of the second level control unit are coupled to a second node, a voltage on the second node is a fourth control signal, the bias unit controls a level of the fourth control signal to turn off the second level control unit in response to the front edge of the first control signal and controls the level of the fourth control signal to turn on the second level control unit in response to the rear edge of the first control signal.

34. The shift register according to claim 33, wherein the second driving unit further comprises:

a seventh transistor having a gate for receiving a second clock signal, a first source/drain for receiving a second voltage and a second source/drain for receiving the fourth control signal.

35. The shift register according to claim 21, wherein the first level control unit comprises an eighth transistor having a gate for receiving the first control signal, a first source/drain for receiving the first clock signal and a second source/drain coupled to the output terminal.

36. The shift register according to claim 21, wherein the second level control unit comprises a ninth transistor having a gate for receiving a fourth control signal, a first source/drain coupled to the output terminal and a second source/drain for receiving the first voltage.

37. The shift register according to claim 21, wherein a first shift register unit of the shift register units receives a starting signal as the input signal.

38. The shift register according to claim 21, wherein:

enabling times of the first clock signal received by any two neighboring shift register units of the shift register units are staggered; and an enabling time of a second clock signal received by the $n^{th}$ shift register unit and an enabling time of the first clock signal received by the $(n+1)^{th}$ shift register unit are also staggered.

39. The shift register according to claim 21, wherein the $(n+1)^{th}$ shift register unit receives a third clock signal and the first clock signal, and enabling times of the third clock signal and the first and second clock signals are staggered.

40. The shift register according to claim 21, wherein the $(n+1)^{th}$ shift register unit receives a third clock signal and a fourth clock signal, and enabling times of the first to fourth clock signals are staggered.

41. A shift register having multiple serially connected shift register units, wherein an $n^{th}$ shift register unit of the shift register units outputs an output signal, which is an input signal of an $(n+1)^{th}$ shift register unit of the shift register units, and n is a natural number, the $n^{th}$ shift register unit comprising:

a first level control unit for providing a first clock signal to an output terminal;

a first driving unit, wherein the first driving unit and an input terminal of the first level control unit are coupled to a first node, a voltage on the first node is a first control signal, the first driving unit turns on the first level control unit in response to a front edge of the input signal and turns off the first level control unit in response to a front edge of the first control signal of an $(n+2)^{th}$ shift register unit of the shift register units;

a second level control unit for providing a first voltage to the output terminal; and a second driving unit for turning off the second level control unit in response to the front edge of the first control signal and turning on the second level control unit in response to a rear edge of the first control signal.

42. The shift register according to claim 41, wherein the first driving unit comprises a first transistor having a gate for receiving the first control signal of the $(n+2)^{th}$ shift register unit, a first source/drain coupled to the first node and a second source/drain for receiving the first voltage, the first transistor provides the first voltage to the first node in response to the front edge of the first control signal of the $(n+2)^{th}$ shift register unit.

43. The shift register according to claim 42, wherein the first driving unit further comprises a second transistor having a gate for receiving a second clock signal, a first source/drain coupled to the first node and a second source/drain for receiving the input signal, the second transistor provides a low voltage level of the input signal to the first node in response to a rising edge of the second clock signal;

wherein enabling times of the second clock signal and the first clock signal are staggered.

44. The shift register according to claim 41, further comprising a third level control unit for providing the first voltage to the output terminal in response to the front edge of the output signal of the $(n+1)^{th}$ shift register unit, the third level control unit comprising:

a third transistor having a gate for receiving the output signal of the $(n+1)^{th}$ shift register unit, a first source/drain coupled to the output terminal and a second source/drain for receiving the first voltage.

45. The shift register according to claim 44, wherein the third level control unit further comprises:

a fourth transistor having a gate for receiving a second clock signal, a first source/drain coupled to the output terminal and a second source/drain for receiving the first voltage, wherein the fourth transistor provides the first voltage to the output terminal in response to a rising edge of the second clock signal.

46. The shift register according to claim 41, wherein the second driving unit comprises a bias unit, the bias unit and the input terminal of the second level control unit are coupled to a second node, a voltage on the second node is a fourth control signal, the bias unit controls a level of the fourth control signal to turn off the second level control unit in response to the front edge of the first control signal and controls the level of the fourth control signal to turn on the second level control unit in response to the rear edge of the first control signal.

47. The shift register according to claim 46, wherein the second driving unit further comprises:

a sixth transistor having a gate for receiving a second clock signal, a first source/drain for receiving a second voltage and a second source/drain for receiving the fourth control signal.

48. The shift register according to claim 41, wherein the first level control unit comprises a seventh transistor having a gate for receiving the first control signal, a first source/drain for receiving the first clock signal and a second source/drain coupled to the output terminal.

49. The shift register according to claim 41, wherein the second level control unit comprises an eighth transistor having a gate for receiving a fourth control signal, a first source/drain coupled to the output terminal and a second source/drain for receiving the first voltage.

50. The shift register according to claim 41, wherein a first shift register unit of the shift register units receives a starting signal as the input signal.

51. The shift register according to claim 41, wherein:

enabling times of the first clock signal received by any two neighboring shift register units of the shift register units are staggered; and an enabling time of a second clock signal received by the $n^{th}$ shift register unit and an enabling time of the first clock signal received by the $(n+1)^{th}$ shift register unit are also staggered.

52. The shift register according to claim 41, wherein the $(n+1)^{th}$ shift register unit receives a third clock signal and the first clock signal, and enabling times of the third clock signal and the first and second clock signals are staggered.

53. The shift register according to claim 41, wherein the $(n+1)^{th}$ shift register unit receives a third clock signal and a fourth clock signal, and enabling times of the first to fourth clock signals are staggered.

54. A shift register having multiple serially connected shift register units, wherein an $n^{th}$ shift register unit of the shift register units outputs an output signal, which is an input signal of an $(n+1)^{th}$ shift register unit of the shift register units, and n is a natural number, the $n^{th}$ shift register unit comprising:

a first level control unit for providing a first clock signal to an output terminal;

a first driving unit, wherein the first driving unit and an input terminal of the first level control unit are coupled to a first node, a voltage on the first node is a first control signal, the first driving unit turns on the first level control unit in response to a front edge of the input signal and turns off the first level control unit in response to a front edge of the first control signal of the $(n+1)^{th}$ shift register unit;

a second level control unit for providing a first voltage to the output terminal; and a second driving unit for turning off the second level control unit in response to a front edge of the first control signal and turning on the second level control unit in response to a rear edge of the first control signal.

55. The shift register according to claim 54, wherein the first driving unit comprises a first transistor having a gate for receiving the first control signal of the $(n+1)^{th}$ shift register unit, a first source/drain coupled to the first node and a second source/drain for receiving the first clock signal, and the first transistor provides the first voltage to the first node in response to the front edge of the first control signal of the $(n+1)^{th}$ shift register unit.

56. The shift register according to claim 55, wherein the first driving unit further comprises a second transistor having a gate for receiving a second clock signal, a first source/drain coupled to the first node and a second source/drain for receiving the input signal, the second transistor provides a low voltage level of the input signal to the first node in response to a rising edge of the second clock signal, wherein enabling times of the second clock signal and the first clock signal are staggered.

57. The shift register according to claim 54, further comprising a third level control unit for providing the first voltage to the output terminal in response to the front edge of the output signal of the $(n+1)^{th}$ shift register unit, the third level control unit comprising:

a third transistor having a gate for receiving the output signal of the $(n+1)^{th}$ shift register unit, a first source/drain coupled to the output terminal and a second source/drain for receiving the first voltage.

58. The shift register according to claim 57, wherein the third level control unit further comprises:

a fourth transistor having a gate for receiving a second clock signal, a first source/drain coupled to the output terminal and a second source/drain for receiving the first voltage, wherein the second transistor provides the first voltage to the output terminal in response to a rising edge of the second clock signal.

59. The shift register according to claim 54, wherein the second driving unit comprises a bias unit, the bias unit and the input terminal of the second level control unit are coupled to a second node, a voltage on the second node is a fourth control signal, the bias unit controls a level of the fourth control signal to turn off the second level control unit in response to the front edge of the first control signal and controls the level of the fourth control signal to turn on the second level control unit in response to the rear edge of the first control signal.

60. The shift register according to claim 59, wherein the second driving unit further comprises:

a sixth transistor having a gate for receiving a second clock signal, a first source/drain for receiving a second voltage and a second source/drain for receiving the fourth control signal.

61. The shift register according to claim 54, wherein the first level control unit comprises a seventh transistor having a gate for receiving the first control signal, a first source/drain for receiving the first clock signal and a second source/drain coupled to the output terminal.

62. The shift register according to claim 54, wherein the second level control unit comprises an eighth transistor having a gate for receiving a fourth control signal, a first source/drain coupled to the output terminal and a second source/drain for receiving the first voltage.

63. The shift register according to claim 54, wherein a first shift register unit of the shift register units receives a starting signal as the input signal.

64. The shift register according to claim 54, wherein:

enabling times of the first clock signal received by any two neighboring shift register units of the shift register units are staggered; and an enabling time of a second clock signal received by the $n^{th}$ shift register unit and an enabling time of the first clock signal received by the $(n+1)^{th}$ shift register unit are also staggered.

65. The shift register according to claim 54, wherein the $(n+1)^{th}$ shift register unit receives a third clock signal and the first clock signal, and enabling times of the third clock signal and the first and second clock signals are staggered.

66. The shift register according to claim 54, wherein the $(n+1)^{th}$ shift register unit receives a third clock signal and a fourth clock signal, and enabling times of the first to fourth clock signals are staggered.

* * * * *